(12) United States Patent
Chen et al.

(10) Patent No.: US 10,903,312 B2
(45) Date of Patent: Jan. 26, 2021

(54) SEMICONDUCTOR DEVICE

(71) Applicant: Mitsubishi Electric Corporation, Tokyo (JP)

(72) Inventors: Ze Chen, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/659,757

(22) Filed: Oct. 22, 2019

(65) Prior Publication Data

US 2020/0052065 A1    Feb. 13, 2020

Related U.S. Application Data

(62) Division of application No. 15/640,077, filed on Jun. 30, 2017, now abandoned, which is a division of
(Continued)

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/0619* (2013.01); *H01L 29/1095* (2013.01);
(Continued)

(58) Field of Classification Search
CPC ............. H01L 29/0619; H01L 29/0634; H01L 29/4236; H01L 29/7397
See application file for complete search history.

(56) References Cited

U.S. PATENT DOCUMENTS 5,210,601 A    5/1993   Kitagawa et al.
5,489,787 A    2/1996   Amaratunga et al.
(Continued)

FOREIGN PATENT DOCUMENTS

CN         1953203 A      4/2007
JP     H106334188 A     12/1994
(Continued)

OTHER PUBLICATIONS

International Search Report issued in PCT/JP2012/055506; dated Apr. 3, 2012.
(Continued)

*Primary Examiner* — Vincent Wall
(74) *Attorney, Agent, or Firm* — Studebaker & Brackett PC

(57) ABSTRACT

A semiconductor device includes a semiconductor substrate in which an active region and an edge termination region are defined, a semiconductor element formed in the active region, and first to fourth P layers formed in a region spanning from an edge portion of the active region to the edge termination region in the surface of the semiconductor substrate. The first to fourth P layers respectively have surface concentrations P(1) to P(4) that decrease in this order, bottom-end distances D(1) to D(4) that increase in this order, and distances B(1) to B(4) to the edge of the semiconductor substrate that increase in this order. The surface concentration P(4) is 10 to 1000 times the impurity concentration of the semiconductor substrate, and the bottom-end distance D(4) is in the range of 15 to 30 μm.

7 Claims, 58 Drawing Sheets

Related U.S. Application Data application No. 14/991,473, filed on Jan. 8, 2016, now Pat. No. 9,735,229, which is a division of application No. 14/370,048, filed as application No. PCT/JP2012/055506 on Mar. 5, 2012, now Pat. No. 9,287,391.

(51) Int. Cl.
  *H01L 29/40* (2006.01)
  *H01L 29/739* (2006.01)
  *H01L 29/423* (2006.01)

(52) U.S. Cl.
  CPC ........ *H01L 29/404* (2013.01); *H01L 29/4236* (2013.01); *H01L 29/7397* (2013.01)

(56) References Cited

U.S. PATENT DOCUMENTS

| | | | |
|---|---|---|---|
| 5,539,238 A | 7/1996 | Malhi | |
| 5,852,559 A | 12/1998 | Li | |
| 5,945,691 A | 8/1999 | Tomomatsu et al. | |
| 6,215,168 B1 | 4/2001 | Brush et al. | |
| 6,242,784 B1 | 6/2001 | Zeng et al. | |
| 6,472,678 B1 | 10/2002 | Hshieh et al. | |
| 6,750,524 B2 | 6/2004 | Parthasarthy et al. | |
| 6,870,201 B1 | 3/2005 | Deboy et al. | |
| 7,732,821 B2* | 6/2010 | Suzuki | H01L 21/0465 257/335 |
| 7,973,363 B2 | 7/2011 | Hara | |
| 8,749,017 B2* | 6/2014 | Lu | H01L 29/66348 257/493 |
| 9,196,488 B2* | 11/2015 | Takahashi | H01L 21/266 |
| 2003/0214009 A1 | 11/2003 | Parthasarathy et al. | |
| 2005/0035405 A1 | 2/2005 | Mauder et al. | |
| 2005/0098826 A1 | 5/2005 | Yamaguchi et al. | |
| 2006/0043480 A1* | 3/2006 | Tsuchitani | H01L 29/7811 257/341 |
| 2008/0224150 A1 | 9/2008 | Suzuki et al. | |
| 2010/0219471 A1 | 9/2010 | Cai | |
| 2011/0006338 A1 | 1/2011 | Senoo | |
| 2011/0291223 A1 | 12/2011 | Nakamura | |
| 2012/0007142 A1 | 1/2012 | Nagaoka et al. | |
| 2012/0097980 A1 | 4/2012 | Masuda et al. | |
| 2012/0273836 A1 | 11/2012 | Sadamatsu et al. | |
| 2013/0001639 A1 | 1/2013 | Iwasaki et al. | |
| 2013/0037805 A1 | 2/2013 | Senoo | |
| 2013/0043468 A1 | 2/2013 | Adekore | |
| 2014/0197451 A1 | 7/2014 | Chen et al. | |
| 2014/0374871 A1* | 12/2014 | Hirabayashi | H01L 29/063 257/488 |
| 2015/0001630 A1 | 1/2015 | Singh | |
| 2015/0014741 A1* | 1/2015 | Chen | H01L 29/4236 257/139 |
| 2015/0021670 A1 | 1/2015 | Schulze et al. | |
| 2017/0125559 A1* | 5/2017 | Tsukanov | H01L 29/1095 |

FOREIGN PATENT DOCUMENTS

| | | |
|---|---|---|
| JP | 2001077347 A | 3/2001 |
| JP | 2001522145 A | 11/2001 |
| JP | 2003303956 A | 10/2003 |
| JP | 2006073740 A | 3/2006 |
| JP | 2011204710 A | 10/2011 |
| WO | 03/098700 A2 | 11/2003 |

OTHER PUBLICATIONS

An Office Action; "Notification of Reasons for Refusal," issued by the Japanese Patent Office dated Sep. 2, 2014, which corresponds to Japanese Patent Application No. 2014-503298 and is related to U.S. Appl. No. 14/370,048; with English language translation.

Notification Concerning Transmittal of International Preliminary Report on Patentability and Translation of Written Opinion of the International Searching Authority; PCT/JP2012/055506; dated Sep. 18, 2014.

The Chinese First Office Action issued by the Chinese Patent Office dated May 5, 2016, which corresponds to Chinese Patent Application No. 201280071223.6 and is related to U.S. Appl. No. 14/991,473; with English language partial translation.

An Office Action issued by the German Patent Office dated May 20, 2020, which corresponds to German Patent Application No. 112012005981.6 and is related to U.S. Appl. No. 16/659,757; with English language translation.

* cited by examiner

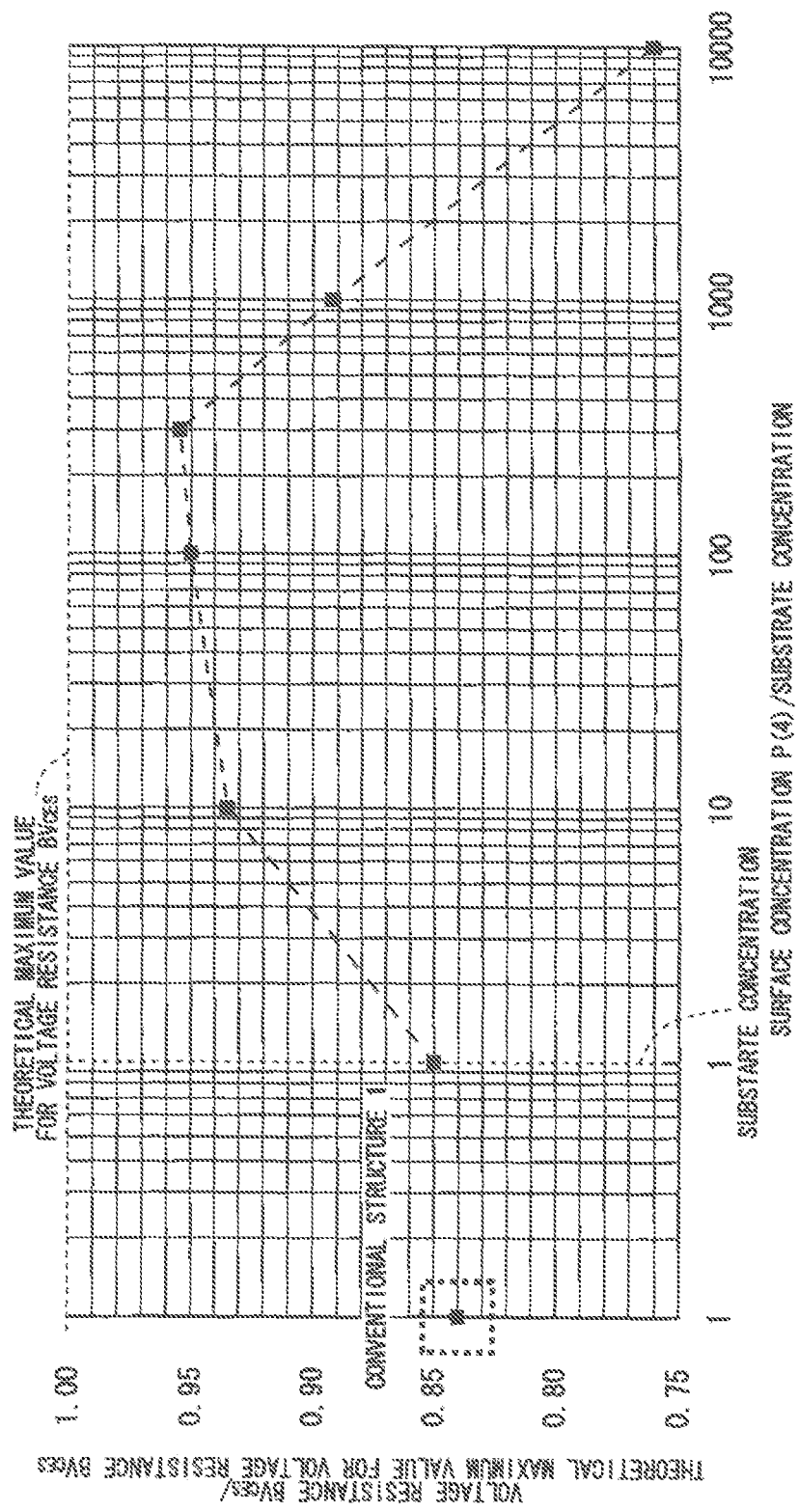
F I G. 7

TEMPERATURE = 398 K
VGE = 0V

F I G . 4 7
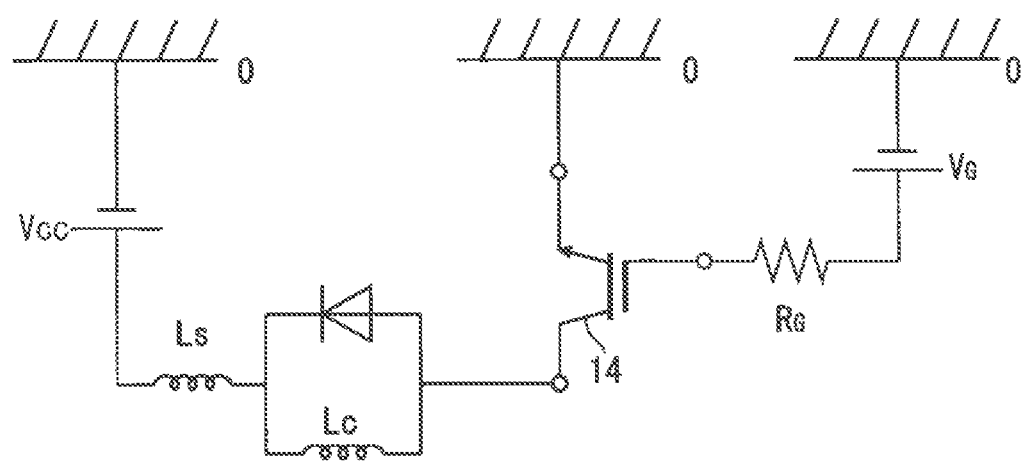

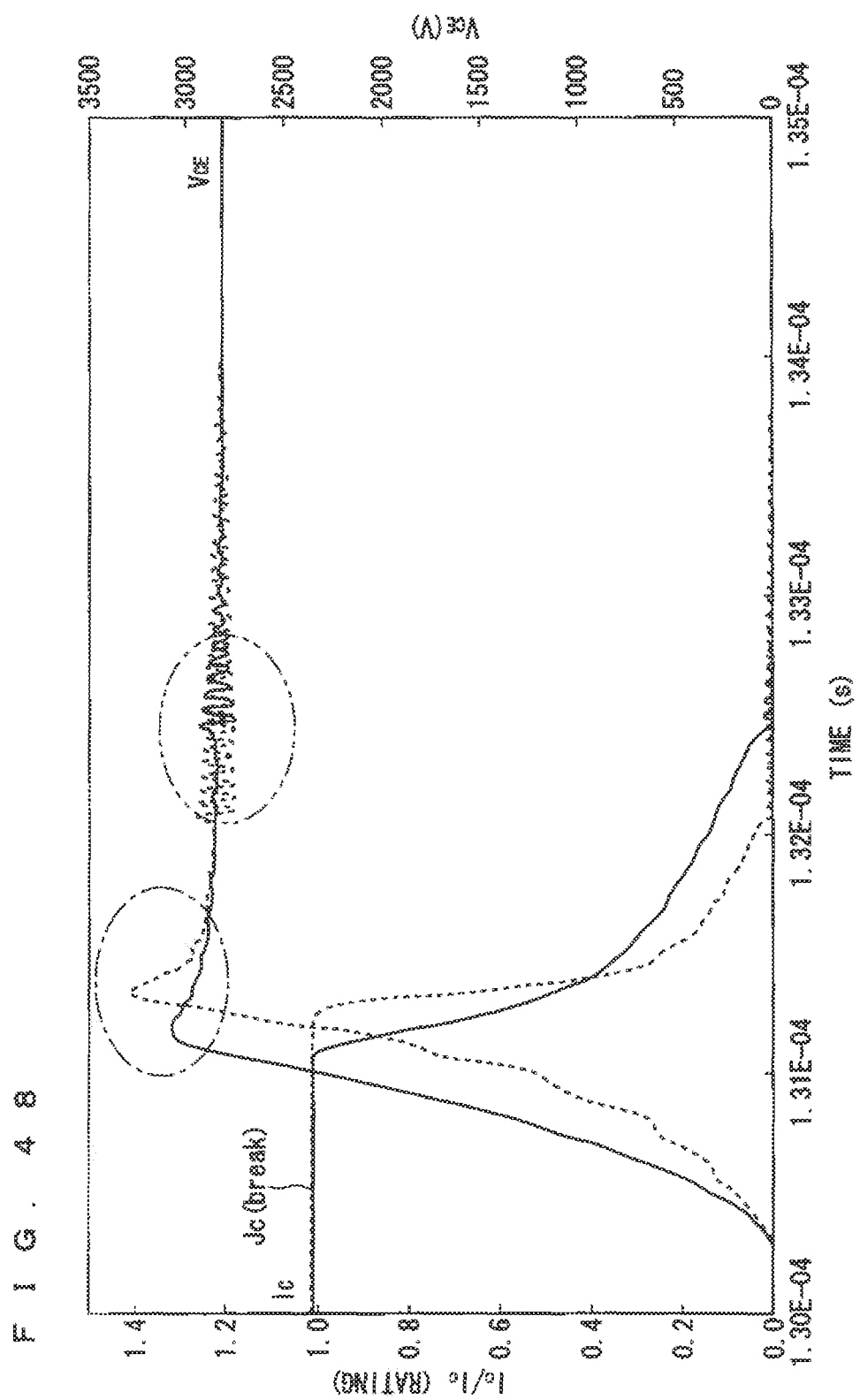

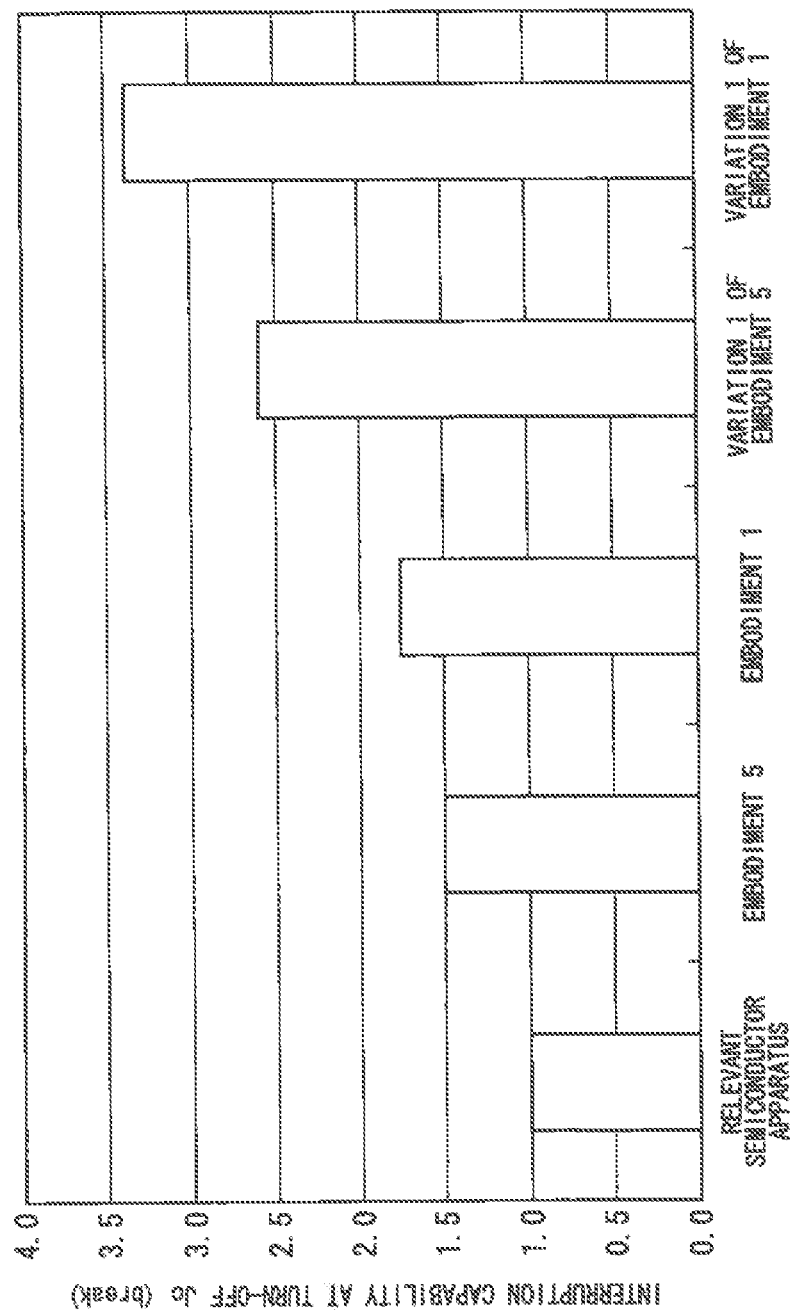

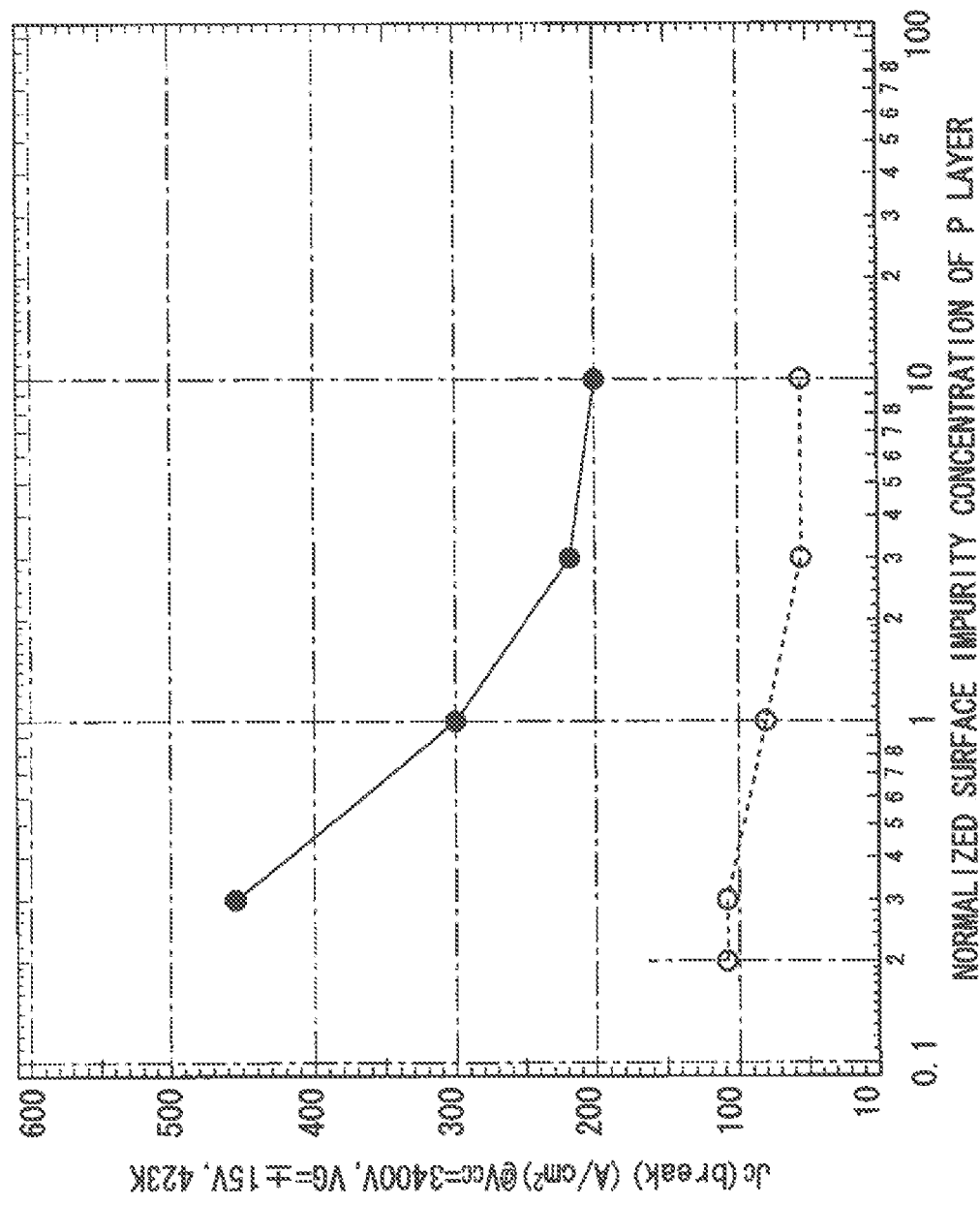

SEMICONDUCTOR DEVICE

CROSS-REFERENCE TO RELATED APPLICATIONS

This application is a Divisional of U.S. patent application Ser. No. 15/640,077 filed Jun. 30, 2017, which was a Divisional Application of U.S. patent application Ser. No. 14/991,473 filed Jan. 8, 2016, which was a Divisional Application of U.S. patent application Ser. No. 14/370,048 filed Jun. 30, 2014, which was the U.S. National Stage of International Application No. PCT/JP2012/055506 filed Mar. 5, 2012, the entire content of which is incorporated herein by reference.

TECHNICAL FIELD

The present invention relates to a semiconductor device, and in particular, to a semiconductor device used at high voltages.

BACKGROUND ART

Semiconductor apparatuses that can be used at high voltages are known in which a P layer providing a PN junction is formed outside an active region where a semiconductor element is formed. For such semiconductor devices, various techniques such as a technique disclosed in Patent Document 1 have been proposed in recent years.

PRIOR ART DOCUMENT

Patent Document

Patent Document 1: Japanese Patent Application Laid-Open No. 2003-303956

SUMMARY OF INVENTION

Problems to be Solved by the Invention

For a semiconductor device as described above, it has been proposed to arrange a plurality of P layers in a region spanning from an edge portion of the active region to an edge portion of a substrate along a substrate surface so as to smooth a change in the electric field in the lateral direction of the semiconductor substrate and increase a voltage resistance of the apparatus. However, there is a problem with such a structure in that the region in which the P layers are formed increases in size and accordingly there is an increase in area of a single chip. There is also another problem in that intensive application of high electric fields to local portions of the P layers that have high curvature in cross-section imposes upper limits on the voltage resistance.

The above-described semiconductor devices are configured to have high carrier concentrations in the active region and surrounding regions in the ON state, and it is proposed to realize an IGBT having a low on-state voltage. However, such a configuration will impair current interruption capability of the apparatus when a turn-off operation is performed because current densities in the surrounding regions of the active region increase.

The present invention has been made in view of the above-described problems, and it is an object of the present invention to provide a technique that is able to reduce chip area and to improve withstand voltage characteristic capability and interruption capability at turn-off without deteriorating properties of a semiconductor element.

Means for Solving Problems

A semiconductor device according to the present invention includes a semiconductor substrate of a first conductivity type in which an active region and an edge termination region that is spaced from and encloses the active region are defined, a semiconductor element formed in the active region, and a plurality of impurity layers of a second conductivity type that are formed at least partly overlapping one another in a region spanning from an edge portion of the active region to the edge termination region in a surface of the semiconductor substrate. For an arbitrary pair of adjacent ith and an i+1th impurity layers among the plurality of impurity layers, $P(i) > P(i+1)$, $D(i) < D(i+1)$, and $B(i) < B(i+1)$ are satisfied, where $P(i)$ and $P(i+1)$ are respectively surface concentrations that are concentrations of impurities of the second conductivity type in the ith impurity layer and the i+1th impurity layer at the surface of the semiconductor substrate, $D(i)$ and $D(i+1)$ are respectively bottom-end distances that are distances from the surface of the semiconductor substrate to bottom ends of the ith impurity layer and the i+1th impurity layer, and $B(i)$ and $B(i+1)$ are respectively distances from an edge of the edge termination region on the active region side to edges of the ith impurity layer and the i+1th impurity layer on an edge side of the semiconductor substrate. The surface concentration in an impurity layer whose bottom-end distance is the largest among the bottom-end distances of the plurality of impurity layers is 10 to 1000 times a concentration of impurities of the first conductivity type in the semiconductor substrate, and the bottom-end distance of the impurity layer is in a range of 15 to 30 µm.

Advantageous Effects of the Invention

According to the present invention, the semiconductor device is configured such that the plurality of impurity layers of the second conductivity type have higher concentrations of impurities as they are closer to the active region, such that the surface concentration of the impurity layer that has the largest bottom-end distance is 10 to 1000 times the impurity concentration of the semiconductor substrate, and such that the bottom-end distance of that impurity layer is in the range of 15 to 30 µm. Accordingly, it is possible to reduce chip area and to improve withstand voltage characteristic capability and interruption capability at turn-off without deteriorating properties of the semiconductor element.

BRIEF DESCRIPTION OF DRAWINGS

FIG. 7 is a diagram showing the relationship between voltage resistance and the surface concentration of the fourth P layer.

FIG. 47 is a diagram of an evaluation circuit used in experiments for evaluating turn-off characteristics.

FIG. 48 shows results of the evaluation of the turn-off characteristic.

FIG. 49 is a diagram showing the interruption capability at turn-off.

FIG. 50 is a diagram showing the dependence of the interruption capability at turn-off on the concentration of the underside P layer.

DESCRIPTION OF EMBODIMENTS

Embodiment 1

Before description of semiconductor devices according to the present invention is given, a semiconductor device relevant thereto (hereinafter, referred to as a "relevant semiconductor device") will be described first.

Figure 55:
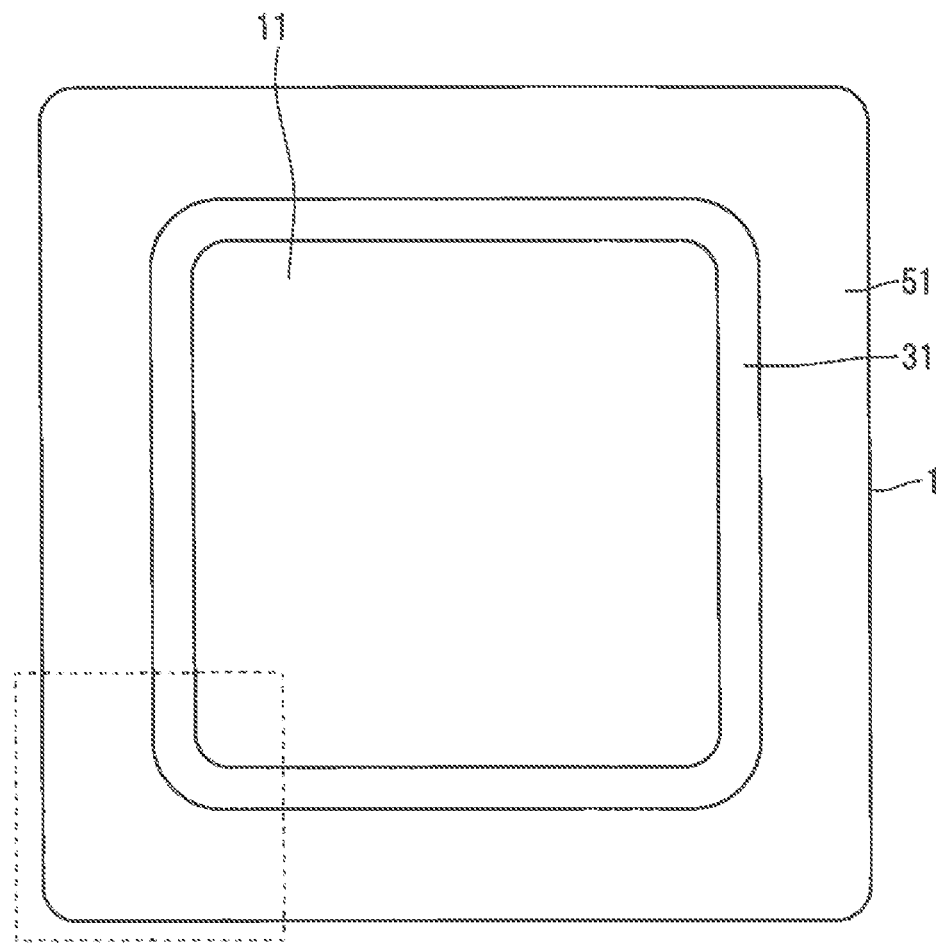
FIG. 55 is a plan view showing a configuration of a relevant semiconductor device.
Figure 56:
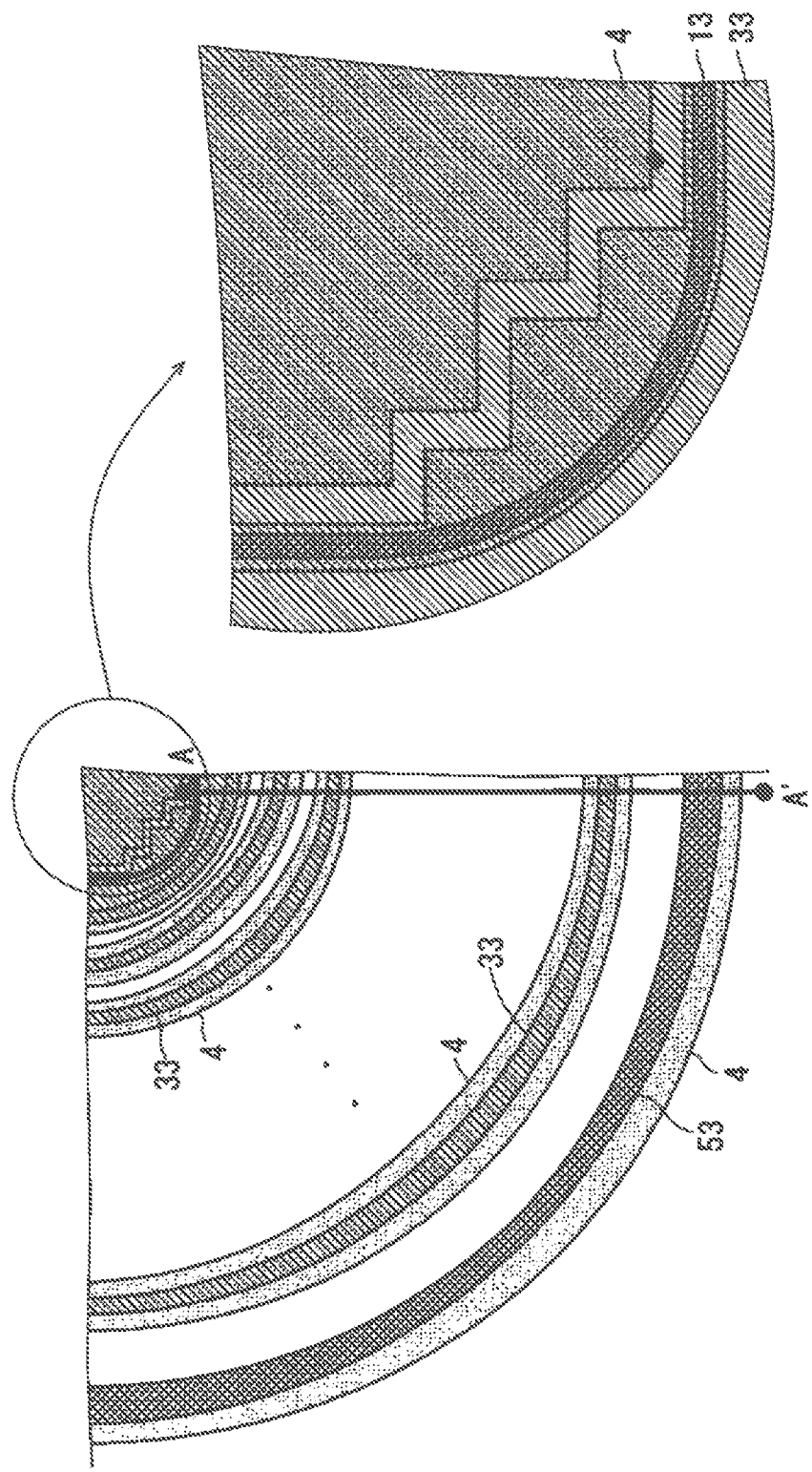
FIG. 56 is an enlarged plan view showing the configuration of the relevant semiconductor device.

FIG. 55 is a plan view showing a configuration of the relevant semiconductor device, and FIG. 56 is an enlarged view showing a range indicated by the broken line in FIG. 55. As shown in FIG. 55, the semiconductor device includes an N type (first conductivity type) semiconductor substrate 1 in which an active region 11, an edge termination region 51 spaced from and enclosing the active region 11, and a primary PN junction region 31 sandwiched between the active region 11 and the edge termination region 51 are defined. Here, the active region 11 is enclosed by the primary PN junction region 31, and the primary PN junction region 31 is enclosed by the edge termination region 51. Note that the active region 11, the primary PN junction region 31, and the edge termination region 51 will be described later in detail.

As shown in FIG. 56, the semiconductor substrate 1 includes a metal film 4 containing aluminum (Al) or the like, which will be described later, P layers 33 of a P-type (second conductivity type), an N layer 53 of the N-type (first conductivity type), and a gate electrode 13.

Figure 57:
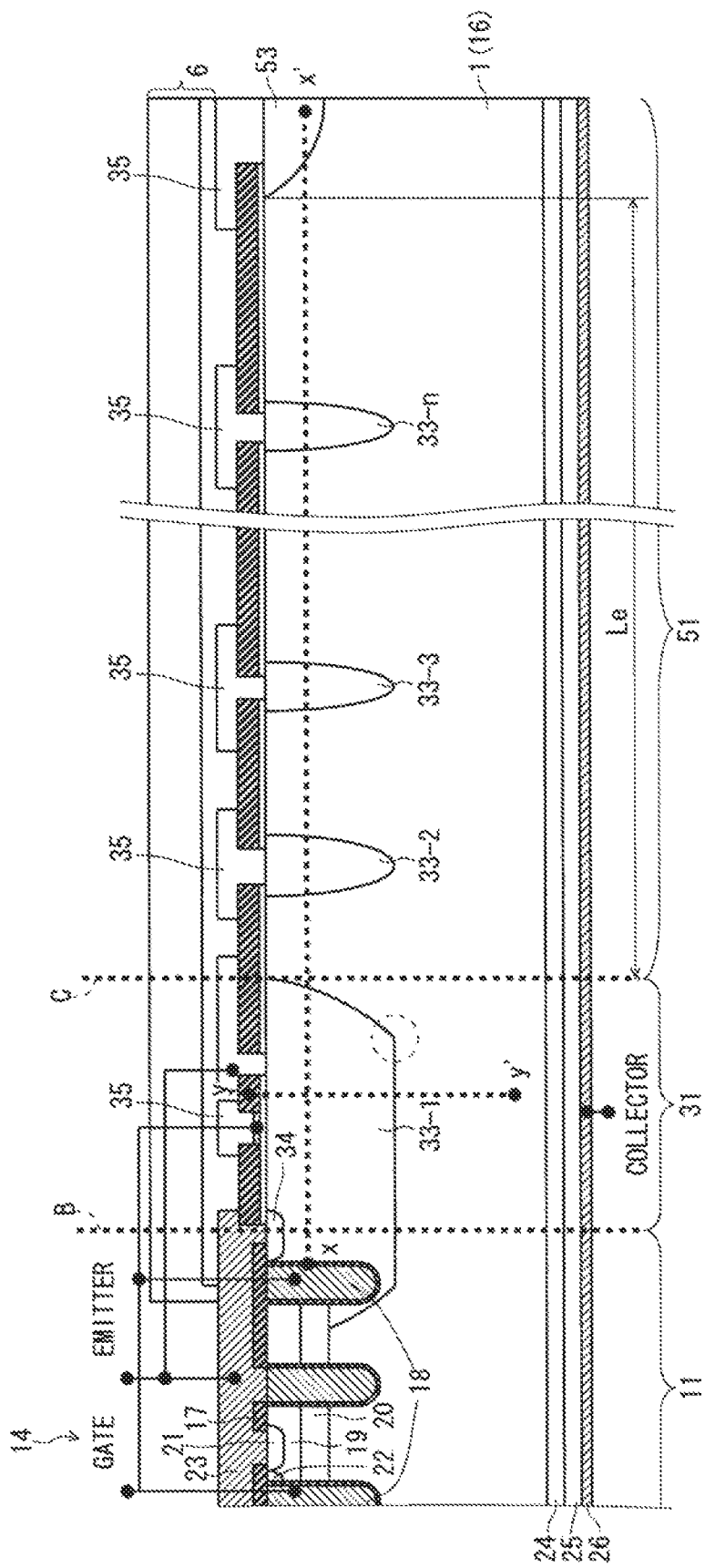
FIG. 57 is a cross-sectional view showing the configuration of the relevant semiconductor device.

FIG. 57 is a cross-sectional view showing the configuration of the relevant semiconductor device along line A-A' in FIG. 56. As shown in FIG. 57, the relevant semiconductor device includes an IGBT 14 that is a semiconductor element formed in the active region 11.

The IGBT 14 includes gate electrodes 18 that are formed in trenches of the surface of the N-type semiconductor substrate 1 via an insulation film 17, a P layer 19 that sandwiches the gate electrodes 18 in the surface of the semiconductor substrate 1, an N layer 20 formed under the P layer 19, a P+ layer 21 and an N+ layer 22 formed in the upper part of the P layer 19, and emitter electrodes 23 that are formed of the metal film 4 connected to the P+ layer 21 through contact holes of the insulation film 17. The IGBT 14 further includes an underside N layer 24 formed on the underside of the semiconductor substrate 1 and serving as an N-type buffer layer, an underside P layer 25 formed on the underside N layer 24 and serving as a P collector layer, and a collector electrode 26 formed on the underside P layer 25.

Note that a portion of the semiconductor substrate 1 where there are no impurity layers such as the N layer 20 and the P layer 19 serves as an N-drift layer 16. The gate electrodes 18 of the IGBT 14 are connected to one another by wires, and the emitter electrodes 23 of the IGBT 14 are connected to one another by wires.

The relevant semiconductor device includes not only the aforementioned IGBT 14 but also a plurality of P layers 33 (33-1, 33-2, 33-3, . . . , and 33-$n$) and an N layer 53, the P layers 33 being arranged in a region spanning from an edge portion of the active region 11 to the edge termination region 51 in the surface of the semiconductor substrate 1, and the N layer 53 being formed in an edge portion of the semiconductor substrate 1 (an edge portion of the edge termination region 51). Among the P layers 33 (33-1, 33-2, 33-3, . . . , 33-$n$), the P layer 33-1 (primary junction P layer) formed on the innermost side of the active region 11 is relatively larger than the other P layers. In an upper portion of the P layer 33-1 near the gate electrodes 18 is formed a P+ layer 34 that is connected to the emitter electrodes 23 via the contact holes of the insulation film 17.

The P layers 33 and the N layer 53 are connected respectively to a plurality of electrodes 35 that are formed of the metal film 4 via the contact holes of the insulation film 17, and a plurality of protection films 6 are formed on these electrodes 35 and the insulation film 17. Note that the concentrations, depths, widths, and number of the P layers 33 and the design of the electrodes 35 are used as design parameters that can be changed according to a required withstand voltage (voltage resistance).

According to the relevant semiconductor device having the aforementioned configuration, when a voltage that is higher than or equal to a threshold voltage is applied to the gate electrodes 18, channels are formed around the gate electrodes 18 in the P layer 19 and the IGBT 14 is turned on. In other words, principal current is allowed to flow from the emitter electrodes 23 to the collector electrode 26 through the P+ layer 21, the channels (P layer 19), the N layer 20, the drift layer 16, the underside N layer 24, and the underside P layer 25. Although a detailed description has been omitted, in order to realize the IGBT 14 having a low on-state voltage, the relevant semiconductor device is configured such that emitter-side portions of the active region 11 and the primary PN junction region 31 have high carrier concentrations (e.g., the concentration of impurities in the drift layer 16 is increased by three orders of magnitude or more by a modulation operation) when the IGBT 14 is in the ON state.

The above has been a description of the configuration of the relevant semiconductor device. Next, the active region 11, the primary PN junction region 31, and the edge termination region 51, which have been briefly described above, and an edge terminal width Le to be used in the following description will be described with reference to FIG. 57.

The active region 11 is a region in which principal current flows when the IGBT 14 is in the ON state. The primary PN junction region 31 is a region located between the active region 11 and the edge termination region 51. Here, a boundary B between the active region 11 and the primary PN junction region 31 is assumed to pass through the edge of the outermost contact hole (in the present example, the contact hole that connects an emitter electrode 23 and the P+ layer 34) on the edge side of the semiconductor substrate 1 in the active region 11.

The edge termination region 51 is a region located at the outer circumference of the primary PN junction region 31 and in which no principal current flows when the IGBT 14 is in the ON state. In the edge termination region 51, when a bias is applied in the OFF state, a depletion layer extends in the lateral direction of the semiconductor substrate 1 to hold a withstand voltage. Here, a boundary C between the primary PN junction region 31 and the edge termination region 51 is assumed to pass through the edge of the P layer 33-1 on the edge side of the semiconductor substrate 1.

The edge terminal width Le is assumed to refer to a width from the boundary C between the primary PN junction region 31 and the edge termination region 51 to the edge of the N layer 53 on the active region 11 side, as shown in FIG. 57.

Figure 58:
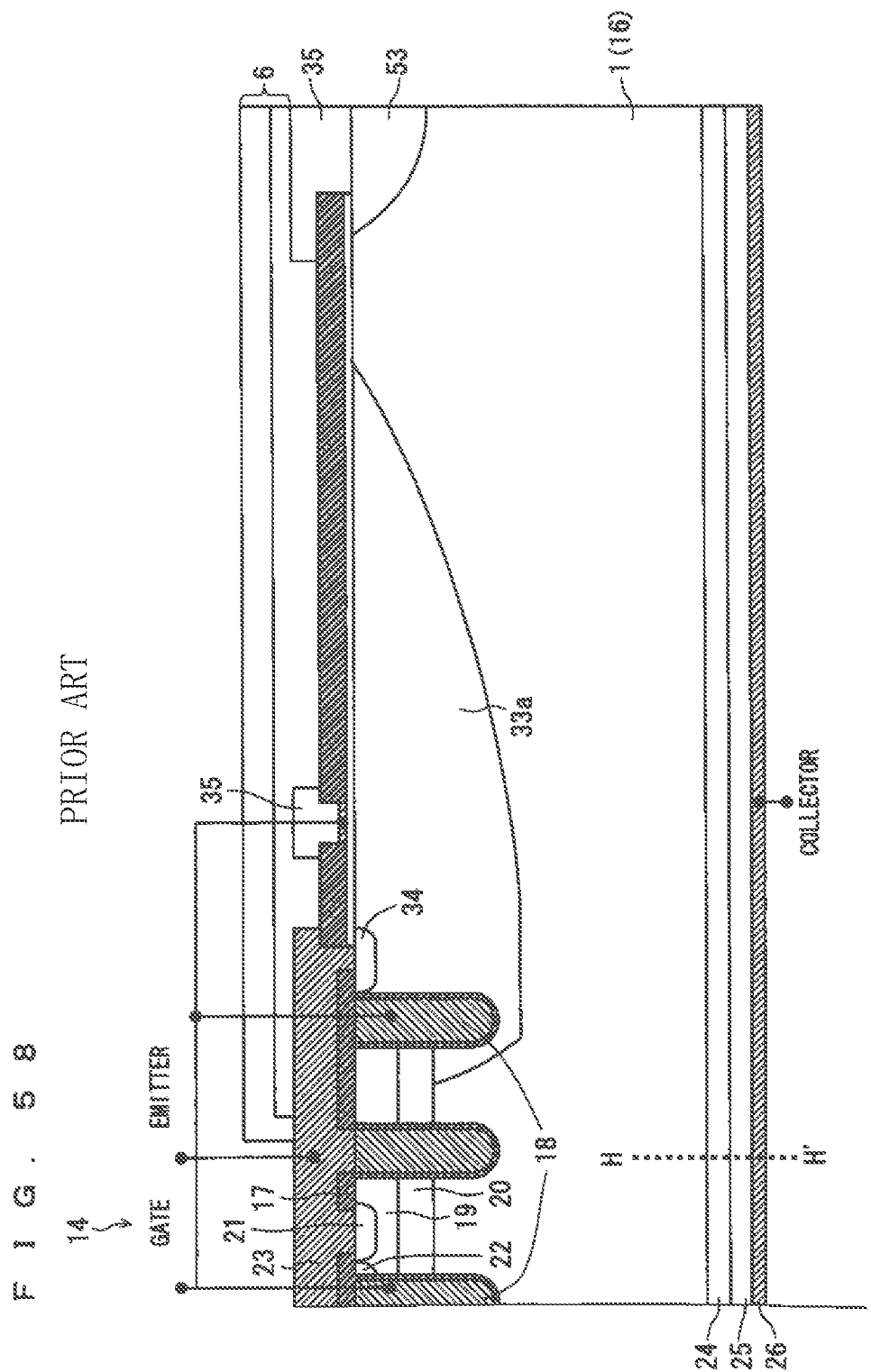
FIG. 58 is a cross-sectional view showing another configuration of the relevant semiconductor device.

FIG. 58 is a cross-sectional view showing another configuration of the relevant semiconductor device. The relevant semiconductor device shown in FIG. 58 includes, instead of the plurality of P layers 33, a single P layer 33a whose impurity concentration increases continuously in a direction from the edge termination region 51 toward the active region 11.

The aforementioned relevant semiconductor device in which the plurality of P layers 33 (or the single P layer 33a) are arranged along the surface of the semiconductor substrate 1 can smooth a change in the electric field in the lateral direction of the semiconductor substrate 1. Consequently, a high-voltage device (semiconductor device) can be realized. Such a structure, however, has a problem that the areas of the primary PN junction region 31 and the edge termination region 51 in which the P layers 33 are formed increase in size and accordingly there is an increase in area of a single chip.

There is also has another problem that intensive application of high electric fields to local portions of the P layer(s) 33 that have high curvature in cross-section (e.g., portions where the circles on the broken-lines are located in FIG. 57) imposes upper limits on the voltage resistance.

As described above, the relevant semiconductor device is also configured such that the emitter-side portions of the active region 11 and the primary PN junction region 31 have high carrier concentrations when the IGBT 14 is in the ON state. However, with such a structure, excess holes are injected from the underside P layer 25 in the edge termination region 51 when the IGBT 14 performs a turn-off operation, and as a result, the current density increases at the emitter-side boundary between the primary PN junction region 31 and the edge termination region 51. In addition, high carrier concentrations on the emitter side of the primary PN junction region 31 during a turn-off operation of the IGBT 14 makes it difficult for the depletion layer to extend on the collector side. A resultant increase in the electric field strength on the emitter side of the primary PN junction region 31 accelerates impact ionization and increases current density when the IGBT 14 performs a turn-off operation.

The above-described increase in current density results in a local temperature increase and causes electrical thermal breakdown, thus impairing the current interruption capability when the IGBT 14 performs a turn-off operation. In particular, unlike large scale integration (LSI) typified by complementary metal oxide semiconductors (CMOSs), IGBTs serving as power semiconductors are also required to have a breakdown resistance typified by the cut-off capability during a turn-off operation, in addition to realizing a low ON-state voltage, increased speed, and improved current drive capability.

In view of this, the semiconductor device according to Embodiment 1 of the present invention can solve the problems described above. In other words, according to the present embodiment of the invention, it is possible to reduce chip area and to improve withstand voltage characteristic capability and interruption capability at turn-off without deteriorating properties of the IGBT 14. The following describes the semiconductor device according to the present embodiment that can achieve effects as described above.

Figure 1:
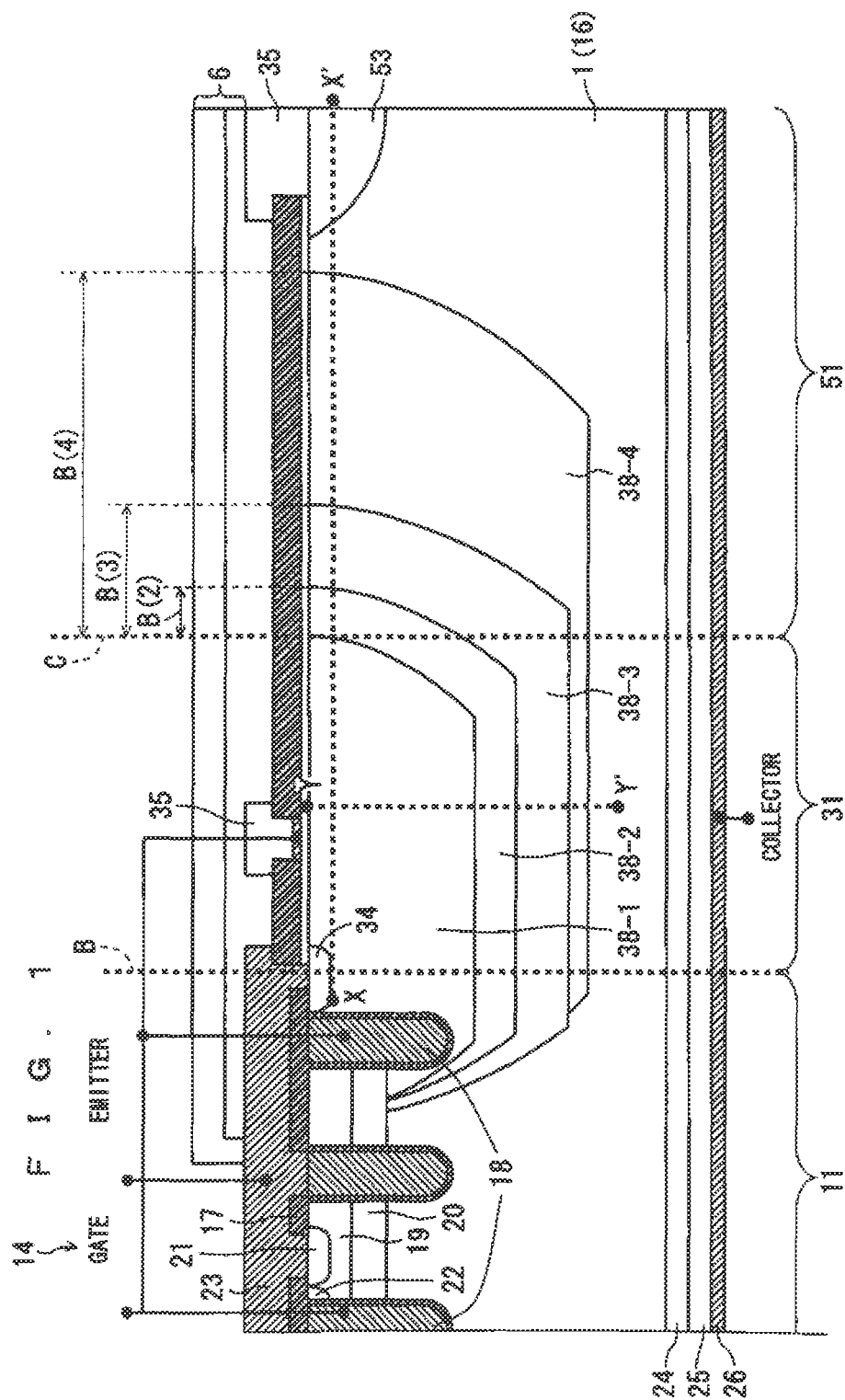
FIG. 1 is a cross-sectional view showing a configuration of a semiconductor device according to Embodiment 1.

FIG. 1 is a cross-sectional view showing a configuration of a semiconductor device according to the present embodiment. Note that in the semiconductor device according to the present embodiment, constituent elements that are the same as or similar to those described for the relevant semiconductor device are denoted by the same reference numerals, and the following description focuses on differences from the relevant semiconductor device.

As shown in FIG. 1, the semiconductor device according to the present embodiment includes, in place of the plurality of P layers 33, a plurality of P layers 38 (a plurality of impurity layers of the second conductivity type) that are formed at least partly overlapping one another in a region spanning from the edge portion of the active region 11 to the edge termination region 51 in the surface of the semiconductor substrate 1.

In the present embodiment, these P layers 38 are, as a whole, formed to extend across the edge portion of the active region 11, the primary PN junction region 31, and the edge termination region 51 and function as a P-type field stopper layer (hereinafter referred to as a "PFS layer") that suppresses the occurrence of a high electric field around a gate electrode 18 located on the outermost side of the active region 11 (at the edge of the active region 11).

Here, it is assumed that four P layers 38 (a first P layer 38-1, a second P layer 38-2, a third P layer 38-3, and a fourth P layer 38-4) are formed by thermal diffusion so as to allow the semiconductor device to withstand 4500V-Class voltages. Note that the reason why the semiconductor device with the four P layers 38 can withstand 4500V-Class voltages will be described later.

The first P layer 38-1 among the four P layers 38 corresponds to the aforementioned P layer 33-1 (primary junction P layer). The boundary B between the active region 11 and the primary PN junction region 31 passes through the edge of a contact hole that connects the emitter electrode 23 and the P+ layer 34 on the edge side of the semiconductor substrate 1, and the boundary C between the primary PN junction region 31 and the edge termination region 51 passes through the edge of the first P layer 38-1 on the edge side of the semiconductor substrate 1.

For an arbitrary pair of adjacent ith and i+1th P layers 38 (where i is a positive integer, in this case 1, 2, or 3), $P(i) > P(i+1)$ is satisfied where $P(i)$ and $P(i+1)$ are respectively P-type impurity concentrations (surface concentrations) of the ith P layer 38 and the i+1th P layer 38 at the surface of the semiconductor substrate 1. In other words, in the present embodiment, the surface concentrations satisfy the inequation $P(1) > P(2) > P(3) > P(4)$, decreasing stepwise in this order.

Figure 2:
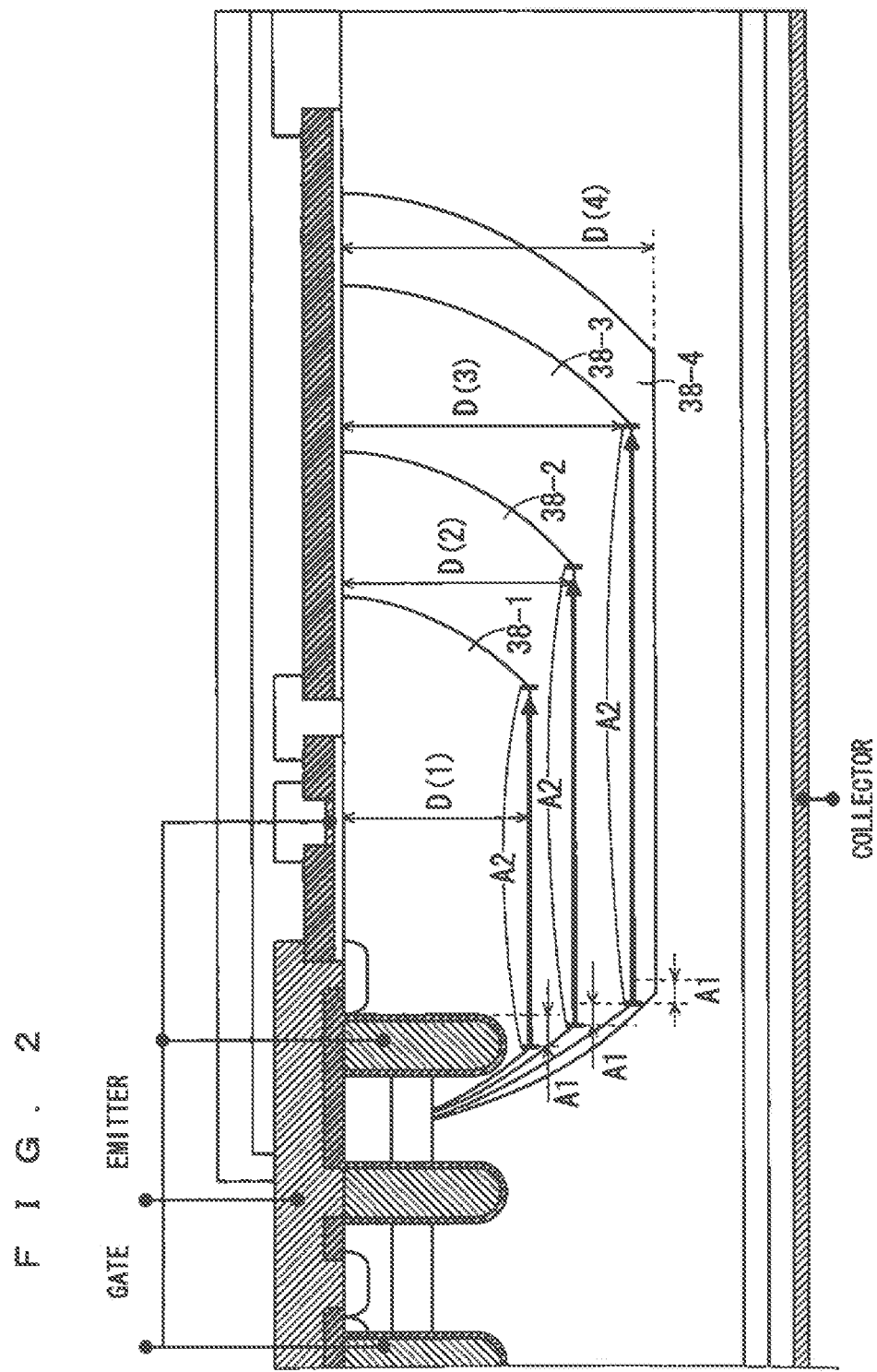
FIG. 2 is a cross-sectional view showing the configuration of the semiconductor device according to Embodiment 1.

Also, $D(i) < D(i+1)$ is satisfied where $D(i)$ and $D(i+1)$ are respectively distances (bottom-end distances) from the surface of the semiconductor substrate 1 to the bottom ends of the ith P layer 38 and the i+1th P layer 38. In other words, in the present embodiment, $D(1) < D(2) < D(3) < D(4)$ is satisfied as shown in FIG. 2.

Also, $B(i) < B(i+1)$ is satisfied where $B(i)$ and $B(i+1)$ are respectively distances from the edge of the edge termination region 51 on the active region 11 side (i.e., the boundary C) to the edges of the ith P layer 38 and the i+1th P layer 38 on the edge side of the semiconductor substrate 1. In other words, in the present embodiment, $B(1) < B(2) < B(3) < B(4)$ is satisfied as shown in FIG. 1 (where $B(1)$ is zero).

In the above-described configuration of the present embodiment, the outermost fourth P layer 38-4 that has a voltage among the plurality of P layers 38 (PFS layers) has relatively low curvature in cross-section shape. Accordingly, intensive application of a high electric field to local portions can be suppressed.

The concentrations of the P layers 38 (PFS layers) are designed to satisfy $P(1) > P(2) > P(3) > P(4)$ and increase stepwise as the P layers 38 are closer to the cell (active region 11). This enhances the effect of preventing the depletion layer from extending in the longitudinal and lateral directions. Specifically, the presence of the second and third P layers 38-2 and 38-3 inhibits the depletion layer from extending in the longitudinal and lateral directions and reaching the first P layer 38-1. As a result, a difference in electrostatic potential between the inside and outside of a high-curvature portion in cross-section shape of the first P layer 38-1 becomes substantially zero. Thus, it is possible to suppress application of high electric fields to that portion of the first P layer 38-1.

As described above, the semiconductor device according to the present embodiment can suppress intensive application of high electric fields to local portions. In other words, high electric fields are distributed, and this increases the maximum voltage resistance. In addition, a smooth change in the electric field in the plurality of P layers 38 can reduce the edge terminal width Le (FIG. 57) as will be described later when the withstand voltage is constant. Accordingly, the chip area can be reduced.

Note that the design tolerance range of the fourth P layer 38-4 is, as described below, determined based on the edge terminal width Le and the voltage resistance that are required for the device. Although a detailed description has been omitted, the design tolerance ranges of the second and third P layers 38-2 and 38-3 are determined based on a margin of the voltage resistance of the device and an optimized electric field distribution in each withstand voltage mode.

FIGS. 3 to 8 are graphs for describing mainly the design tolerance range of the fourth P layer 38-4. The following description focuses mainly on the design tolerance range of the fourth P layer 38-4 with reference to the drawings in sequence, starting from FIG. 3.

Figure 3:
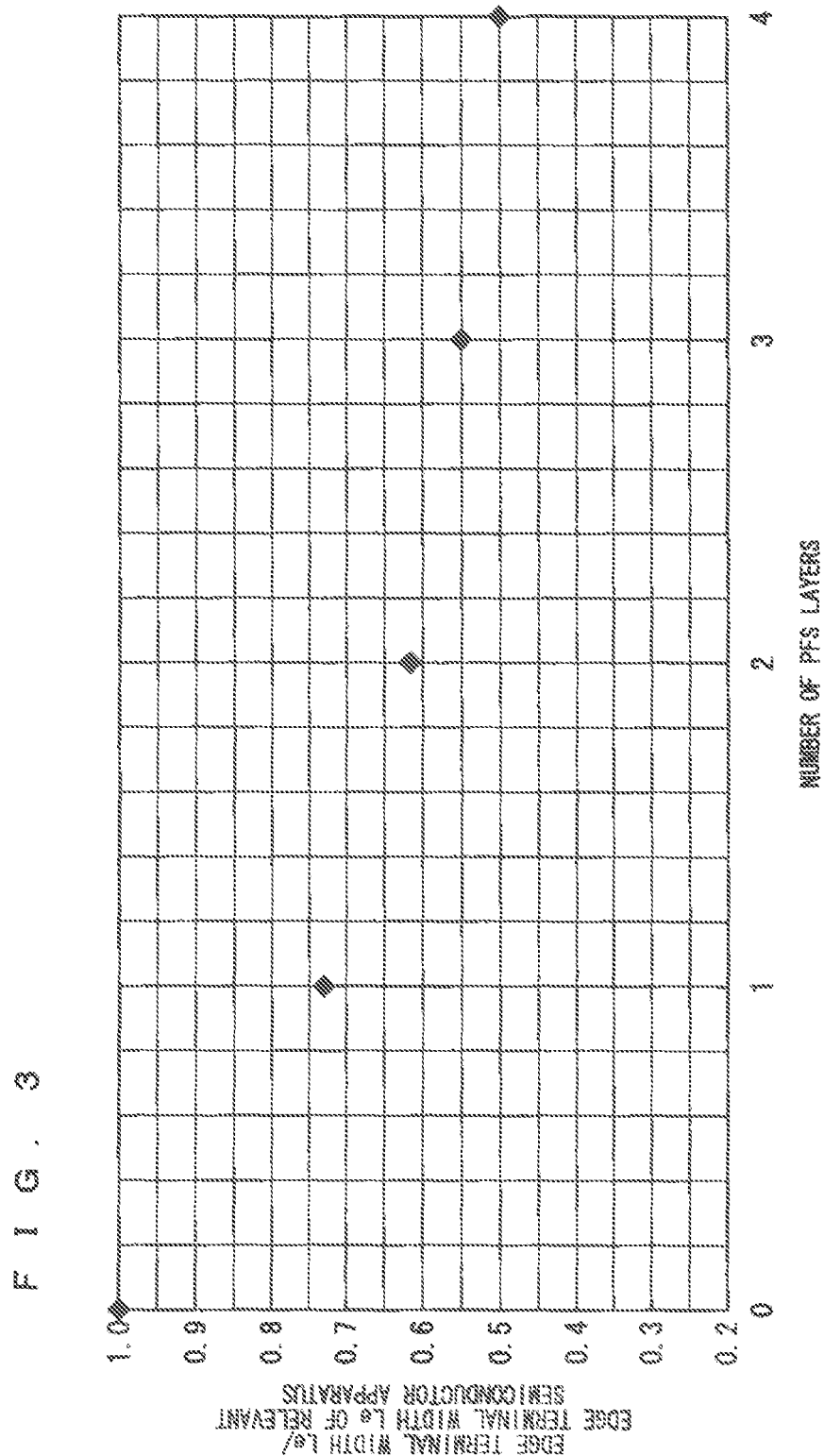
FIG. 3 is a diagram showing the relationship between edge terminal width and the number of P layers.

FIG. 3 is a diagram showing the relationship between edge terminal width Le and the number of P layers 38 (PFS layers) under a condition that the voltage resistance ($BV_{CES}$) is constant. A scale on the vertical axis in FIG. 3 indicates a normalized value for the edge terminal width Le of the semiconductor device according to the present embodiment, using the edge terminal width Le of the relevant semiconductor device as a reference. As shown in FIG. 3, when one or more p layers 38 are formed, the edge terminal width Le can be reduced to a width that is at least 25% smaller than the edge terminal width Le of the relevant semiconductor device.

Under the condition that the voltage resistance ($BV_{CES}$) is constant, the edge terminal width Le can be further reduced by increasing the number of P layers 38. A conceivable reason for this is that as the number of P layers 38 increases, a difference in the impurity concentration between each pair of adjacent P layers 38 decreases, and this reduces the concentration of an electric field in a high-curvature portion of each P layer 38 at the boundary with a diffusion layer on the edge termination region 51 side. With a suppressed concentration of electric fields at the boundary with the diffusion layer, a change in the electric field shows a smooth distribution. This is considered as a reason why the edge terminal width Le can be reduced by increasing the number of P layers 38 under conditions that the voltage resistance ($BV_{CES}$) is constant.

FIG. 3 shows that, in the case of forming four P layers 38, the edge terminal width Le can be reduced to a width that is approximately 50% of the edge terminal width Le of the relevant semiconductor device, and it is found that forming more than four layers will lessen the effect of reducing the edge terminal width Le.

Figure 4:
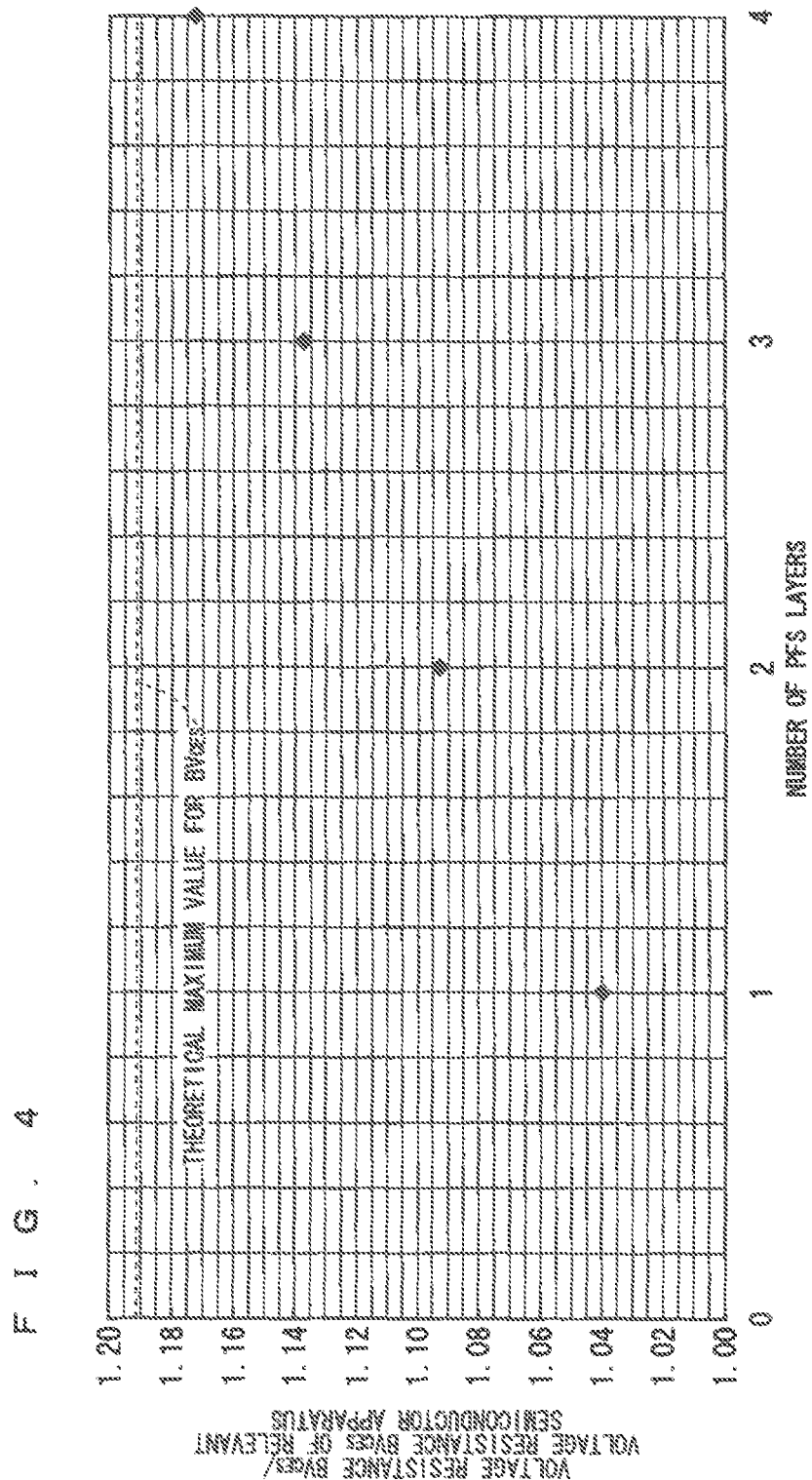
FIG. 4 is a diagram showing the relationship between voltage resistance and the number of P layers.

FIG. 4 is a diagram showing the relationship between voltage resistance ($BV_{CES}$) and the number of P layers 38 (PFS layers) under a condition that the edge terminal width Le is constant. A scale on the vertical axis in FIG. 4 indicates a normalized value for the voltage resistance of the semiconductor device according to the present embodiment, using the voltage resistance of the relevant semiconductor device as a reference.

As shown in FIG. 4, the voltage resistance can be increased by increasing the number of P layers 38 so as to approach a theoretical maximum value (indicated by the broken line in FIG. 4) for the voltage resistance of a plane PN junction, the theoretical maximum value being determined based on the material, concentration, and thickness of the substrate. A conceivable reason for this is that as the number of P layers 38 increases, a difference in the impurity concentration between each pair of adjacent P layers 38 decreases, and this reduces the concentration of an electric field in a high-curvature portion of each P layer 38 at the boundary with the diffusion layer on the edge termination region 51 side. Suppressing the concentration of an electric field at the boundary with the diffusion layer is considered to be a reason why an overall maximum withstand voltage can approach the theoretical maximum value in the plane PN junction.

Figure 5:
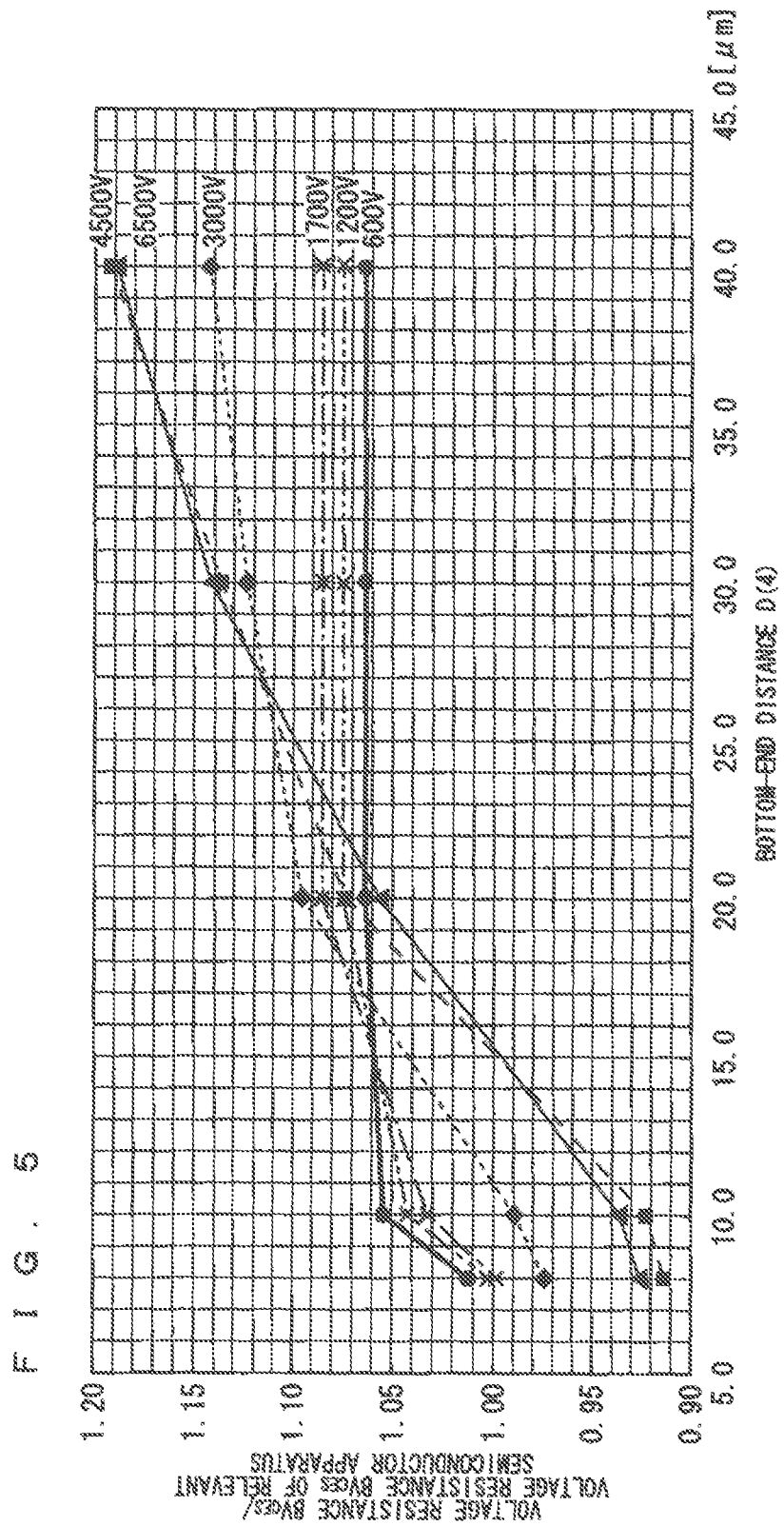
FIG. 5 is a diagram showing the relationship between voltage resistance and the bottom-end distance of a fourth P layer.

FIG. 5 is a diagram showing the relationship between voltage resistance ($BV_{CES}$) and the bottom-end distance D(4) of the fourth P layer 38-4. Note that, since in the case of forming four P layers 38 as described with reference to FIG. 3, the edge terminal width Le can be reduced to a width that is approximately 50% of the edge terminal width Le of the relevant semiconductor device, the edge terminal width Le here is assumed to be fixed at a width that is 50% of the edge terminal width Le of the relevant semiconductor device. It is also assumed that the concentration profiles, depths, widths, and positions of the first to third P layers 38-1 to 38-3 have already been optimized.

A scale on the vertical axis in FIG. 5 indicates a normalized value for the voltage resistance of the semiconductor device according to the present embodiment, using the voltage resistance of the relevant semiconductor device as a reference. A scale on the horizontal axis in FIG. 5 indicates the bottom-end distance D(4) of the fourth P layer 38-4. As shown in FIG. 5, for high withstand voltage classes (3300V, 4500V, 6500V), if the fourth P layer 38-4 has a bottom-end distance D(4) of 15 μm or more, the semiconductor device can have a higher voltage resistance (higher than 1 on the scale on the vertical axis) than the relevant semiconductor device.

Figure 6:
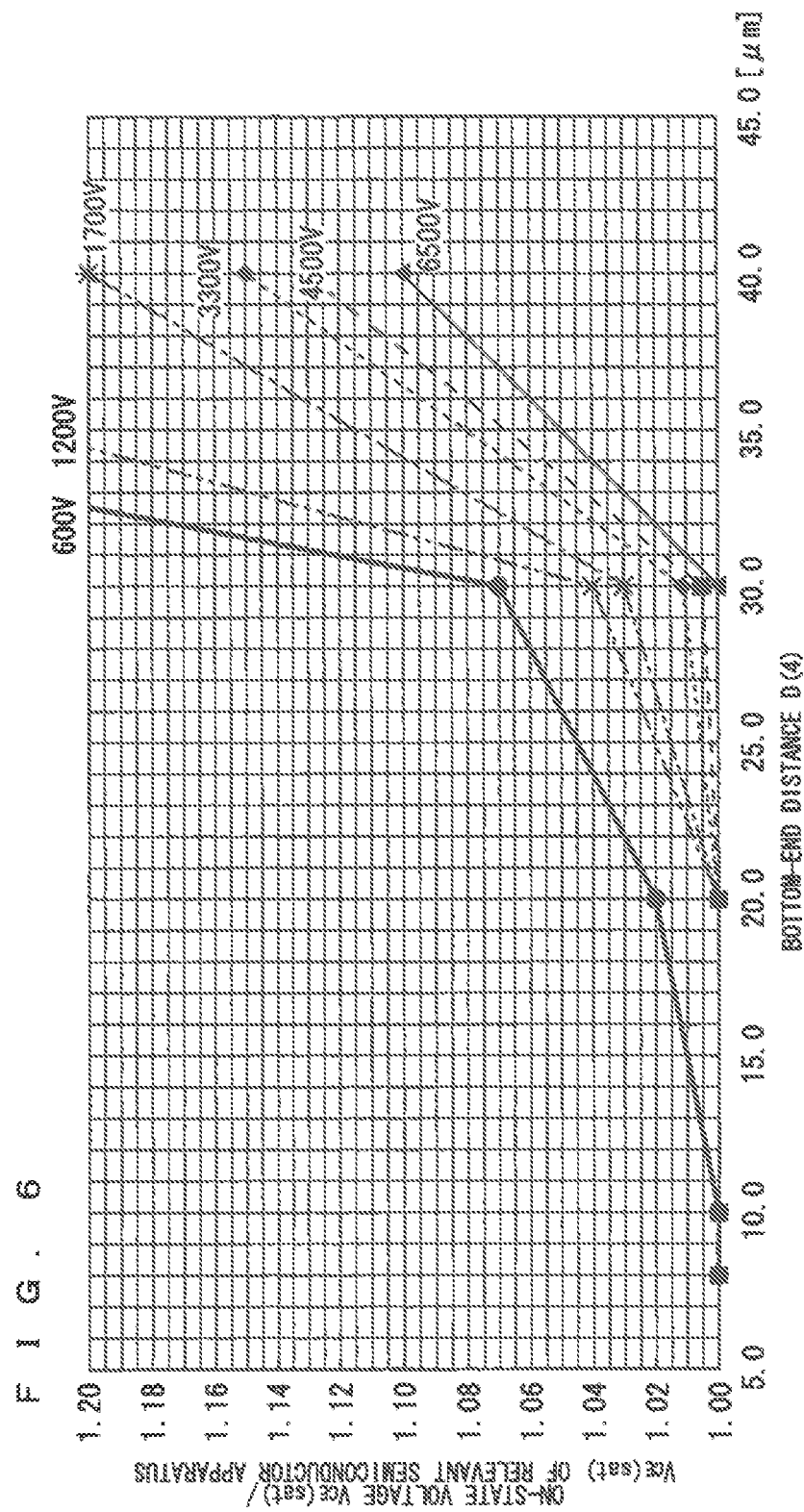
FIG. 6 is a diagram showing the relationship between ON-state voltage and the bottom-end distance of the fourth P layer.

FIG. 6 is a diagram showing the relationship between ON-state voltage ($V_{CE}$ (sat)) and the bottom-end distance D(4) of the fourth P layer 38-4 from the surface of the semiconductor substrate 1. In the case of FIG. 6, similarly to the case of FIG. 5, it is assumed that the edge terminal width Le is fixed at a width that is 50% of the edge terminal width Le of the relevant semiconductor device and that the concentration profiles, depths, widths, and positions of the first to third P layers 38-1 to 38-3 have already been optimized.

A scale on the vertical axis in FIG. 6 indicates a normalized value for the ON-state voltage of the semiconductor device according to the present embodiment, using the ON-state voltage of the relevant semiconductor device as a reference. A scale on the horizontal axis in FIG. 6 indicates the bottom-end distance D(4) of the fourth P layer 38-4. As shown in FIG. 6, for high withstand voltage classes (3300V, 4500V, 6500V), if the fourth P layer 38-4 has a bottom-end distance D(4) of 30 μm or less, an increase in the ON-state voltage can be suppressed.

FIG. 7 is a diagram showing the relationship between voltage resistance ($BV_{CES}$) and the surface concentration P(4) of the fourth P layer 38-4. In the case of FIG. 7, similarly to the case of FIG. 5 or the like, it is assumed that the edge terminal width Le is fixed at a width that is 50% of the edge terminal width Le of the relevant semiconductor device and that the concentration profiles, depths, widths, and positions of the first to third P layers 38-1 have already been optimized.

A scale on the vertical axis in FIG. 7 indicates a normalized value for the voltage resistance ($BV_{CES}$) of the semiconductor device according to the present embodiment, using a theoretical maximum value for the voltage resistance as a reference. A scale on the horizontal axis in FIG. 7 indicates a normalized peak value for the fourth surface concentration P(4), using the impurity concentration of the semiconductor substrate 1 as a reference. As shown in FIG. 7, if the peak value for the fourth surface concentration P(4) is 1 to 2000 times the impurity concentration of the semiconductor substrate 1, the semiconductor device can have a higher voltage resistance (exceeding 0.85 on the scale on the vertical axis) than the relevant semiconductor device. In particular, if the peak value for the fourth surface concentration P(4) is 10 to 1000 times the impurity concentration of the semiconductor substrate 1, the voltage resistance can be further improved so as to further approach the aforementioned theoretical maximum value.

Figure 8:
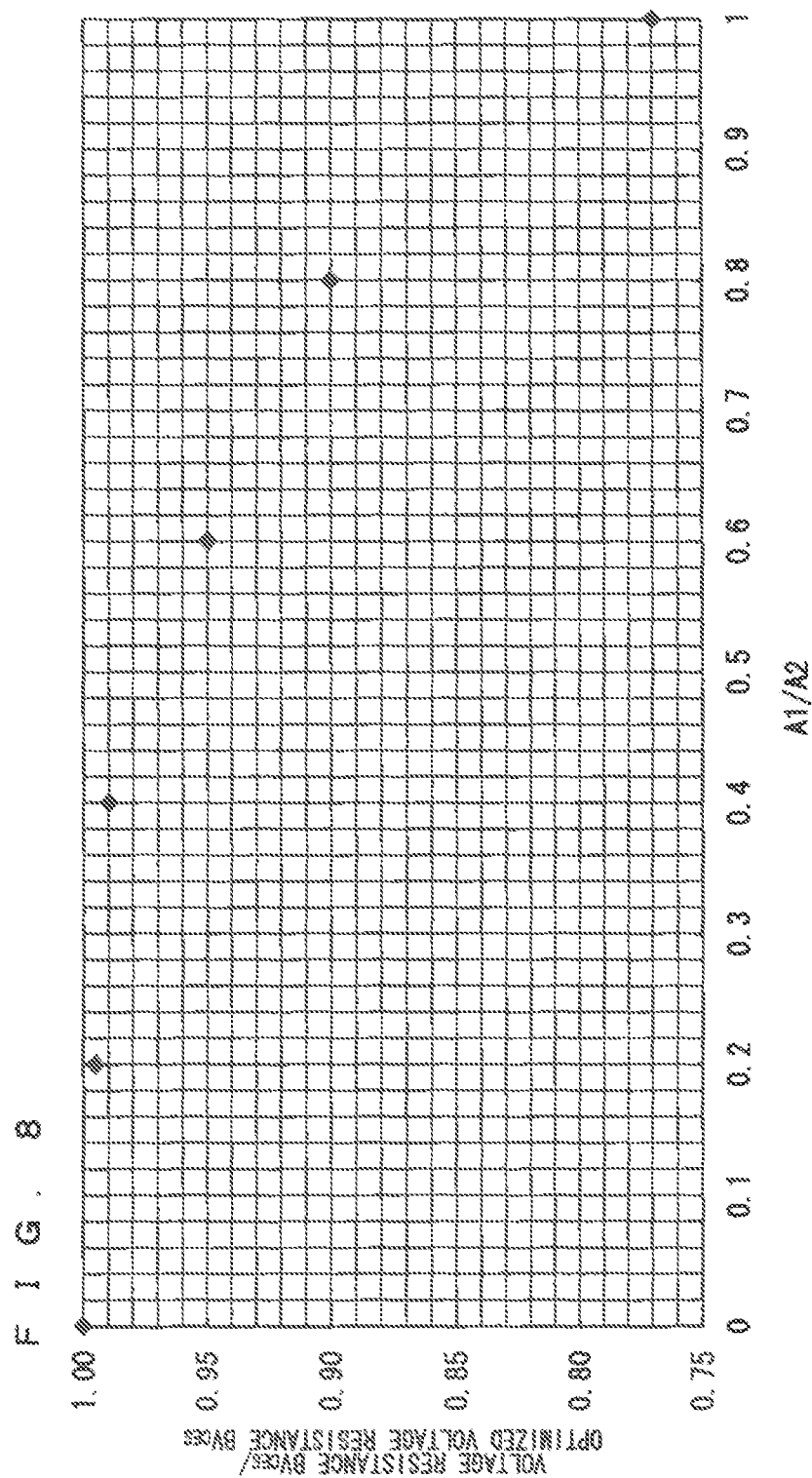
FIG. 8 is a diagram showing the relationship between voltage resistance and the ratio between distances A1 and A2.

FIG. 8 is a diagram showing the relationship between voltage resistance ($BV_{CES}$) and the ratio (A1/A2) between the distances A1 and A2 shown in FIG. 2. Here, the distance A1 is a distance from the edge of an injection window of the i+1th P layer 38 to the edge of an injection window of the ith P layer 38. The distance A2 is a distance across the injection window of the i+1th P layer 38. In the case of FIG. 8, similarly to the case of FIG. 5 or the like, it is assumed that the edge terminal width Le is fixed at a width that is 50% of the edge terminal width Le of the relevant semiconductor device and that the concentration profiles, depths, widths, and positions of the first to third P layers 38-1 to 38-3 have already been optimized. In the case of FIG. 8, it is also assumed that the concentration profile, depth, width, and position of the fourth P layer 38-4 also have already been optimized, in view of the content described with reference to FIGS. 5 to 7.

A scale on the vertical axis in FIG. 8 indicates a normalized value for the voltage resistance ($BV_{CES}$) of the semiconductor device according to the present embodiment, using the optimized value for the voltage resistance as a reference. A scale on the horizontal axis in FIG. 8 indicates the aforementioned ratio (A1/A2). As shown in FIG. 8, if the ratio (A1/A2) is 0.5 or less, deterioration in the voltage resistance ($BV_{CES}$) can be suppressed.

From the above, the semiconductor device according to the present embodiment is configured such that the concentrations of impurities in the P layers 38 increase as the P layers 38 are closer to the active region 11, and that the surface concentration P(4) of the impurity layer having the largest bottom-end distance D(4) (in the present example, the fourth P layer 38-4) is 10 to 1000 times the impurity concentration of the semiconductor substrate 1, and that the bottom-end distance D of this impurity layer (here, the fourth P layer 38-4) is in the range of 15 to 30 μm. Accordingly, it is possible to reduce chip area and to improve the withstand voltage characteristic capability and the interruption capability at turn-off without deteriorating the properties of the IGBT 14.

While the above description focuses mainly on an example of realizing a semiconductor device that includes an IGBT having a voltage resistance of approximately 4500V and serving as a high-voltage power module, a semiconductor device that includes an IGBT having a voltage resistance of 4500V or more (e.g., 6000V or more) and serving as a high-voltage power module can also be similarly realized. A semiconducting material is not limited to Si, and semiconductor devices using wide band gap materials such as SiC or GaN can also achieve effects similar to those described above.

Variation 1 of Embodiment 1

Figure 9:
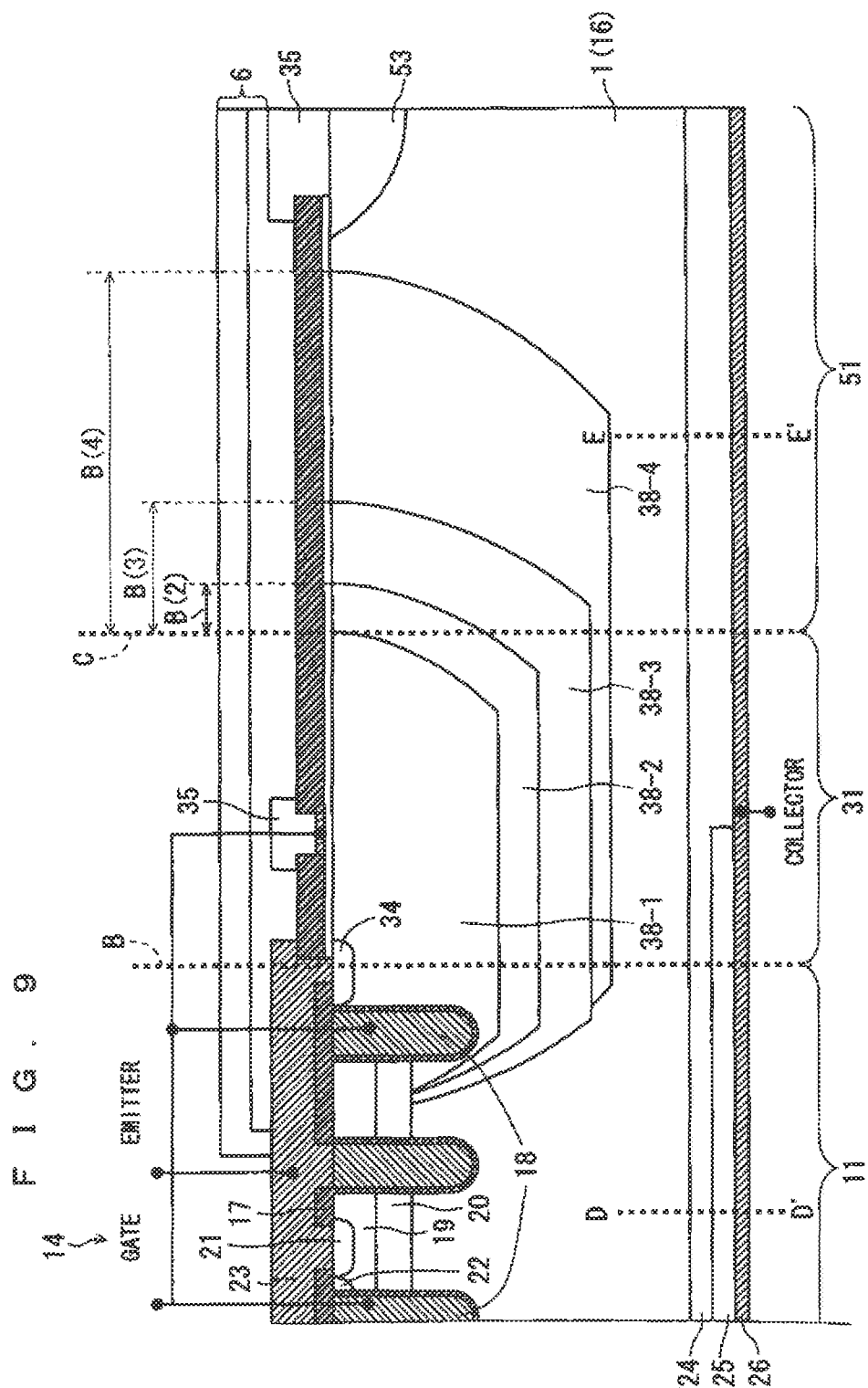
FIG. 9 is a cross-sectional view showing a configuration of a semiconductor device according to Variation 1 of Embodiment 1.
Figure 10:
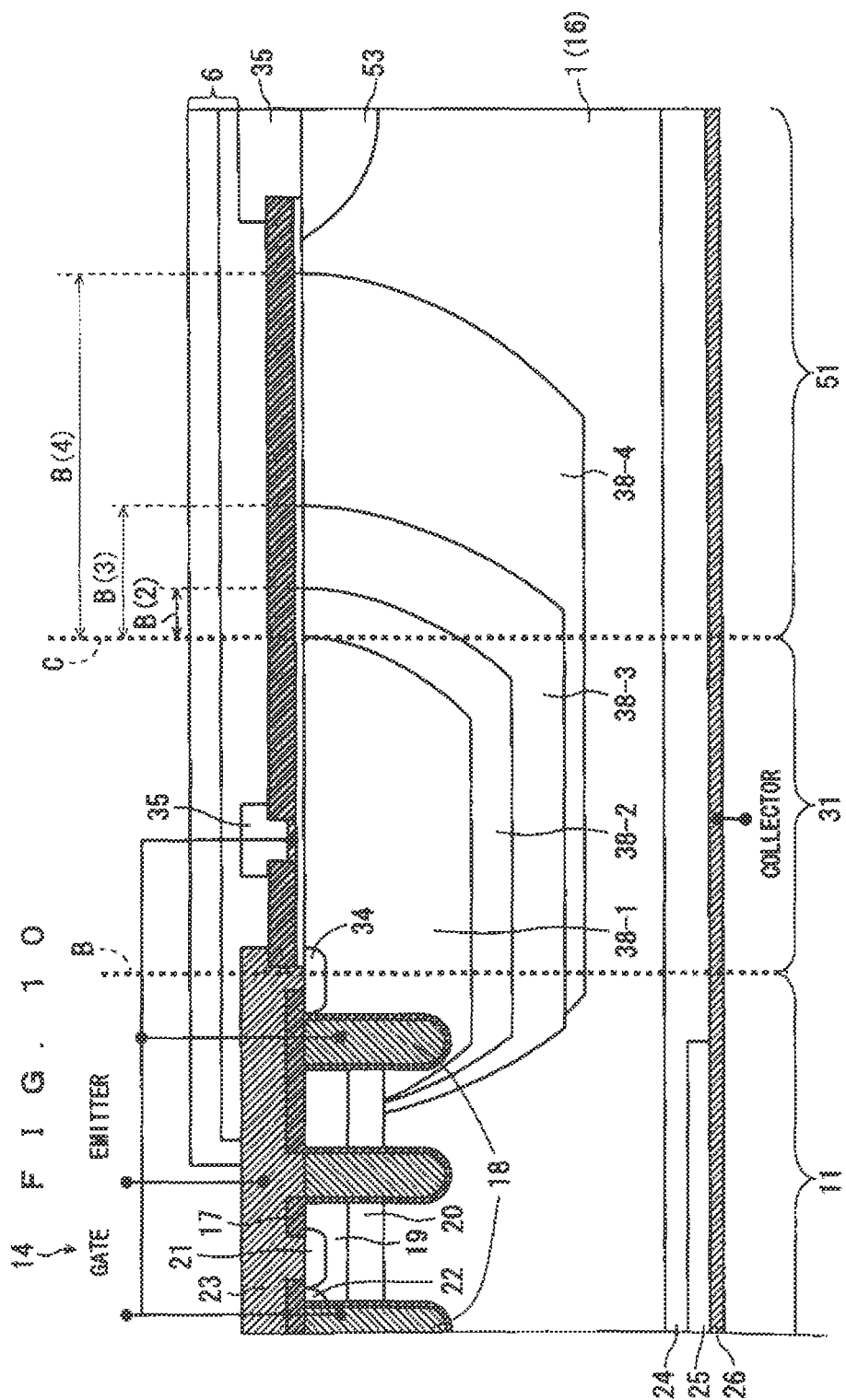
FIG. 10 is a cross-sectional view showing another configuration of the semiconductor device according to Variation 1 of Embodiment 1.
Figure 11:
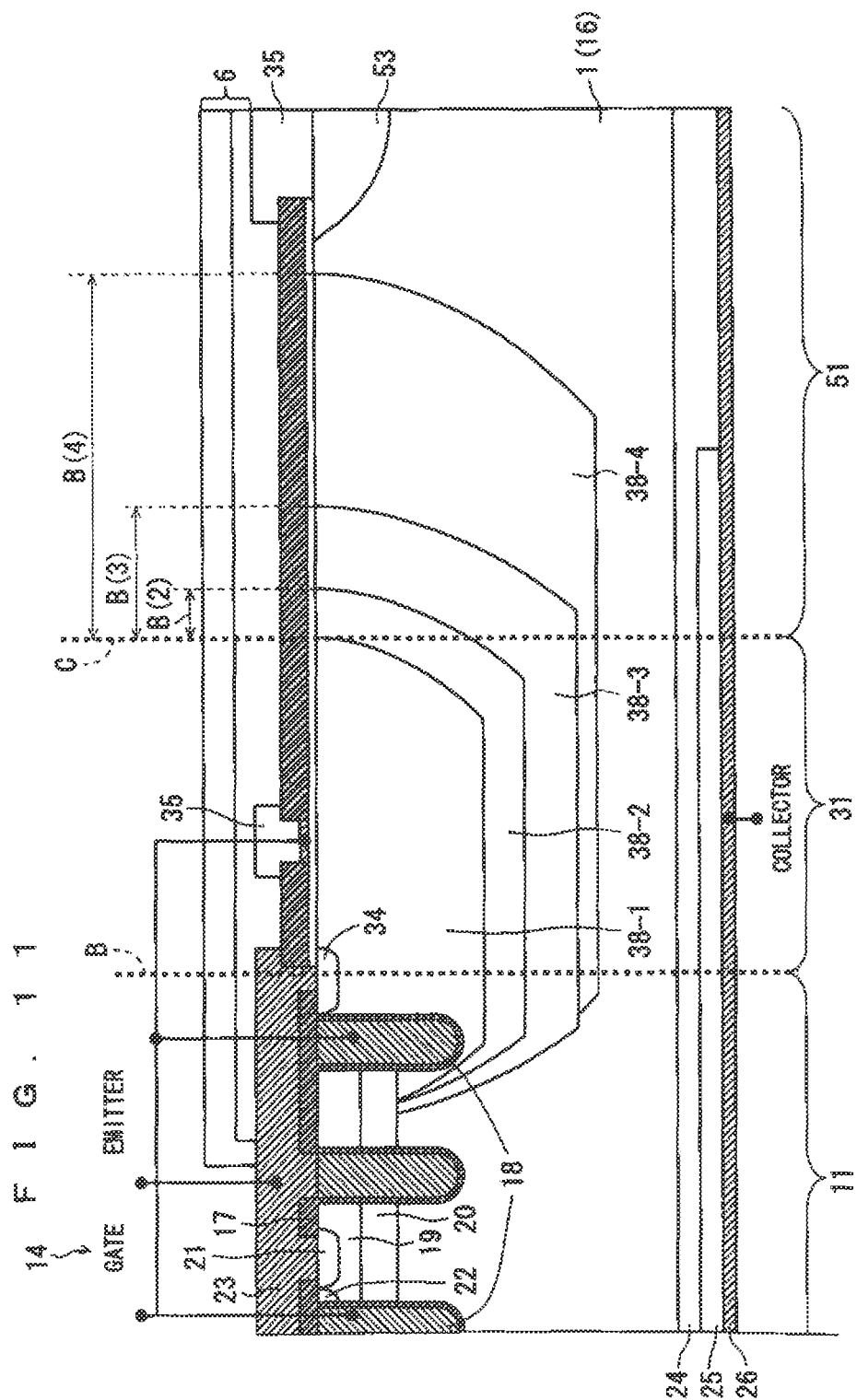
FIG. 11 is a cross-sectional view showing another configuration of the semiconductor device according to Variation 1 of Embodiment 1.

FIGS. 9 to 11 are cross-sectional views showing configurations of a semiconductor device according to Variation 1 of Embodiment 1. The semiconductor device according to the present variation differs from the aforementioned semiconductor device in the structures of the underside P layer 25 and the collector electrode 26. In the present variation, as in the case of the aforementioned semiconductor device, the underside N layer 24 (first underside impurity layer) is formed on the underside of the semiconductor substrate 1.

The underside P layer 25 (second underside impurity layer) is formed on the underside N layer 24 in a predetermined region that includes a region inside the active region 11, excluding a region of the edge termination region 51 on the edge side of the semiconductor substrate 1. Note that in the following description, the predetermined region where the underside P layer 25 is formed may also be referred to as an "underside P layer forming region." The underside P layer forming region in FIG. 9 is formed in the active region 11 and the primary PN junction region 31 surrounding the active region 11, the underside P layer forming region in FIG. 10 is formed only within the active region 11, and the underside P layer forming region in FIG. 11 spans from the active region 11 to the edge termination region 51.

As shown in FIGS. 9 to 11, in the present variation, the collector electrode 26 (electrode) is formed on the underside N layer 24 in a region other than the underside P layer forming region and is formed on underside P layer 25 in the underside P layer forming region. In this configuration in which the collector electrode 26 and the underside N layer 24 are in direct contact (short-circuited), the underside N layer 24 in the edge termination region 51 functions to suppress hole injection from the collector side when the IGBT 14 performs a turn-off operation. This improves the interruption capability of the IGBT 14 at turn-off and suppresses an increase in the ON-state voltage without having an adverse effect on the ON-state of the IGBT 14.

Figure 12:
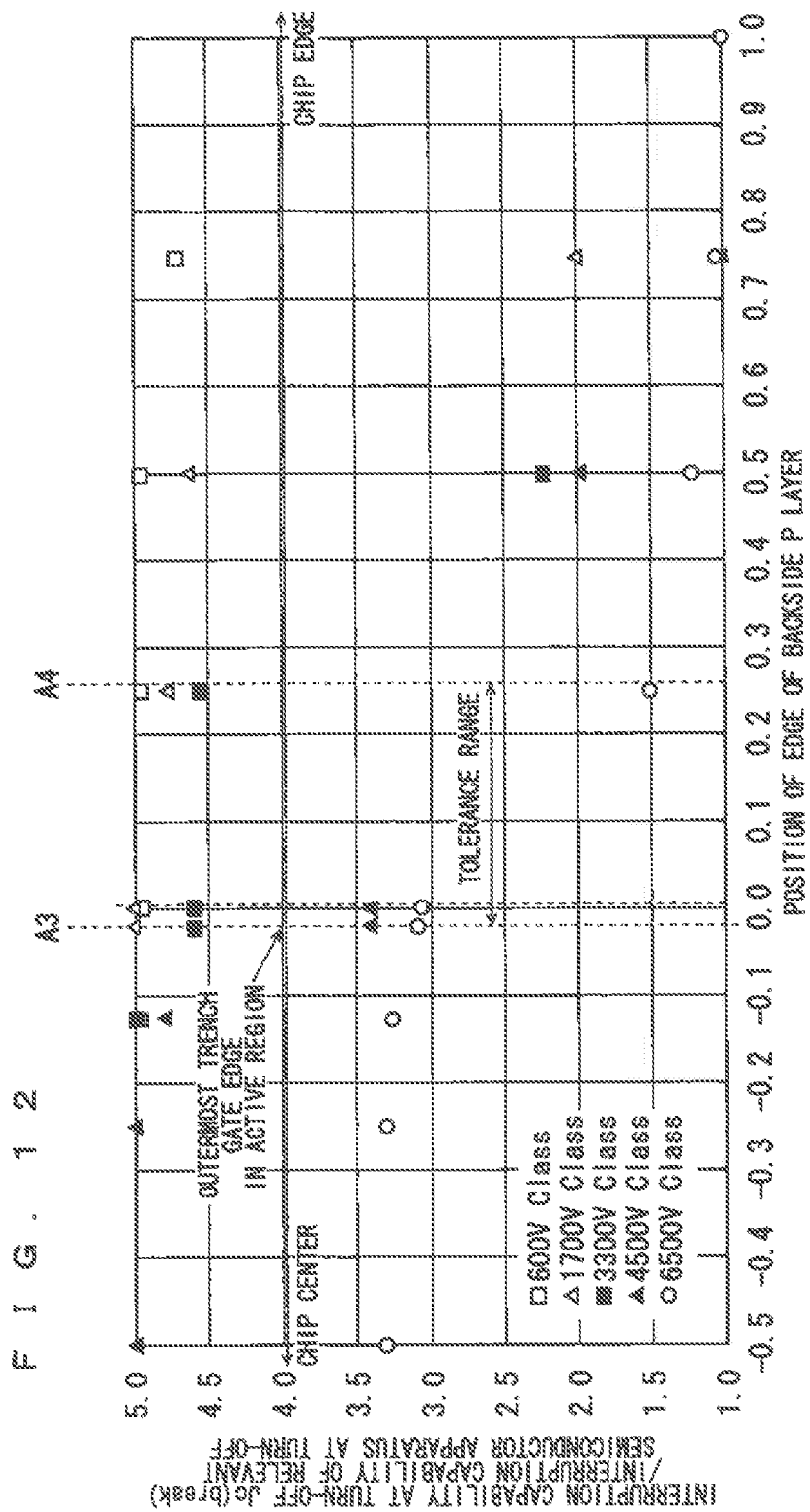
FIG. 12 is a diagram showing the relationship between interruption capability at turn-off and the position of the edge of an underside P layer.
Figure 13:
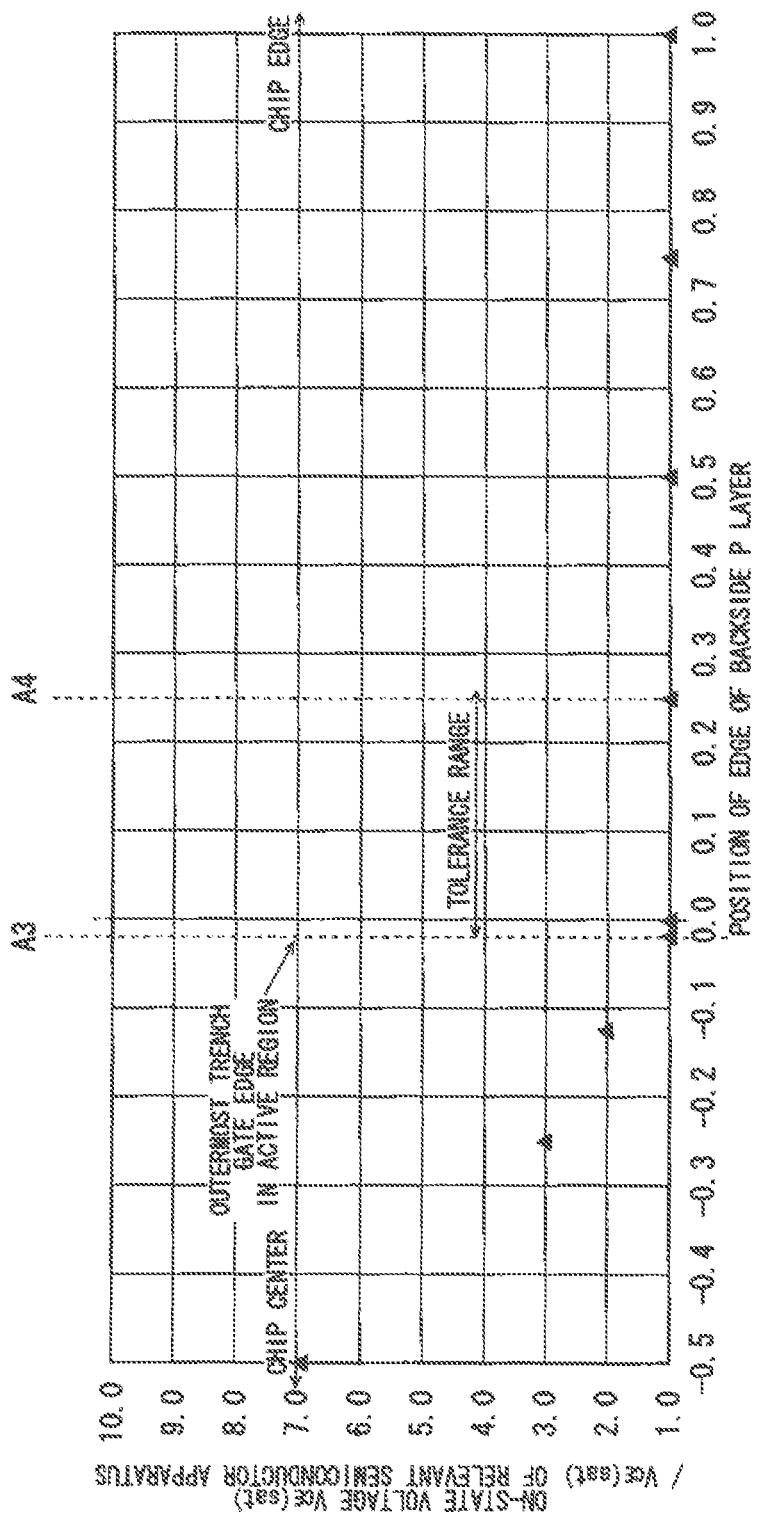
FIG. 13 is a diagram showing the relationship between ON-state voltage and the position of the edge of the underside P layer.

FIG. 12 is a diagram showing the relationship between the interruption capability at turn-off $J_C$ (break) (maximum current density at which the semiconductor device can be turned off without breakdown) and the position of the edge of the underside P layer 25 (the boundary between the underside P layer 25 and the underside N layer 24 when viewed in plan view). FIG. 13 is a diagram showing the relationship between ON-state voltage ($V_{CE}$ (sat)) and the position of the edge of the underside P layer 25 (the boundary between the underside P layer 25 and the underside N layer 24 when viewed in plan view).

A scale on the vertical axis in FIG. 12 indicates a normalized value for the interruption capability of the semiconductor device at turn-off according to the present variation, using the interruption capability of the relevant semiconductor device at turn-off as a reference. A scale on the vertical axis in FIG. 13 indicates a normalized value for the ON-state voltage of the semiconductor device according to the present variation, using the ON-state voltage of the relevant semiconductor device as a reference.

Figure 14:
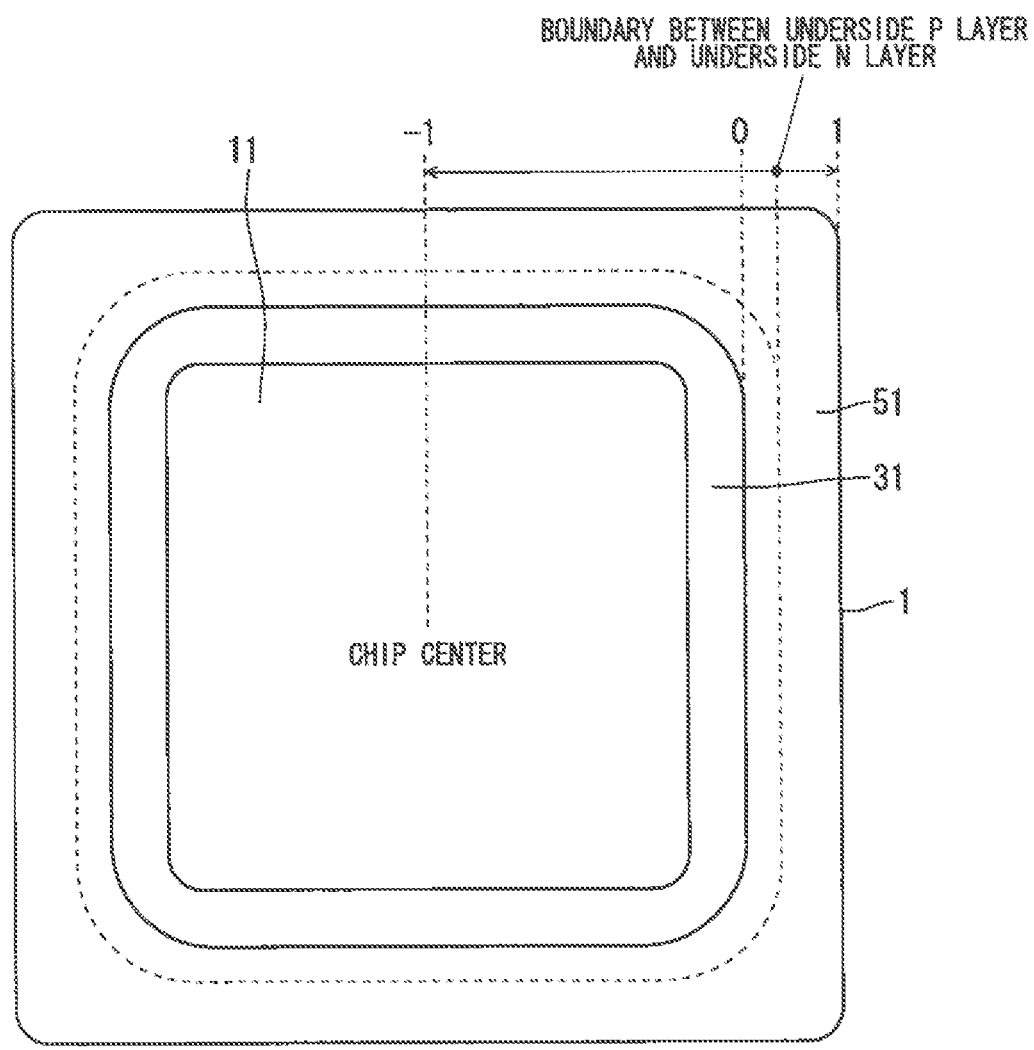
FIG. 14 is a plan view for describing scales on horizontal axes in FIGS. 12 and 13.

The horizontal axes in FIGS. 12 and 13 indicate the position of the edge of the underside P layer 25 (the position at the boundary between the underside N layer 24 and the underside P layer 25), assuming that the boundary between the primary PN junction region 31 and the edge termination region 51 is the origin. FIG. 14 is a plan view for describing the scales on the horizontal axes in FIGS. 12 and 13. As shown in FIG. 14, the scales on the horizontal axes in FIGS. 12 and 13 are normalized such that, assuming that the boundary between the primary PN junction region 31 and the edge termination region 51 is the origin, a position +1 on the scale corresponds to the edge of the semiconductor substrate 1 (chip edge) and a position −1 on the scale corresponds to the center of the semiconductor substrate 1 (chip center).

Referring back to FIGS. 12 and 13, locations A3 and A4 are shown in the graphs. The location A3 indicates a location (−0.05 on the scale) of the edge of the outermost gate electrode 18 in active region 11 on the edge side termination region 51. The location A4 indicates a location that is away from the edge of the edge termination region 51 on the active region 11 side to be closer to the edge of the semiconductor substrate 1 by one fourth of the distance across the edge termination region 51 (a distance from the boundary between the primary PN junction region 31 and the edge termination region 51 to the edge of the semiconductor substrate 1).

Here, the semiconductor device according to the present variation is configured such that the edge of the underside P layer 25 (the boundary between the underside P layer 25 and the underside N layer 24 when viewed in plan view) is located between the locations A3 and A4. Such a semiconductor device can improve the interruption capability of the IGBT 14 at turn-off and suppress an increase in the ON-state voltage without having an adverse effect on the ON state of the IGBT 14, as shown in FIGS. 12 and 13. Any of the configurations shown in FIGS. 9 to 11 can achieve this effect as long as the edge of the underside P layer 25 (the boundary between the underside P layer 25 and the underside N layer 24 when viewed in plan view) is located between the locations A3 and A4.

Variation 2 of Embodiment 1

Figure 15:
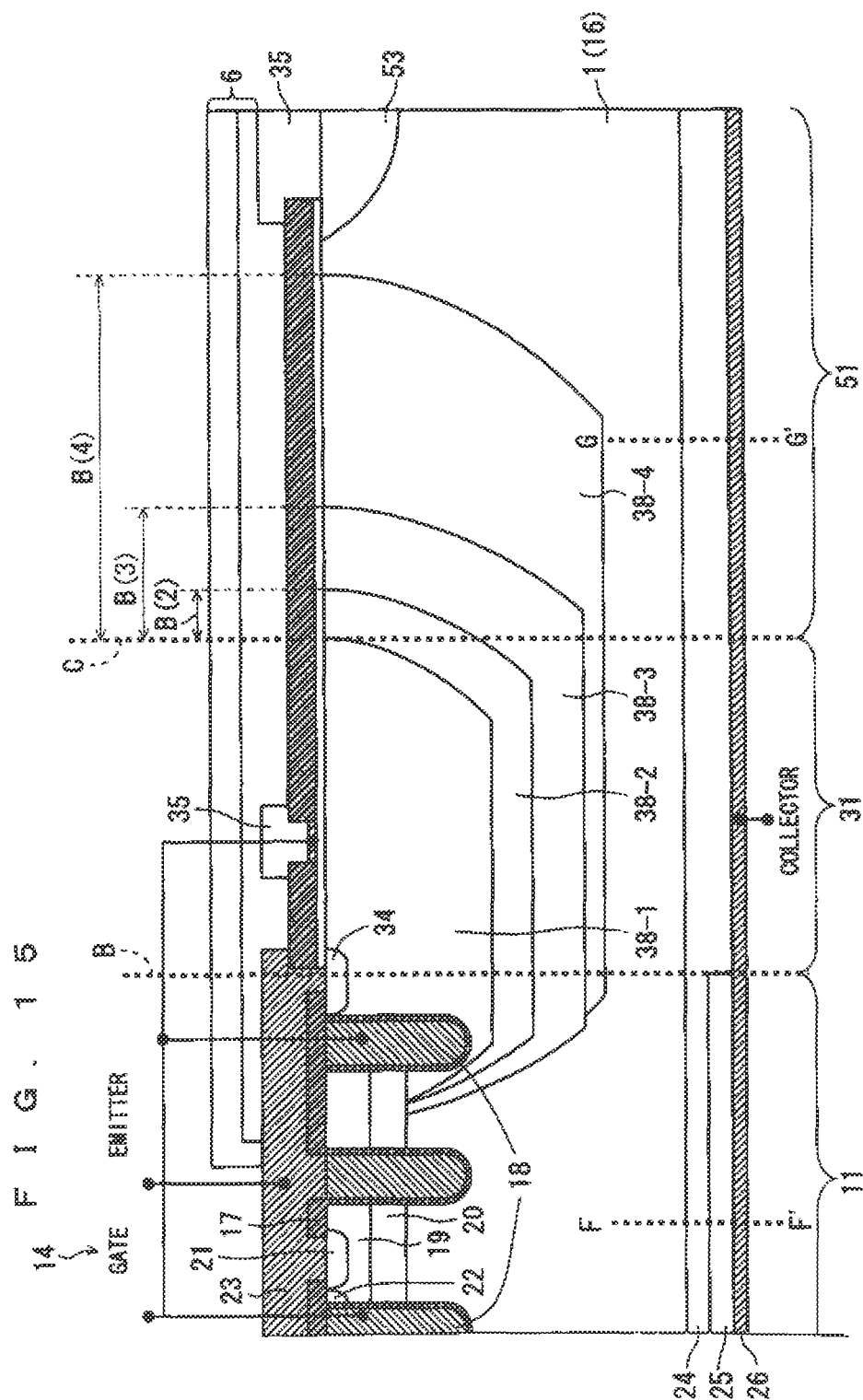
FIG. 15 is a cross-sectional view showing a configuration of a semiconductor device according to Variation 2 of Embodiment 1.

FIG. 15 is a cross-sectional view showing a configuration of a semiconductor device according to Variation 2 of Embodiment 1. The semiconductor device according to the present variation is configured such that in the semiconductor device according to Variation 1 of Embodiment 1, the N-type impurity concentration of the underside N layer 24 peaks at a deep position from the surface of the semiconductor substrate 1.

Figure 16:
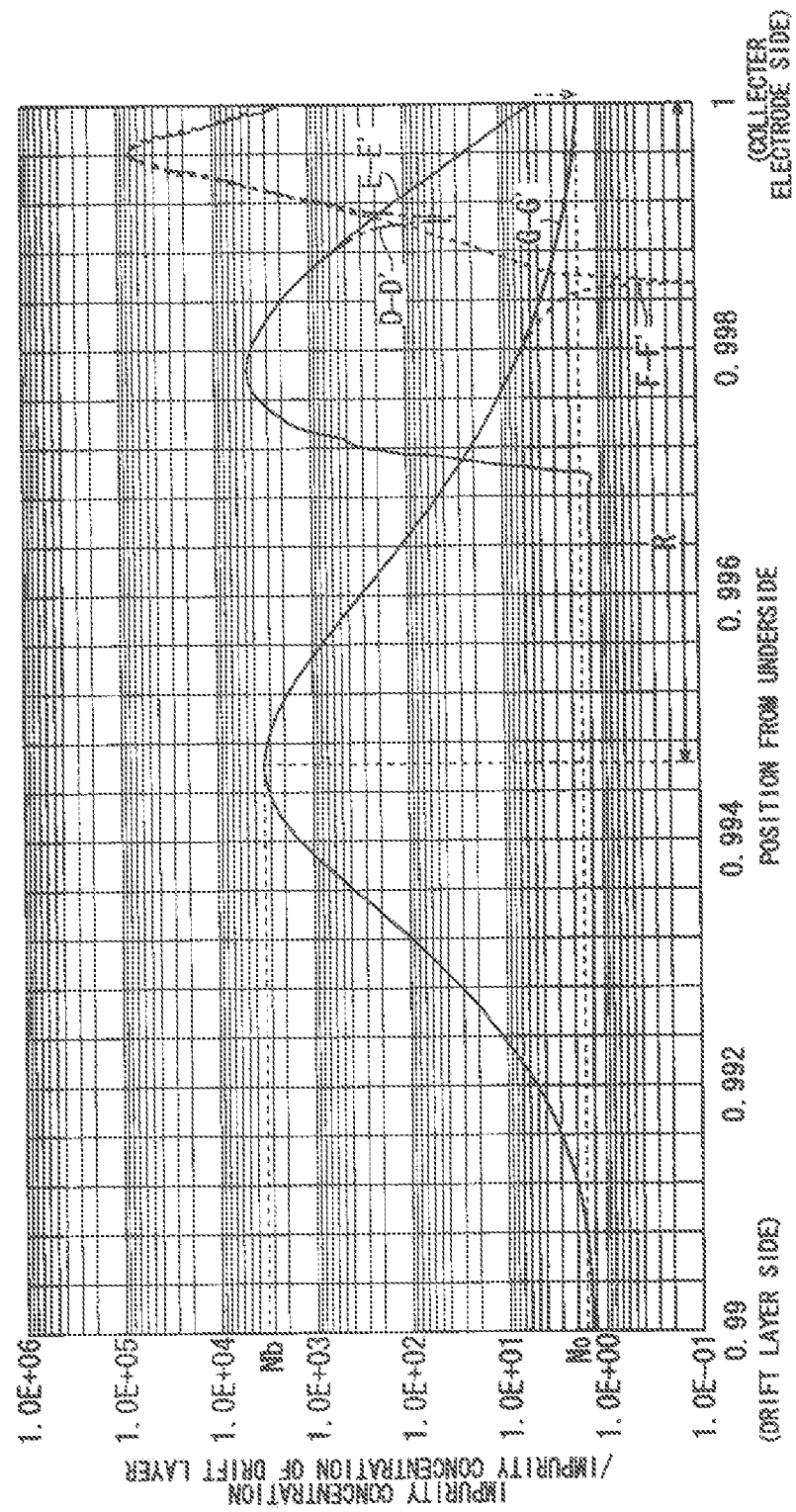
FIG. 16 is a diagram showing impurity concentration profiles along lines D-D', E-E', F-F, and G-G'.

FIG. 16 is a diagram showing impurity concentration profiles along lines D-D' and E-E' in FIG. 9 and impurity concentration profiles along lines F-F and G-G' in FIG. 15. A scale on the vertical axis in FIG. 16 indicates an impurity concentration normalized using the impurity concentration of the drift layer 16 (the impurity concentration of the semiconductor substrate 1). A scale on the horizontal axis in FIG. 16 indicates a position along the thickness of the semiconductor substrate 1 and indicates that the position closer to 1 on the scale is closer to the collector electrode 26.

Out of the two peaks of the impurity concentrations for each of lines D-D' and F-F, the peak that is closer to the collector electrode 26 indicates a peak of the P-type impurity concentration of the underside P layer 25, and the other peak that is farther from the collector electrode 26 indicates a peak of the N-type impurity concentration of the underside N layer 24. The single peak of the impurity concentration for each of lines E-E' and G-G' indicates a peak of the N-type impurity concentration of the underside N layer 24. For lines D-D' and G-G' in FIG. 16, the impurity concentrations at positions close to 0.99 on the scale indicate the impurity concentration of the drift layer 16 (the impurity concentration of the semiconductor substrate 1).

In the present variation, the configuration is such that a distance R from the underside of the semiconductor substrate 1 to the peak (first peak) of the impurity concentration of the underside N layer 24 satisfies the following inequation. In this inequation, ΔR is a distance between the peak and a position that corresponds to a standard deviation of the impurity concentration of the underside N layer 24 in the range from the underside of the semiconductor substrate 1 to the peak, $N_0$ is the impurity concentration of the underside N layer 24 at the underside of the semiconductor substrate 1, and $N_b$ is an impurity concentration at the peak in the underside N layer 24. It is assumed here that the underside N layer 24 in the underside P layer forming region and the underside N layer 24 in the other region are both formed through the same implantation process (the same amount of implantation, the same implantation energy, and the same implantation window).

$$R > \sqrt{2} \cdot \Delta R \cdot \sqrt{\ln \frac{N_b}{N_0}}$$

As described above, in the present variation, the position of the peak of the impurity concentration of the underside N layer 24 (the impurity concentration for line G-G') satisfies the above inequation and is deep from the underside of the semiconductor substrate 1. As a result, the impurity concentration on the collector electrode 26 side for line G-G' is lower than that for line E-E' as indicated by the broken-line arrow in FIG. 16. This reduces the influence of an ohmic contact made by the underside N layer 24 and the collector electrode 26 in the edge termination region 51. Accordingly, when the IGBT 14 is in reverse withstand voltage mode (when the emitter is positive and the collector is negative), the effect of a forward bias diode formed between the P+ layer 21 on the surface side of the semiconductor substrate 1 and the underside N layer 24 is suppressed. Therefore, it is possible to improve the reverse voltage resistance of the IGBT 14 and to reduce leakage current in the reverse withstand voltage mode.

Variation 3 of Embodiment 1

Figure 17:
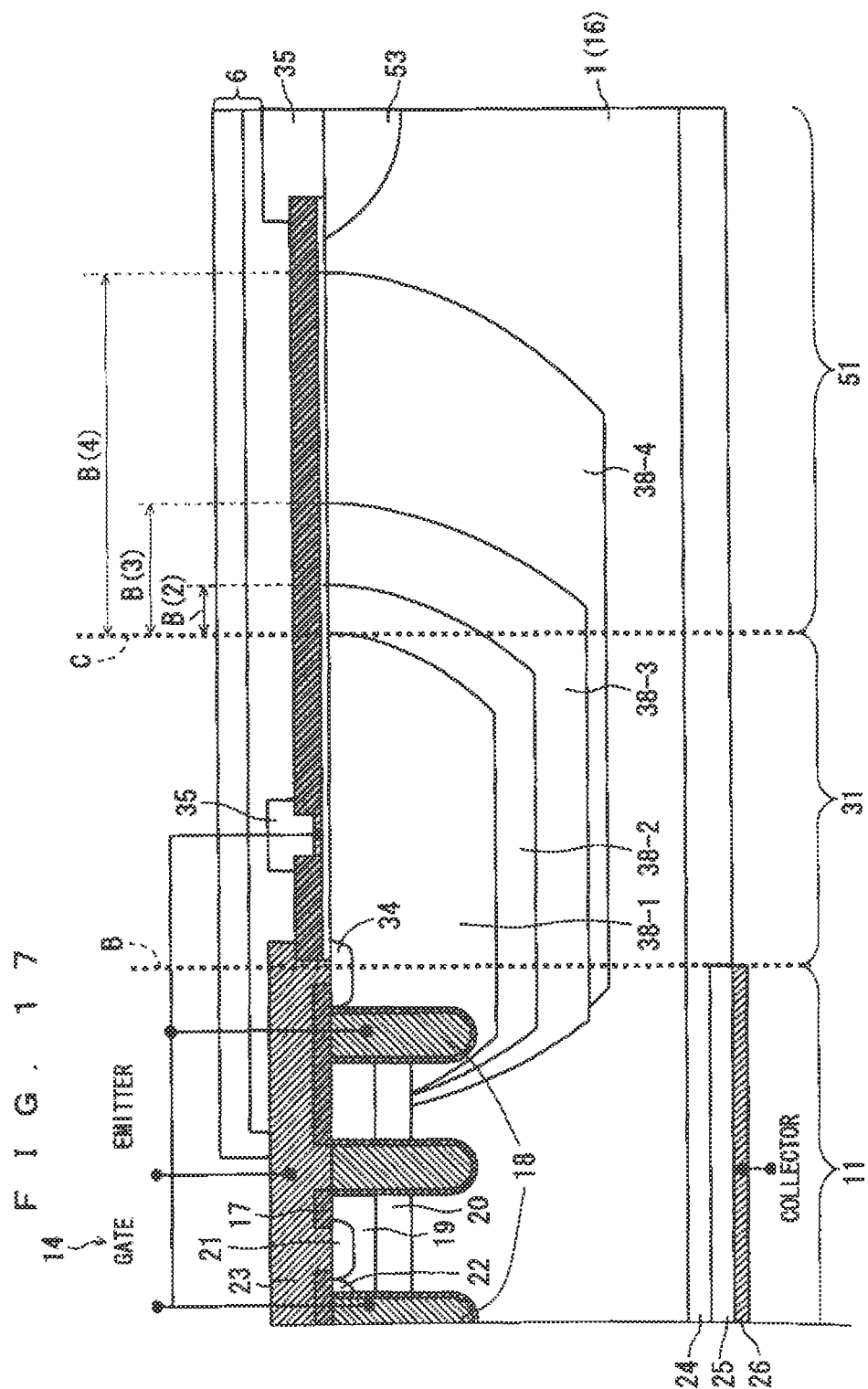
FIG. 17 is a cross-sectional view showing a configuration of a semiconductor device according to Variation 3 of Embodiment 1.

FIG. 17 is a cross-sectional view showing a configuration of a semiconductor device according to Variation 3 of Embodiment 1. The semiconductor device according to the present variation is configured such that in the semiconductor device according to Variation 1 of Embodiment 1, the collector electrode 26 is formed on the underside P layer 25 in the underside P layer forming region without being formed on the underside N layer 24.

According to the present variation with such a configuration, no ohmic contact is formed by the underside N layer 24 and the collector electrode 26 in the edge termination region 51. Accordingly, when the IGBT 14 is in the reverse withstand voltage mode (when the emitter is positive and the collector is negative), the effect of a forward bias diode formed between the P+ layer 21 on the surface side of the semiconductor substrate 1 and the underside N layer 24 is suppressed. Therefore, it is possible to improve the reverse voltage resistance of the IGBT 14 and to reduce leakage current in the reverse withstand voltage mode.

Variation 4 of Embodiment 1

Figure 18:
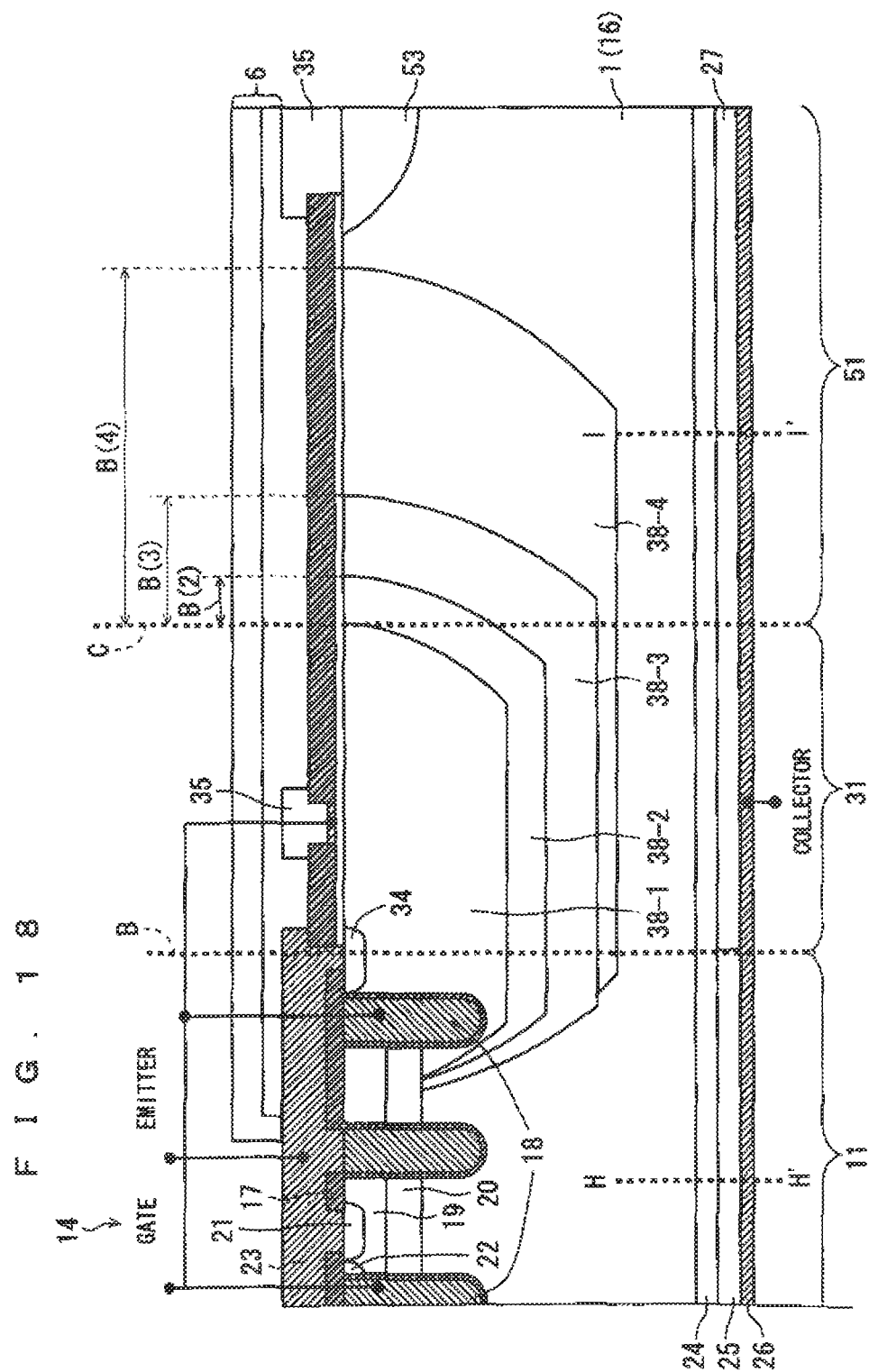
FIG. 18 is a cross-sectional view showing a configuration of a semiconductor device according to Variation 4 of Embodiment 1.

FIG. 18 is a cross-sectional view showing a configuration of a semiconductor device according to Variation 4 of Embodiment 1. The semiconductor device according to the present variation is configured such that in the semiconductor device according to Variation 1 of Embodiment 1, a low-concentration P layer 27 (third underside impurity layer) having a lower impurity concentration than the underside P layer 25 is additionally provided.

The low-concentration P layer 27 is formed on the underside N layer 24 in a region other than the underside P layer forming region. The collector electrode 26 is formed on the low-concentration P layer 27 in the region other than the underside P layer forming region and is formed on the underside P layer 25 in the underside P layer forming region.

Figure 19:
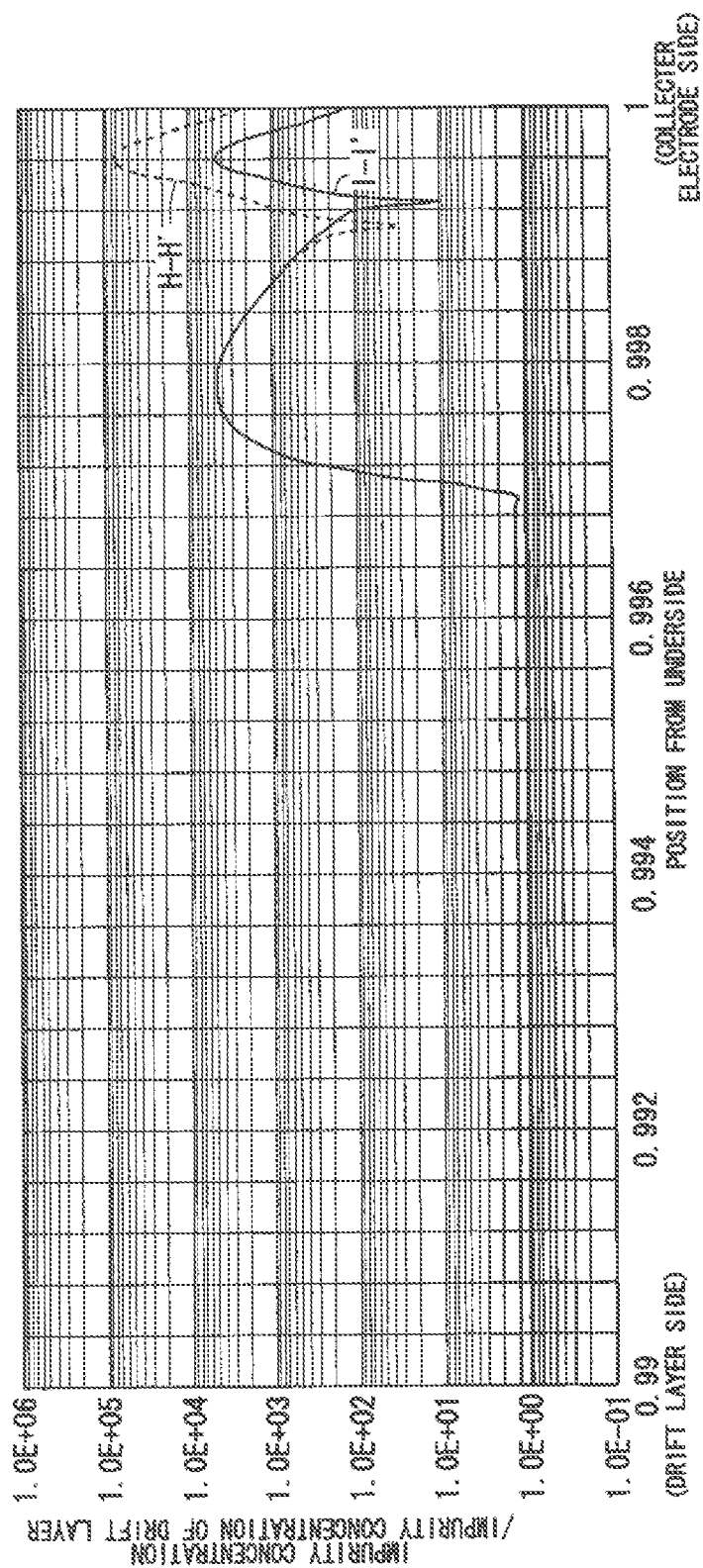
FIG. 19 is a diagram showing impurity concentration profiles along lines H-H' and I-I'.

FIG. 19 is a diagram showing impurity concentration profiles along lines H-H' and I-I' in FIG. 18 in the same form as in FIG. 16. Out of the two peaks of the impurity concentration for line H-H', the peak that is closer to the collector electrode 26 (closer to 1 on the scale on the horizontal axis) indicates a peak of the P-type impurity concentration of the underside P layer 25, and the other peak that is farther from the collector electrode 26 indicates a peak of the N-type impurity concentration of the underside N layer 24.

Out of the two peaks of the impurity concentration for line I-I', the peak that is closer to the collector electrode 26 (closer to 1 on the scale on the horizontal axis) indicates a peak of the P-type impurity concentration of the low-concentration P layer 27, and the other peak that is farther from the collector electrode 26 indicates a peak of the N-type impurity concentration of the underside N layer 24. The impurity concentrations for lines H-H' and I-I', the range of which are constant, indicate the impurity concentration of the drift layer 16 (the impurity concentration of the semiconductor substrate 1).

As described above, in the semiconductor device with the low-concentration P layer 27 according to the present variation, the underside P layer 25, the low-concentration P layer 27, the drift layer 16, and the underside N layer 24 form a PN junction. Accordingly, when the IGBT 14 is in the reverse withstand voltage mode (when the emitter becomes positive and the collector becomes negative), the IGBT 14 has a reverse withstand voltage, and therefore it is possible to improve the reverse voltage resistance of the IGBT 14 and to reduce leakage current in the reverse withstand voltage mode.

Additionally, in the present variation, as shown in FIG. 19, the peak (second peak) of the impurity concentration of the low-concentration P layer 27 is higher than the impurity concentration of the semiconductor substrate 1 and is lower than the peak (third peak) of the impurity concentration of the underside N layer 25.

In the semiconductor device according to the present variation, when the IGBT 14 is in the ON state, contribution to hole injection from the collector side is reduced, and accordingly, an increase in the carrier concentration of the edge termination region 51 is suppressed. As a result, it is possible to suppress impact ionization due to increased electric field strength on the emitter side that is caused by an increase in the carrier concentration of the edge termination region 51 or the like and to suppress excessive increases in current density and temperature. This suppresses a reduction in the current interruption capability when the IGBT 14 performs a turn-off operation.

Embodiment 2

Figure 20:
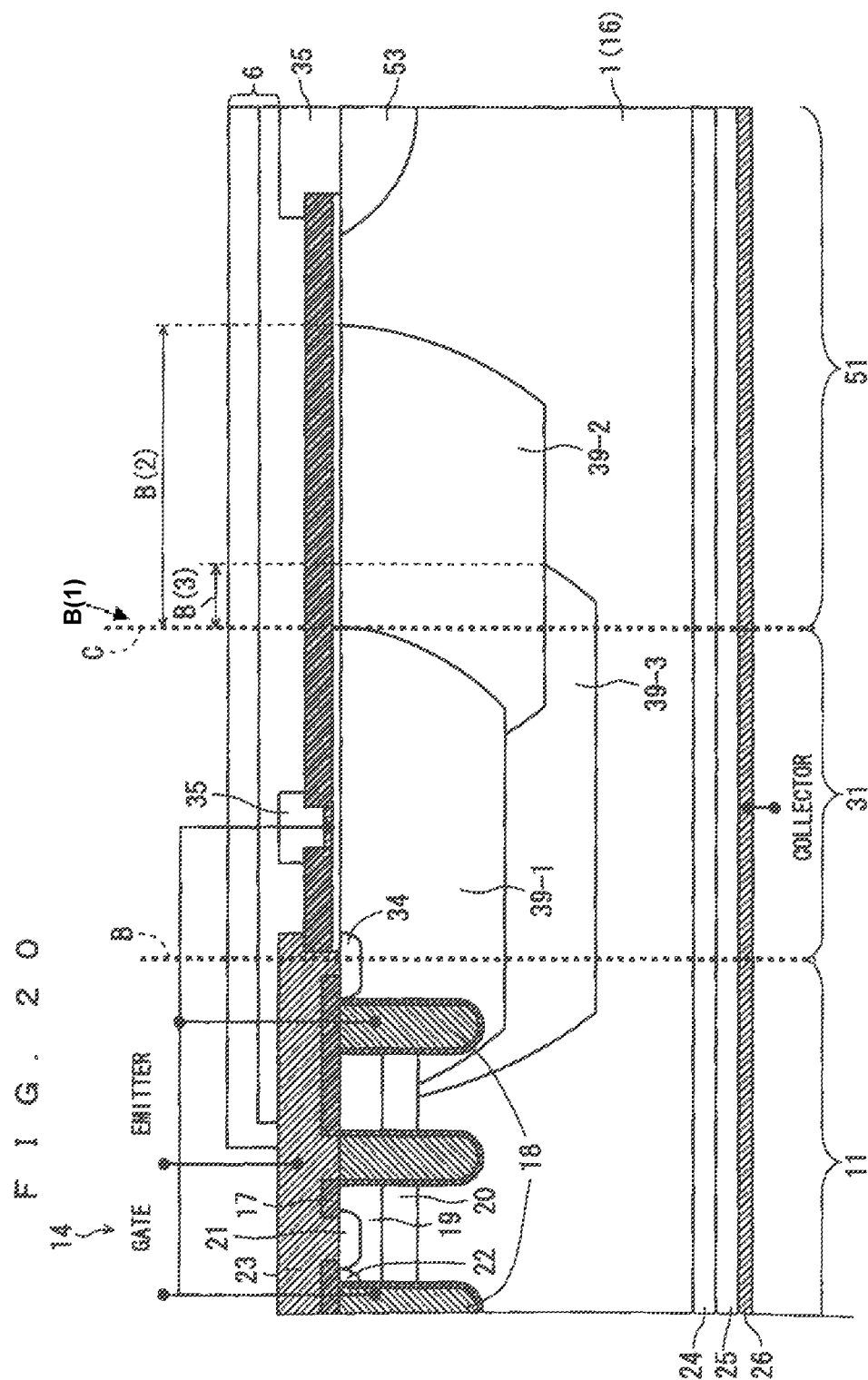
FIG. 20 is a cross-sectional view showing a configuration of a semiconductor device according to Embodiment 2.

FIG. 20 is a cross-sectional view showing a configuration of a semiconductor device according to Embodiment 2 of the present invention. Note that in the semiconductor device according to the present embodiment, constituent elements that are the same as or similar to those described in Embodiment 1 are denoted by the same reference numerals, and the following description focuses on differences from Embodiment 1.

As shown in FIG. 20, the semiconductor device according to the present embodiment includes, instead of the plurality of P layers 38, three P layers 39 (a first P layer 39-1, a second P layer 39-2, and a third P layer 39-3 of the second conductivity type).

The first and second P layers 39-1 and 39-2 are formed partly overlapping each other in a region spanning from the edge portion of the active region 11 to the edge termination region 51 in the surface of the semiconductor substrate 1. The third P layer 39-3 is adjacent to a lower portion of the first P layer 39-1 on the edge termination region 51 side and a lower portion of the second P layer 39-2 on the active region 11 side.

In the present embodiment, these P layers 39 are, as a whole, formed to extend across the edge portion of the active region 11, the primary PN junction region 31, and the edge termination region 51 and function as a P-type field stopper layer (hereinafter, referred to as a "PFS layer") that suppresses the occurrence of a high electric field around the gate electrode 18 located on the outermost side of the active region 11 (at the edge of the active region 11).

The first P layer 39-1 among the three P layers 39c corresponds to the aforementioned P layer 33-1 (primary junction P layer). The boundary B between the active region 11 and the primary PN junction region 31 passes through the edge of the contact hole that connects the emitter electrode 23 and the P+ layer 34 on the edge side of the semiconductor substrate 1, and the boundary C between the primary PN junction region 31 and the edge termination region 51 passes through the edge of the first P layer 39-1 on the edge side of the semiconductor substrate 1.

Here, $P(1) > P(2) > P(3)$ is satisfied, where $P(1)$, $P(2)$, and $P(3)$ are respectively P-type impurity concentrations (surface concentrations) of the first to third P layers 39-1 to 39-3 at the surface of the semiconductor substrate 1.

Also, $D(1) < D(2) < D(3)$ is satisfied, where $D(1)$, $D(2)$, and $D(3)$ are respectively distances (bottom-end distances) from the surface of the semiconductor substrate 1 to the bottom ends of the first to third P layers 39-1 to 39-3.

Also, if $B(1)$, $B(2)$, and $B(3)$ are respectively distances from the edge of the edge termination region 51 on the active region 11 side (i.e., the boundary C) to the edges of the first to third P layers 39-1 to 39-3 on the edge side of the semiconductor substrate 1, $B(1) < B(3) < B(2)$ are satisfied as shown in FIG. 20 (where $B(1)=0$).

In the above-described configuration of the present embodiment, the outer second and third P layers 39-2 and 39-3 that have a voltage among the P layers 39 (PFS layer) have relatively low curvature in cross-section shape. Accordingly, intensive application of high electric fields to local portions can be suppressed.

The concentrations of impurities in the P layers 39 (PFS layer) are designed to satisfy P(1)>P(2)>P(3) and increase stepwise as the P layers 39 are closer to the cell (active region 11). Thus, the presence of the second P layer 39-2 inhibits the depletion layer from extending in the lateral direction and reaching the first P layer 39-1. As a result, a difference in the electrostatic potential between the inside and outside of a high-curvature portion in cross-section shape of the first P layer 39-1 becomes substantially zero. Thus, it is possible to suppress the application of a high electric field to that portion of the first P layer 39-1.

As described above, the semiconductor device according to the present embodiment can suppress intensive application of high electric fields to local portions. In other words, high electric fields are distributed, and this increases the maximum voltage resistance. In addition, a smooth change in the electric field in the plurality of P layers 39 can reduce the edge terminal width Le when the withstand voltage is constant, as in Embodiment 1. Accordingly, the chip area can be reduced.

Note that the design tolerance range of the third P layer 39-3 is determined based on the edge terminal width Le and the voltage resistance that are required for the device. Here, as in Embodiment 1, the bottom-end distance D(3) of the third P layer 39-3 is set to a value in the range of 15 to 30 μm (FIGS. 5 and 6). Also, the design tolerance range of the second P layer 39-2 is determined based on a margin of the voltage resistance of the device and an optimized electric field distribution in each withstand voltage mode. Here, as in Embodiment 1, the surface concentration P(2) of the second P layer 39-2 is set to a value that is 10 to 1000 times the impurity concentration of the semiconductor substrate 1 (FIG. 7).

As described above, the semiconductor device according to the present embodiment is configured such that the concentrations of impurities in the P layers 39 increase as the P layers 39 are closer to the active region 11, and that the surface concentration P(2) of the second P layer 39-2 is 10 to 1000 times the impurity concentration of the semiconductor substrate 1, and that the bottom-end distance D(3) of the third P layer 39-3 is in the range of 15 to 30 μm. Accordingly, it is possible to reduce the chip area and to improve the withstand voltage characteristic capability and the interruption capability at turn-off without deteriorating the properties of the IGBT 14.

Variation 1 of Embodiment 2

Figure 21:
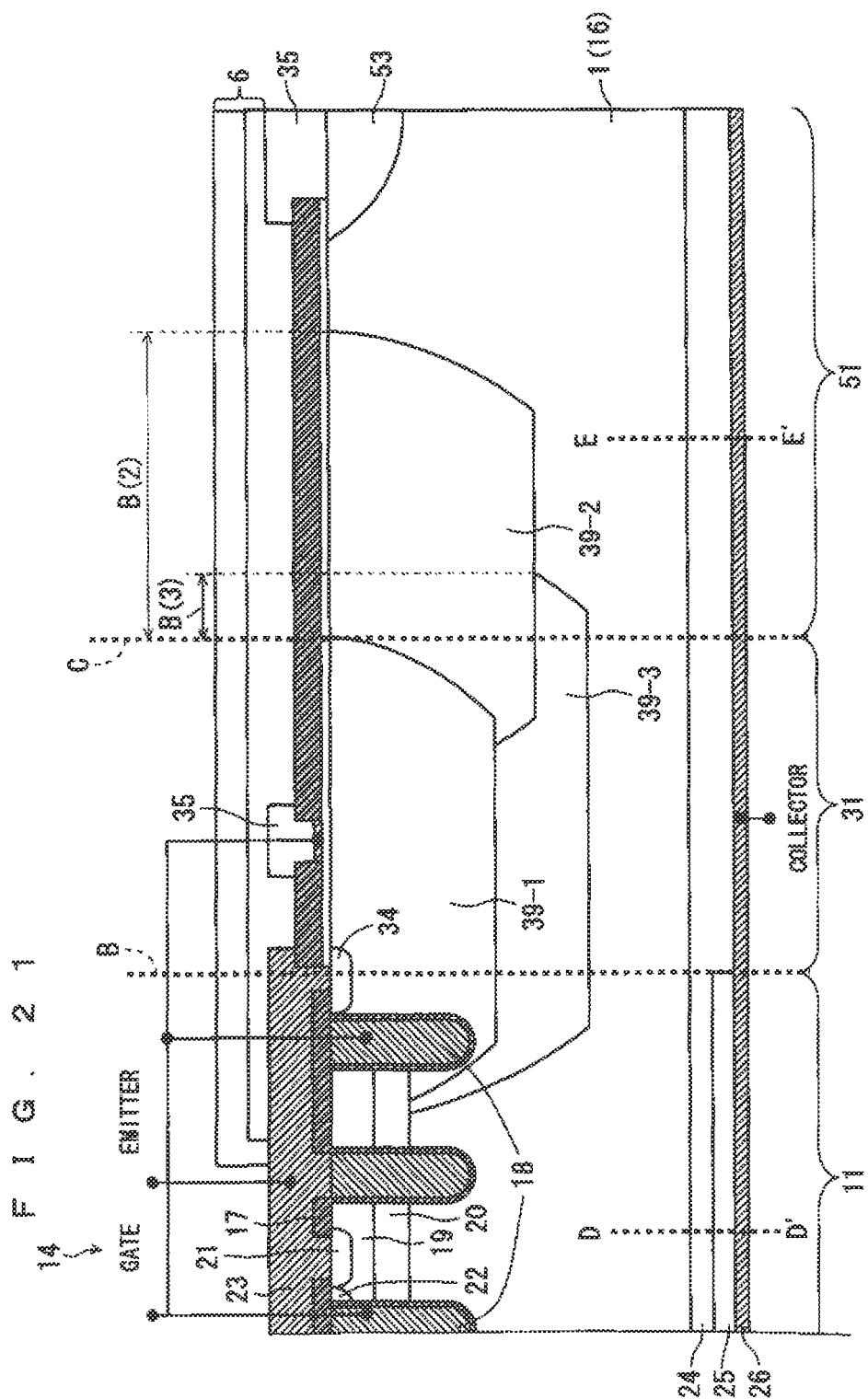
FIG. 21 is a cross-sectional view showing a configuration of a semiconductor device according to Variation 1 of Embodiment 2.

FIG. 21 is a cross-sectional view showing a configuration of a semiconductor device according to Variation 1 of Embodiment 2. Note that the present variation corresponds to Variation 1 of Embodiment 1.

Specifically, the underside P layer 25 is formed on the underside N layer 24 in a predetermined region that includes a region inside the active region 11, excluding a region of the edge termination region 51 on the edge side of the semiconductor substrate 1. The configuration is also such that the edge of the underside P layer 25 is located between the locations A3 and A4 shown in FIGS. 12 and 13. The collector electrode 26 is formed on the underside N layer 24 (directly short-circuited with the underside N layer 24) in a region other than the underside P layer forming region and is formed on the underside P layer 25 in the underside P layer forming region.

The semiconductor device according to the present variation can improve the interruption capability of the IGBT 14 at turn-off and suppress an increase in the ON-state voltage without having an adverse effect on the ON state of the IGBT 14, as in Variation 1 of Embodiment 1. Note that the predetermined region where the underside P layer 25 is formed (i.e., the underside P layer forming region) is not limited to the region shown in FIG. 21, and may be the regions shown in FIGS. 9 to 11. Even in this case, effects similar to those described above can be achieved.

Variation 2 of Embodiment 2

Figure 22:
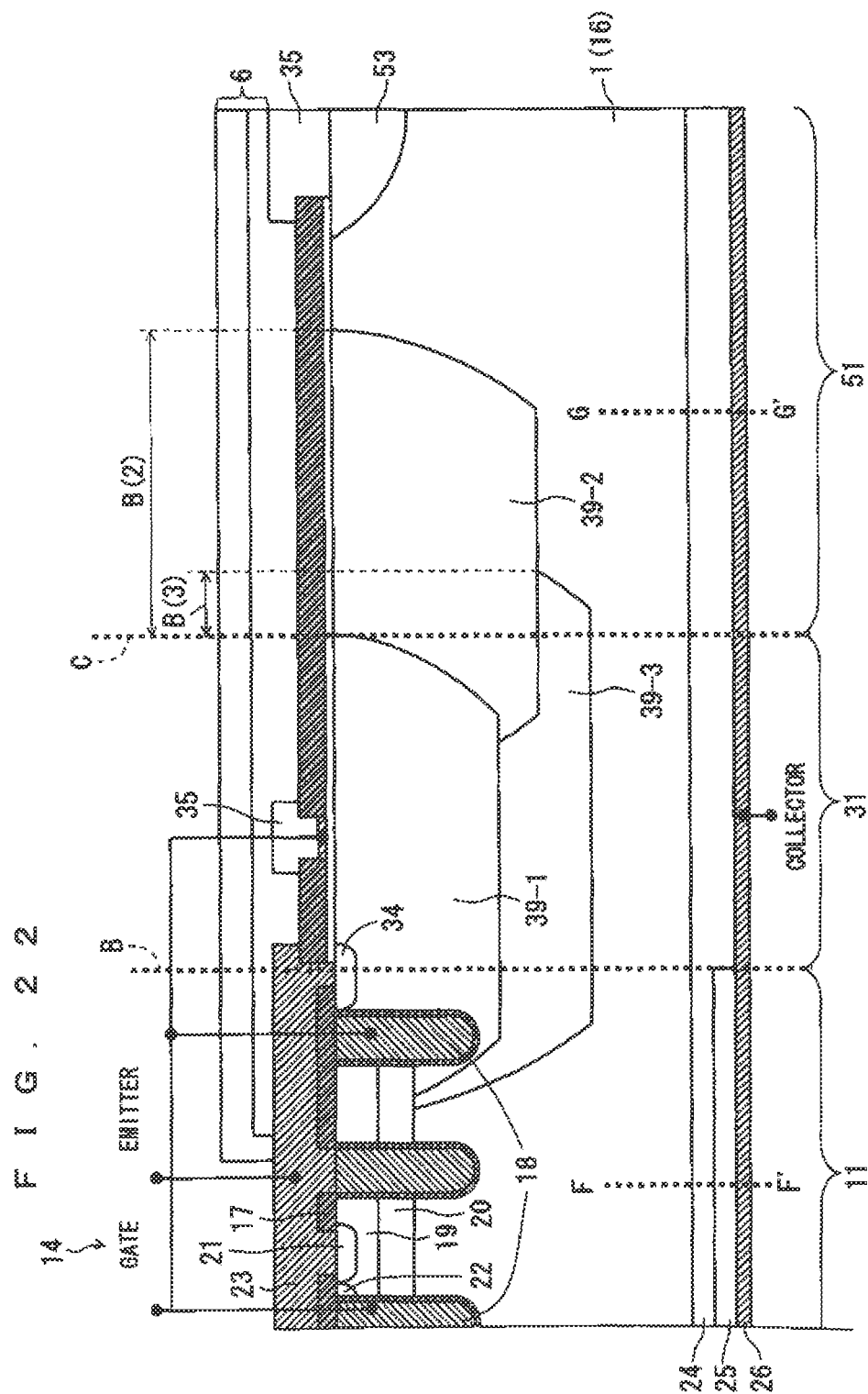
FIG. 22 is a cross-sectional view showing a configuration of a semiconductor device according to Variation 2 of Embodiment 2.

FIG. 22 is a cross-sectional view showing a configuration of a semiconductor device according to Variation 2 of Embodiment 2. Note that the present variation corresponds to Variation 2 of Embodiment 1.

Specifically, in the present variation, the configuration is such that the distance R from the underside of the semiconductor substrate 1 to the peak (first peak) of the impurity concentration of the underside N layer 24 satisfies the inequation described in Variation 2 of Embodiment 1, where ΔR is the distance between the peak and a position that corresponds to a standard deviation of the impurity concentration of the underside N layer 24 in the range from the underside of the semiconductor substrate 1 to the peak, $N_0$ is the impurity concentration of the underside N layer 24 at the underside of the semiconductor substrate 1, and $N_b$ is an impurity concentration at the peak in the underside N layer 24.

In the semiconductor device according to the present variation, since the position of the peak of the impurity concentration of the underside N layer 24 is deep from the underside of the semiconductor substrate 1, the impurity concentration of the underside N layer 24 on the collector electrode 26 side is reduced as in Variation 2 of Embodiment 1. This reduces the influence of the ohmic contact formed by the underside N layer 24 and the collector electrode 26 in the edge termination region 51. As a result, it is possible, as in Variation 2 of Embodiment 1, to improve the reverse voltage resistance of the IGBT 14 and to reduce leakage current in the reverse withstand voltage mode.

Variation 3 of Embodiment 2

Figure 23:
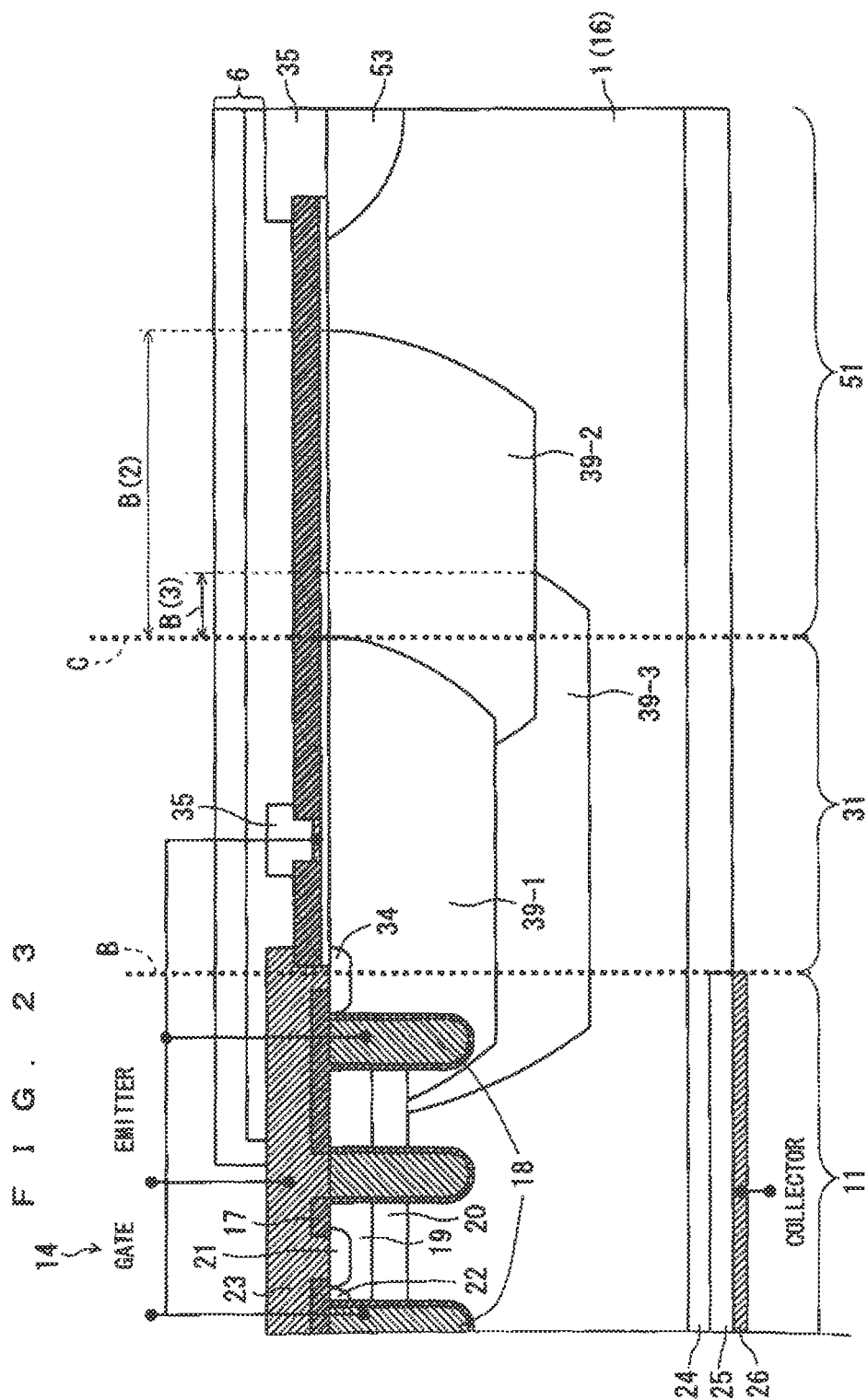
FIG. 23 is a cross-sectional view showing a configuration of a semiconductor device according to Variation 3 of Embodiment 2.

FIG. 23 is a cross-sectional view showing a configuration of a semiconductor device according to Variation 3 of Embodiment 2. Note that the present variation corresponds to Variation 3 of Embodiment 1.

Specifically, in the present variation, the collector electrode 26 is formed on the underside P layer 25 in the underside P layer forming region without being formed on the underside N layer 24. Accordingly, as in Variation 3 of Embodiment 1, no ohmic contact is formed by the underside N layer 24 and the collector electrode 26 in the edge termination region 51. It is thus possible to improve the reverse voltage resistance of the IGBT 14 and to reduce leakage current in the reverse withstand voltage mode.

Variation 4 of Embodiment 2

Figure 24:
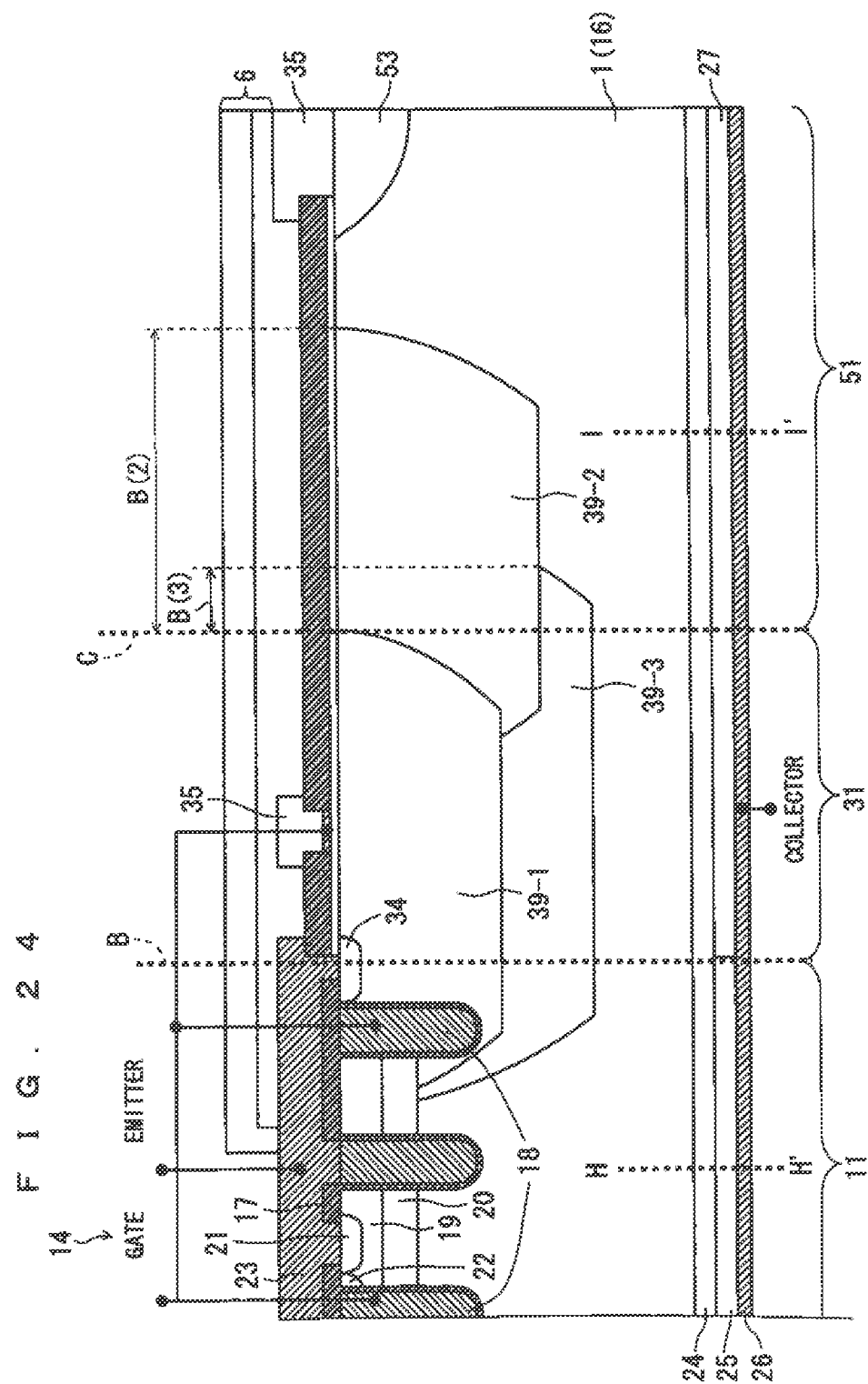
FIG. 24 is a cross-sectional view showing a configuration of a semiconductor device according to Variation 4 of Embodiment 2.

FIG. 24 is a cross-sectional view showing a configuration of a semiconductor device according to Variation 4 of Embodiment 2. Note that the present variation corresponds to Variation 4 of Embodiment 1.

Specifically, in the present variation, the low-concentration P layer 27 having a lower impurity concentration than the underside P layer 25 is formed on the underside N layer 24 in a region other than the underside P layer forming region. Note that a peak of the impurity concentration of the low-concentration P layer 27 is higher than the impurity concentration of the semiconductor substrate 1 and is lower than the peak of the impurity concentration of the underside N layer 25. The collector electrode 26 is formed on the low-concentration P layer 27 in the region other than the underside P layer forming region and is formed on the underside P layer 25 in the underside P layer forming region.

The semiconductor device according to the present variation can improve the reverse voltage resistance of the IGBT 14 and thereby suppress leakage current in the reverse withstand voltage mode as in Variation 4 of Embodiment 1. It can further suppress deterioration in the current interruption capability when the IGBT 14 performs a turn-off operation as in Variation 4 of Embodiment 1.

Embodiment 3

Figure 25:
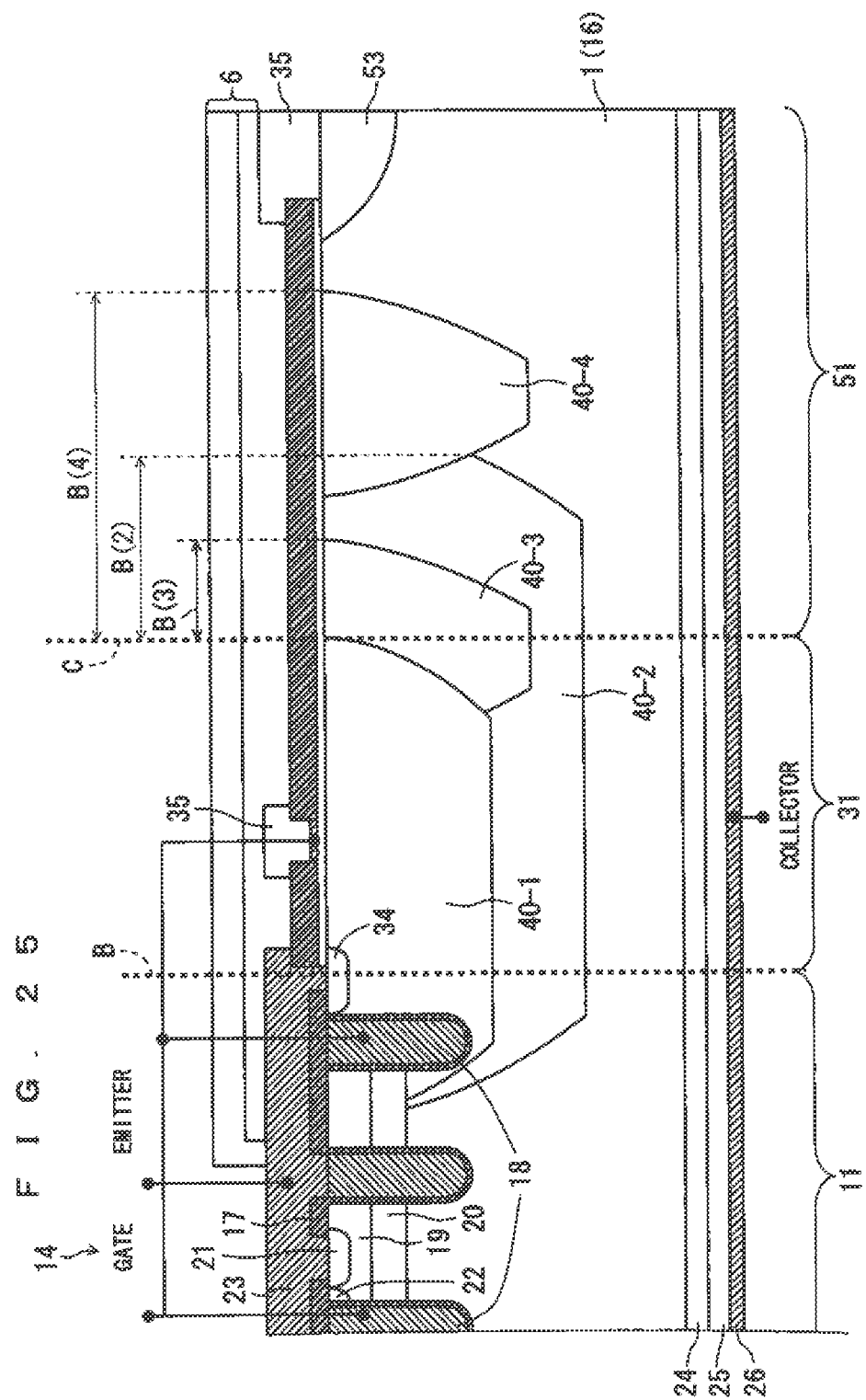
FIG. 25 is a cross-sectional view showing a configuration of a semiconductor device according to Embodiment 3.

FIG. 25 is a cross-sectional view showing a configuration of a semiconductor device according to Embodiment 3 of the present invention. Note that in the semiconductor device according to the present embodiment, constituent elements that are the same as or similar to those described in Embodiment 1 are denoted by the same reference numerals, and the following description focuses on differences from Embodiment 1.

As shown in FIG. 25, the semiconductor device according to the present embodiment includes, instead of the plurality of P layers 38, four P layers 40 (a first P layer 40-1, a second P layer 40-2, a third P layer 40-3, and a fourth P layer 40-4 of the second conductivity type).

The first and second P layers 40-1 and 40-2 are formed at least partly overlapping each other in a region spanning from the edge portion of the active region 11 to the edge termination region 51 in the surface of the semiconductor substrate 1. The third P layer 40-3 is adjacent to an edge portion of the first P layer 40-1 on the edge termination region 51 side, and the fourth P layer 40-4 is adjacent to an edge portion of the second P layer 40-2 on the edge termination region 51 side.

In the present embodiment, these P layers 40 are, as a whole, formed to extend across the edge portion of the active region 11, the primary PN junction region 31, and the edge termination region 51 and function as a P-type field stopper layer (hereinafter, referred to as a "PFS layer") that suppresses the occurrence of a high electric field around the gate electrode 18 located on the outermost side of the active region 11 (at the edge of the active region 11).

The first P layer 40-1 among the four P layers 40 corresponds to the aforementioned P layer 33-1 (primary junction P layer). The boundary B between the active region 11 and the primary PN junction region 31 passes through the edge of the contact hole that connects the emitter electrode 23 and the P+ layer 34 on the edge side of the semiconductor substrate 1, and the boundary C between the primary PN junction region 31 and the edge termination region 51 passes through the edge of first P layer 40-1 on the edge side of the semiconductor substrate 1.

Here, P(1)>P(3)=P(4)>P(2) is satisfied where P(1), P(2), P(3), and P(4) are respectively P-type impurity concentrations (surface concentrations) of the first to fourth P layers 40-1 to 40-4 at the surface of the semiconductor substrate 1.

Also, D(1)<D(3)=D(4)<D(2) is satisfied, where D(1), D(2), D(3), and D(4) are respectively distances (bottom-end distances) from the surface of the semiconductor substrate 1 to the bottom ends of the first to fourth P layers 40-1 to 40-4.

Also, if B(1), B(2), B(3), and B(4) are respectively distances from the edge of the edge termination region 51 on the active region 11 side (i.e., the boundary C) to the edges of the first to fourth P layers 40-1 to 40-4 on the edge side of the semiconductor substrate 1, B(1)<B(3)<B(2)<B(4) are satisfied as shown in FIG. 25 (where B(1)=0).

In the above-described configuration of the present embodiment, the outer second P layer 40-2 that has a voltage among the P layers 40 (PFS layer) has relatively low curvature in cross-section shape. Accordingly, intensive application of high electric fields to local portions can be suppressed.

The concentrations of impurities in the P layers 40 (PFS layer) are designed to satisfy P(1)>P(3)>P(2) and increase stepwise as the distance from the second P layer 40-2 to the cell (active region 11). Thus, the presence of the second and third P layers 40-2 and 40-3 inhibits the depletion layer from extending in the lateral direction and reaching the first P layer 40-1. As a result, a difference in the electrostatic potential between the inside and outside of a high-curvature portion in cross-section shape of the first P layer 40-1 becomes substantially zero. Thus, it is possible to suppress the application of a high electric field to that portion of the first P layer 40-1.

As described above, the semiconductor device according to the present embodiment can suppress intensive application of high electric fields to local portions. In other words, high electric fields are distributed, and this increases the maximum voltage resistance. In addition, a smooth change in the electric field in the plurality of P layers 40 can reduce the edge terminal width Le when the withstand voltage is constant, as in Embodiment 1. Accordingly, the chip area can be reduced.

Note that the design tolerance range of the second P layer 40-2 is determined based on the edge terminal width Le and the voltage resistance that are required for the device. Here, as in Embodiment 1, the bottom-end distance D(2) of the second P layer 40-2 is set to a value in the range of 15 to 30 μm (FIGS. 5 and 6). Also, the design tolerance ranges of the third and fourth P layers 40-3 and 40-4 are determined based on a margin of the voltage resistance of the device and an optimized electric field distribution in each withstand voltage mode. Here, as in Embodiment 1, the surface concentrations P(3) and P(4) of the third and fourth P layers 40-3 and 40-4 are set to values that are 10 to 1000 times the impurity concentration of the semiconductor substrate 1 (FIG. 7).

As described above, the semiconductor device according to the present embodiment is configured such that the concentrations of impurities in the P layers 40 increase as the P layers 40 are closer to the active region 11, and that the surface concentration P(4) of the fourth P layer 40-4 is 10 to 1000 times the impurity concentration of the semiconductor substrate 1, and that the bottom-end distance D(2) of the second P layer 40-2 is in the range of 15 to 30 μm. Accordingly, it is possible to reduce the chip area and to improve the withstand voltage characteristic capability and the interruption capability at turn-off without deteriorating the properties of the IGBT 14.

Variation 1 of Embodiment 3

Figure 26:
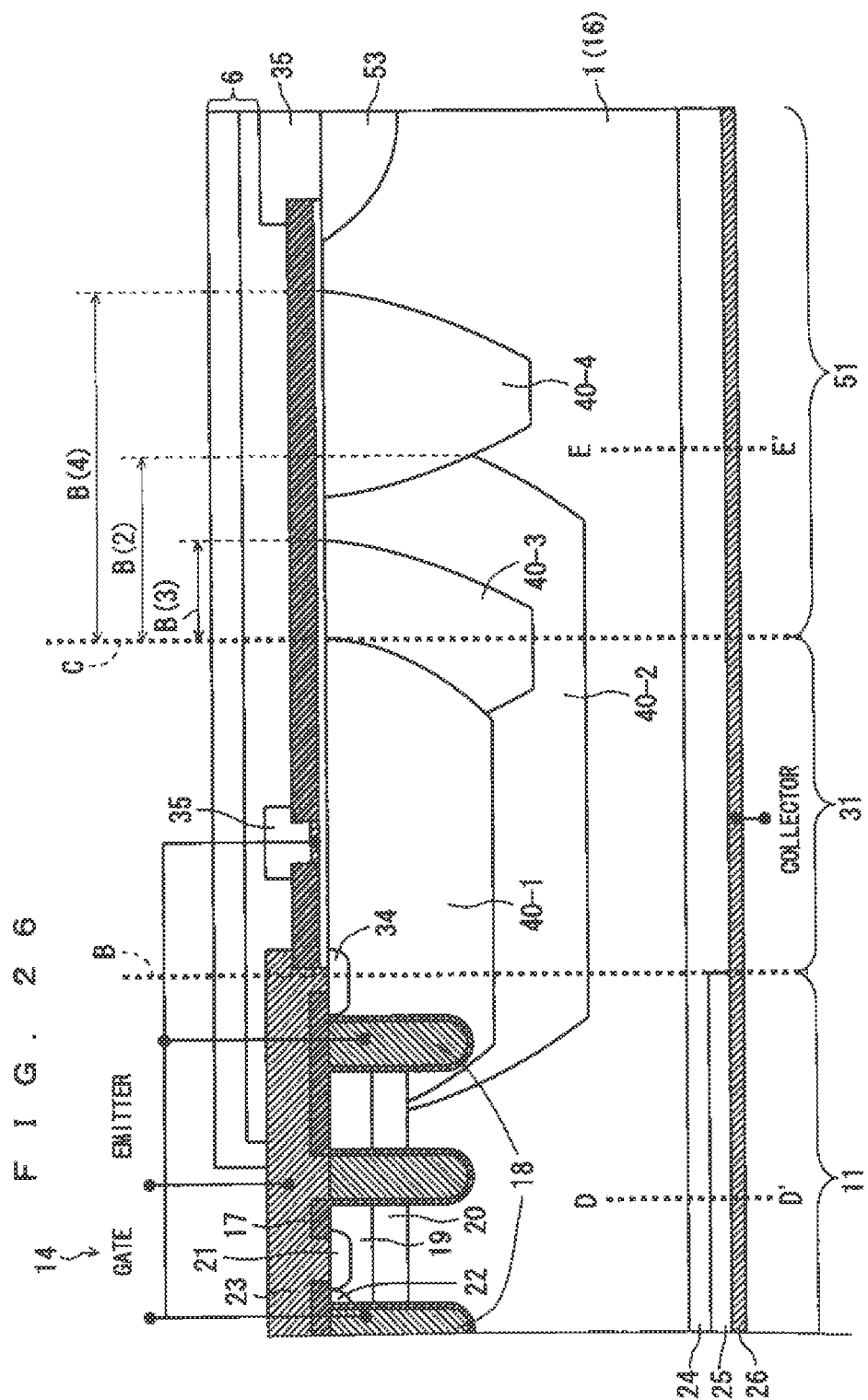
FIG. 26 is a cross-sectional view showing a configuration of a semiconductor device according to Variation 1 of Embodiment 3.

FIG. 26 is a cross-sectional view showing a configuration of a semiconductor device according to Variation 1 of Embodiment 3. Note that the present variation corresponds to Variation 1 of Embodiment 1.

Specifically, the underside P layer 25 is formed on the underside N layer 24 in a predetermined region that includes a region inside the active region 11, excluding a region of the edge termination region 51 on the edge side of the semiconductor substrate 1. The configuration is also such that the edge of the underside P layer 25 is located between the locations A3 and A4 shown in FIGS. 12 and 13. The collector electrode 26 is formed on the underside N layer 24 (directly short-circuited with the underside N layer 24) in a region other than the underside P layer forming region and is formed on the underside P layer 25 in the underside P layer forming region.

The semiconductor device according to the present variation can improve the interruption capability of the IGBT 14 at turn-off and suppress an increase in the ON-state voltage without having an adverse effect on the ON state of the IGBT 14, as in Variation 1 of Embodiment 1. Note that the predetermined region where the underside P layer 25 is formed (i.e., the underside P layer forming region) is not limited to the region shown in FIG. 26, and may be the regions shown in FIGS. 9 to 11. Even in this case, effects similar to those described above can be achieved.

Variation 2 of Embodiment 3

Figure 27:
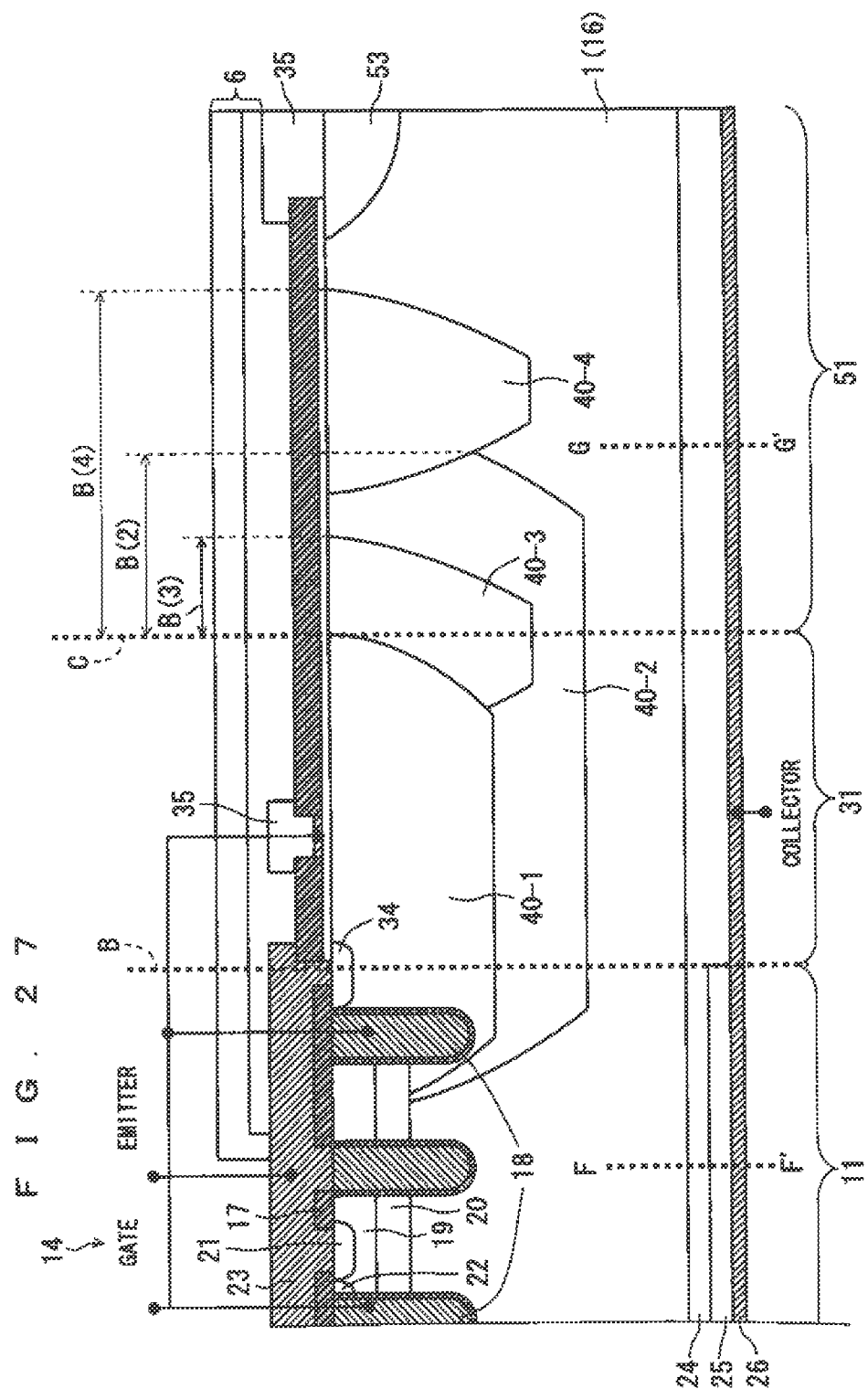
FIG. 27 is a cross-sectional view showing a configuration of a semiconductor device according to Variation 2 of Embodiment 3.

FIG. 27 is a cross-sectional view showing a configuration of a semiconductor device according to Variation 2 of Embodiment 3. Note that the present variation corresponds to Variation 2 of Embodiment 1.

Specifically, in the present variation, the configuration is such that the distance R from the underside of the semiconductor substrate 1 to the peak (first peak) of the impurity concentration of the underside N layer 24 satisfies the inequation described in Variation 2 of Embodiment 1, where ΔR is the distance between the peak and a position that corresponds to a standard deviation of the impurity concentration of the underside N layer 24 in the range from the underside of the semiconductor substrate 1 to the peak, $N_0$ is the impurity concentration of the underside N layer 24 at the underside of the semiconductor substrate 1, and $N_b$ is an impurity concentration at the peak in the underside N layer 24.

In the semiconductor device according to the present variation, since the position of the peak of the impurity concentration of the underside N layer 24 is deep from the underside of the semiconductor substrate 1, the impurity concentration of the underside N layer 24 on the collector electrode 26 side is reduced as in Variation 2 of Embodiment 1. This reduces the influence of the ohmic contact formed by the underside N layer 24 and the collector electrode 26 in the edge termination region 51. As a result, it is possible, as in Variation 2 of Embodiment 1, to improve the reverse voltage resistance of the IGBT 14 and to reduce leakage current in the reverse withstand voltage mode.

Variation 3 of Embodiment 3

Figure 28:
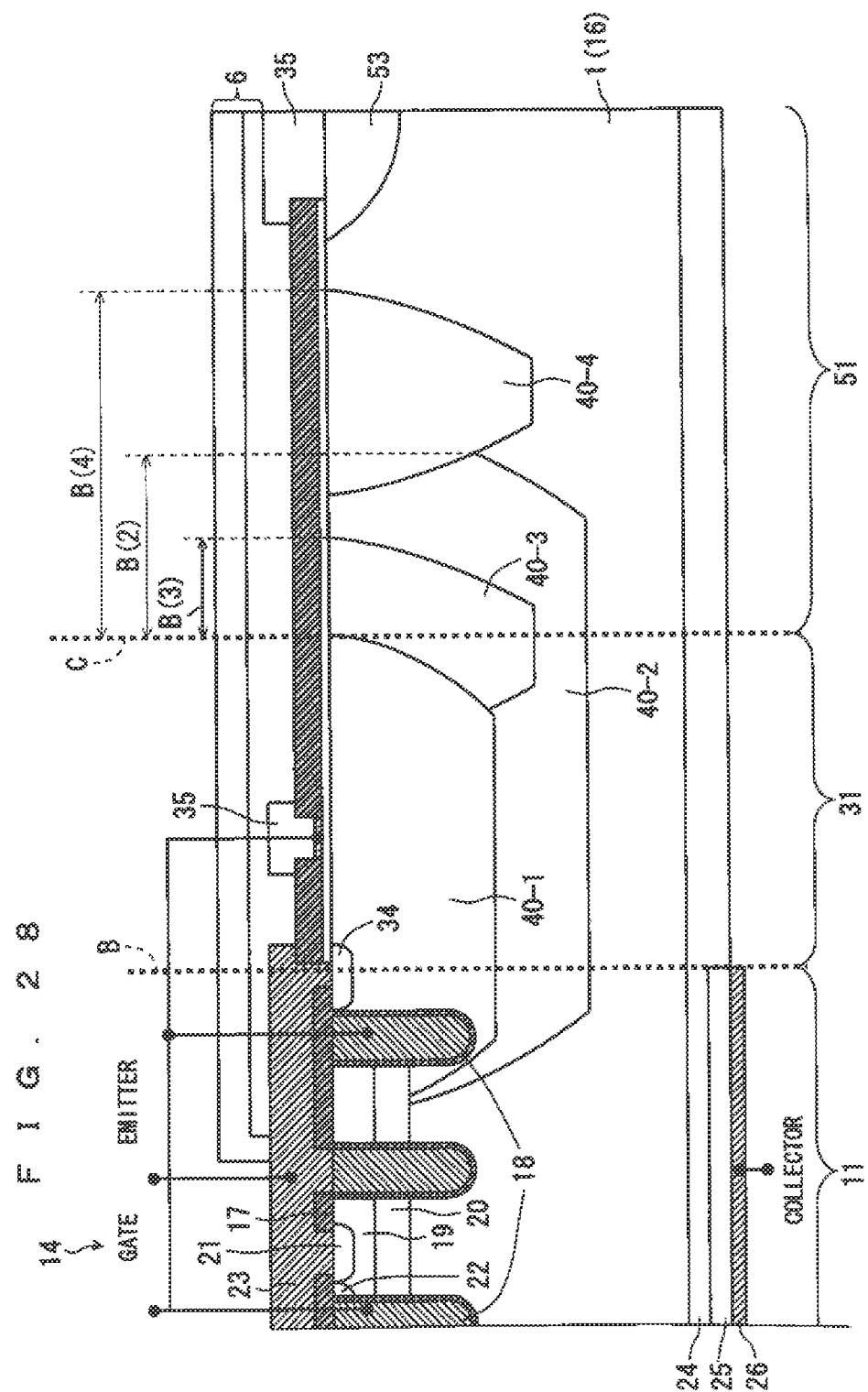
FIG. 28 is a cross-sectional view showing a configuration of a semiconductor device according to Variation 3 of Embodiment 3.

FIG. 28 is a cross-sectional view showing a configuration of a semiconductor device according to Variation 3 of Embodiment 3. Note that the present variation corresponds to Variation 3 of Embodiment 1.

Specifically, in the present variation, the collector electrode 26 is formed on the underside P layer 25 in the underside P layer forming region without being formed on the underside N layer 24. Accordingly, as in Variation 3 of Embodiment 1, no ohmic contact is formed by the underside N layer 24 and the collector electrode 26 in the edge termination region 51. It is thus possible to improve the reverse voltage resistance of the IGBT 14 and to reduce leakage current in the reverse withstand voltage mode.

Variation 4 of Embodiment 3

Figure 29:
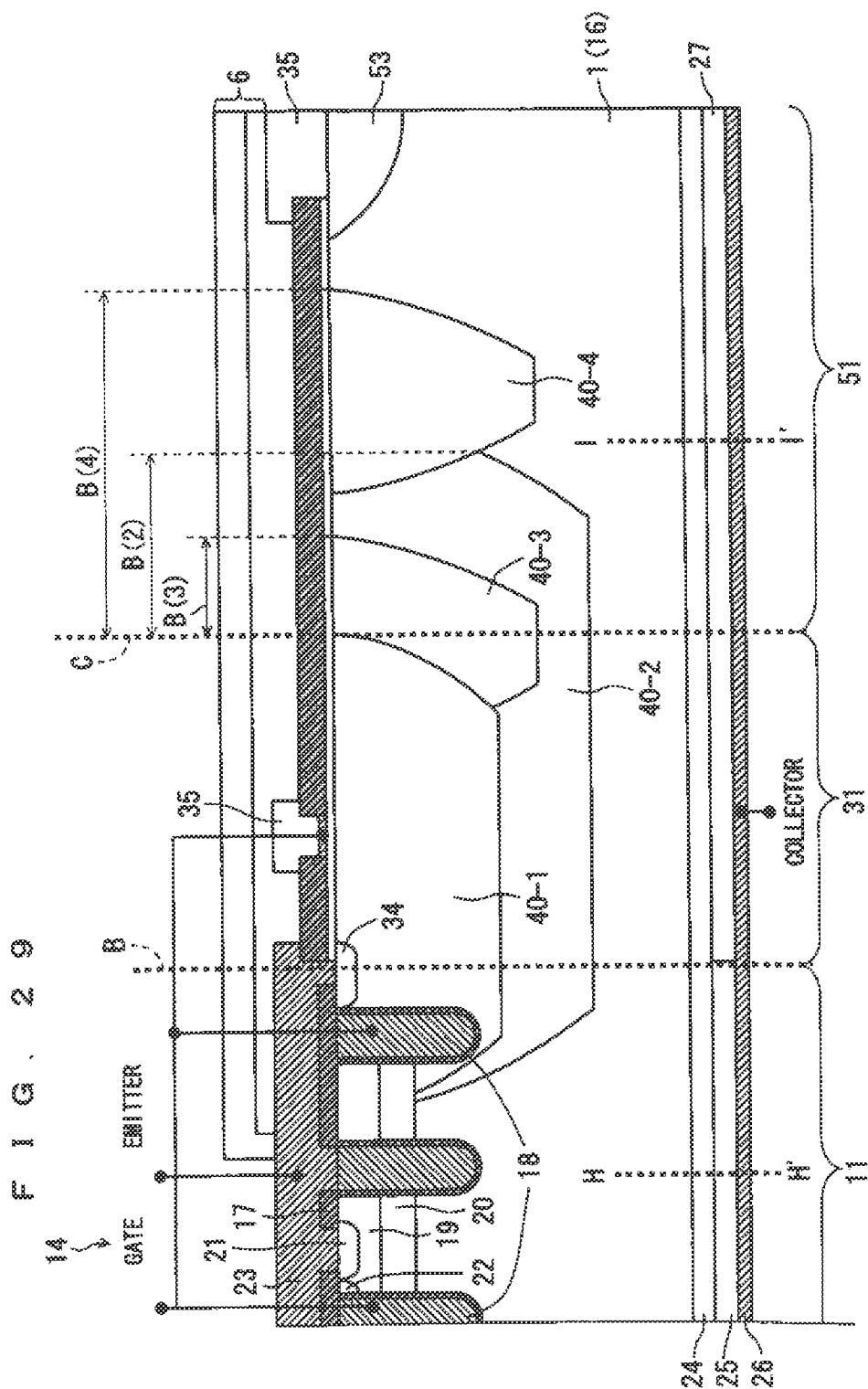
FIG. 29 is a cross-sectional view showing a configuration of a semiconductor device according to Variation 4 of Embodiment 3.

FIG. 29 is a cross-sectional view showing a configuration of a semiconductor device according to Variation 4 of Embodiment 3. Note that the present variation corresponds to Variation 4 of Embodiment 1.

Specifically, in the present variation, the low-concentration P layer 27 having a lower impurity concentration than the underside P layer 25 is formed on the underside N layer 24 in a region other than the underside P layer forming region. Note that a peak of the impurity concentration of the low-concentration P layer 27 is higher than the impurity concentration of the semiconductor substrate 1 and is lower than the peak of the impurity concentration of the underside N layer 25. The collector electrode 26 is formed on the low-concentration P layer 27 in the region other than the underside P layer forming region and is formed on the underside P layer 25 in the underside P layer forming region.

The semiconductor device according to the present variation can improve the reverse voltage resistance of the IGBT 14 and thereby suppress leakage current in the reverse withstand voltage mode as in Variation 4 of Embodiment 1. It can further suppress deterioration in the current interruption capability when the IGBT 14 performs a turn-off operation as in Variation 4 of Embodiment 1.

Embodiment 4

Figure 30:
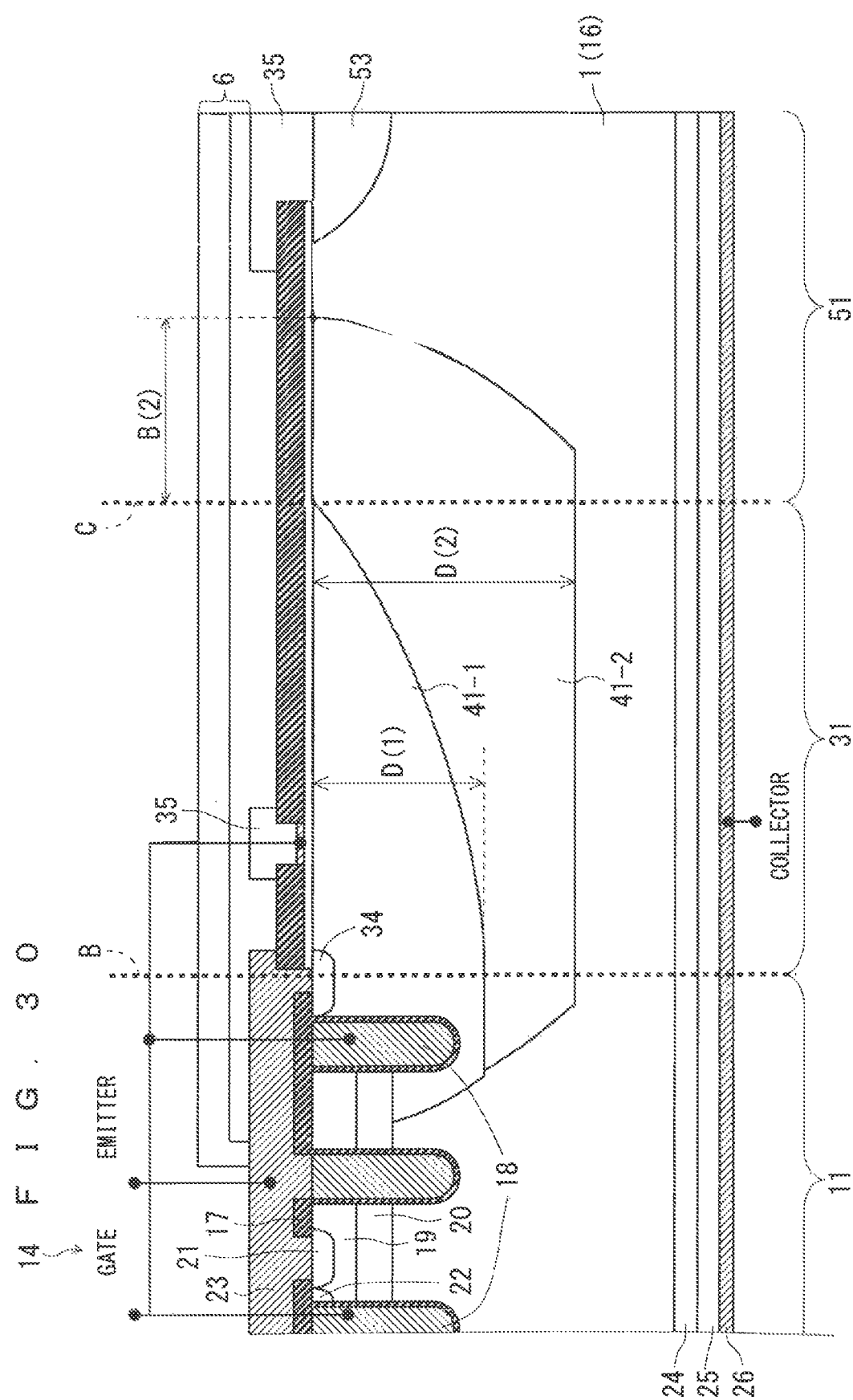
FIG. 30 is a cross-sectional view showing a configuration of a semiconductor device according to Embodiment 4.

FIG. 30 is a cross-sectional view showing a configuration of a semiconductor device according to Embodiment 4 of the present invention. Note that in the semiconductor device according to the present embodiment, constituent elements that are the same as or similar to those described in Embodiment 1 are denoted by the same reference numerals, and the following description focuses on differences from Embodiment 1.

As shown in FIG. 30, the semiconductor device according to the present embodiment includes, instead of the plurality of P layers 38, two P layers 41 (a first P layer 41-1 and a second P layer 41-2 of the second conductivity type).

The first and second P layers 41-1 and 41-2 are formed at least partly overlapping each other in a region spanning from the edge portion of the active region 11 to the edge termination region 51 in the surface of the semiconductor substrate 1. The P-type impurity concentration of the first P layer 41-1 in the active region 11 is higher than in the edge termination region 51. Here, the configuration is such that the impurity concentration of the first P layer 41-1 increases continuously in a direction from the edge termination region 51 toward the active region 11. In order to form this first P layer 41-1, for example, the following steps are performed: a first step of forming a plurality of impurity concentration regions whose impurity concentrations increase stepwise in the direction from the edge termination region 51 toward the active region 11; and a second step of thermally diffusing these impurity concentration regions so as to reduce a difference in the impurity concentration among them.

In the present embodiment, these P layers 41 are, as a whole, formed to extend across the edge portion of the active region 11, the primary PN junction region 31, and the edge termination region 51 and function as a P-type field stopper layer (hereinafter, referred to as a "PFS layer") that suppresses the occurrence of a high electric field around the gate electrode 18 located on the outermost side of the active region 11 (at the edge of the active region 11).

The first P layer 41-1 out of the two P layers 41 corresponds to the aforementioned P layer 33-1 (primary junction P layer). The boundary B between the active region 11 and the primary PN junction region 31 passes through the edge of the contact hole that connects the emitter electrode 23 and the P+ layer 34 on the edge side of the semiconductor substrate 1, and the boundary C between the primary PN junction region 31 and the edge termination region 51 passes through the edge of the first P layer 41-1 on the edge side of the semiconductor substrate 1.

Here, Pmin(1)>P(2) is satisfied, where P(2) is the P-type impurity concentration (surface concentration) of the second P layer 41-2 at the surface of the semiconductor substrate 1, and Pmin(1) is the minimum surface concentration of the first Player 41-1.

Also, D(1)<D(2) is satisfied, where D(1) and D(2) are respectively distances (bottom-end distances) from the surface of the semiconductor substrate 1 to the bottom ends of the first and second P layers 41-1 and 41-2 (in the present example, D(1) is a distance to the lowermost end of the first P layer).

Also, if B(1) and B(2) are respectively distances from the edge of the edge termination region 51 on the active region 11 side (i.e., the boundary C) to the edges of the first and second P layers 41-1 and 41-2 on the edge side of the semiconductor substrate 1, B(1)<B(2) is satisfied as shown in FIG. 30 (where B(1)=0).

In the above-described configuration of the present embodiment, the outer second P layer 41-2 that has a voltage among the P layers 41 (PFS layer) has relatively low curvature in cross-section shape. Accordingly, intensive application of high electric fields to local portions can be suppressed.

The concentrations of impurities in the P layers 41 (PFS layer) are designed to satisfy Pmin(1)>P(2) and increase stepwise and continuously as the P layers 41 are closer to the cell (active region 11). Thus, the presence of the second P layer 41-2 inhibits the depletion layer from extending in the lateral direction and reaching the first P layer 41-1. As a result, a difference in the electrostatic potential between the inside and outside of a high-curvature portion in cross-section shape of the first P layer 41-1 becomes substantially zero. Thus, it is possible to suppress the application of a high electric field to that portion of the first P layer 41-1.

As described above, the semiconductor device according to the present embodiment can suppress intensive application of high electric fields to local portions. In other words, high electric fields are distributed, and this increases the maximum voltage resistance. In addition, a smooth change in the electric field in the plurality of P layers 41 can reduce the edge terminal width Le when the withstand voltage is constant, as in Embodiment 1. Accordingly, the chip area can be reduced.

Note that the design tolerance range of the second P layer 41-2 is determined based on the edge terminal width Le and the voltage resistance that are required for the device. Here, as in Embodiment 1, the bottom-end distance D(2) of the second P layer 41-2 is set to a value in the range of 15 to 30 μm (FIGS. 5 and 6), and the surface concentration P(2) of the second P layer 41-2 is set to a value that is 10 to 1000 times the impurity concentration of the semiconductor substrate 1 (FIG. 7). Also, the design tolerance range of the first P layer 41-1 is determined based on a margin of the voltage resistance of the device and an optimized electric field distribution in each withstand voltage mode.

As described above, the semiconductor device according to the present embodiment is configured such that the concentrations of impurities in the P layers 41 increase as the P layers 41 are closer to the active region 11, and that the surface concentration P(2) of the second P layer 41-2 is 10 to 1000 times the impurity concentration of the semiconductor substrate 1, and that the bottom-end distance D(2) of the second P layer 41-2 is in the range of 15 to 30 μm. Accordingly, it is possible to reduce the chip area and to improve the withstand voltage characteristic capability and the interruption capability at turn-off without deteriorating the properties of the IGBT 14.

Variation 1 of Embodiment 4

Figure 31:
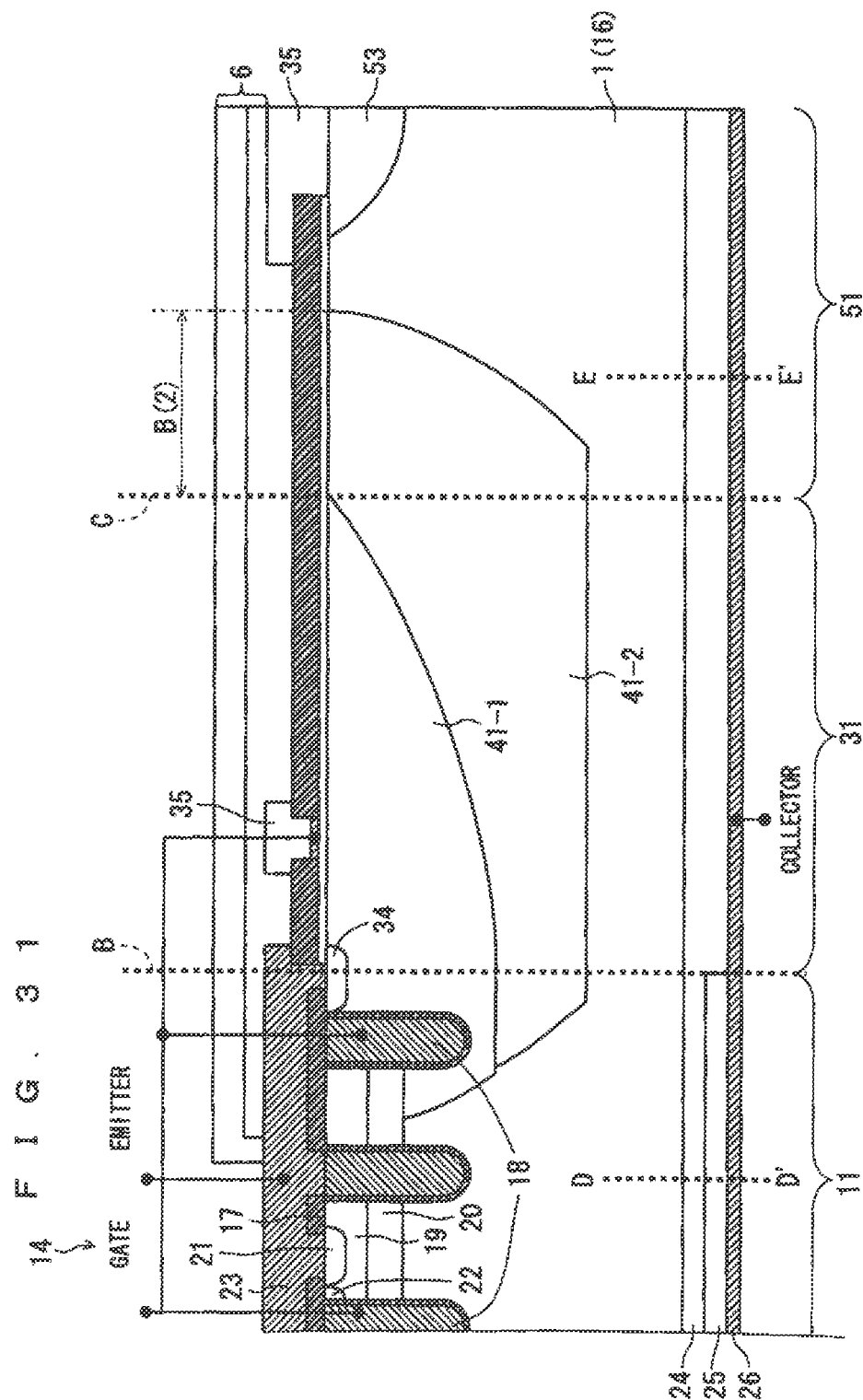
FIG. 31 is a cross-sectional view showing a configuration of a semiconductor device according to Variation 1 of Embodiment 4.

FIG. 31 is a cross-sectional view showing a configuration of a semiconductor device according to Variation 1 of Embodiment 4. Note that the present variation corresponds to Variation 1 of Embodiment 1.

Specifically, the underside P layer 25 is formed on the underside N layer 24 in a predetermined region that includes a region inside the active region 11, excluding a region of the edge termination region 51 on the edge side of the semiconductor substrate 1. The configuration is also such that the edge of the underside P layer 25 is located between the locations A3 and A4 shown in FIGS. 12 and 13. The collector electrode 26 is formed on the underside N layer 24 (directly short-circuited with the underside N layer 24) in a region other than the underside P layer forming region and is formed on the underside P layer 25 in the underside P layer forming region.

The semiconductor device according to the present variation can improve the interruption capability of the IGBT 14 at turn-off and suppress an increase in the ON-state voltage without having an adverse effect on the ON state of the IGBT 14, as in Variation 1 of Embodiment 1. Note that the predetermined region where the underside P layer 25 is formed (i.e., the underside P layer forming region) is not limited to the region shown in FIG. 31, and may be the regions shown in FIGS. 9 to 11. Even in this case, effects similar to those described above can be achieved.

Variation 2 of Embodiment 4

Figure 32:
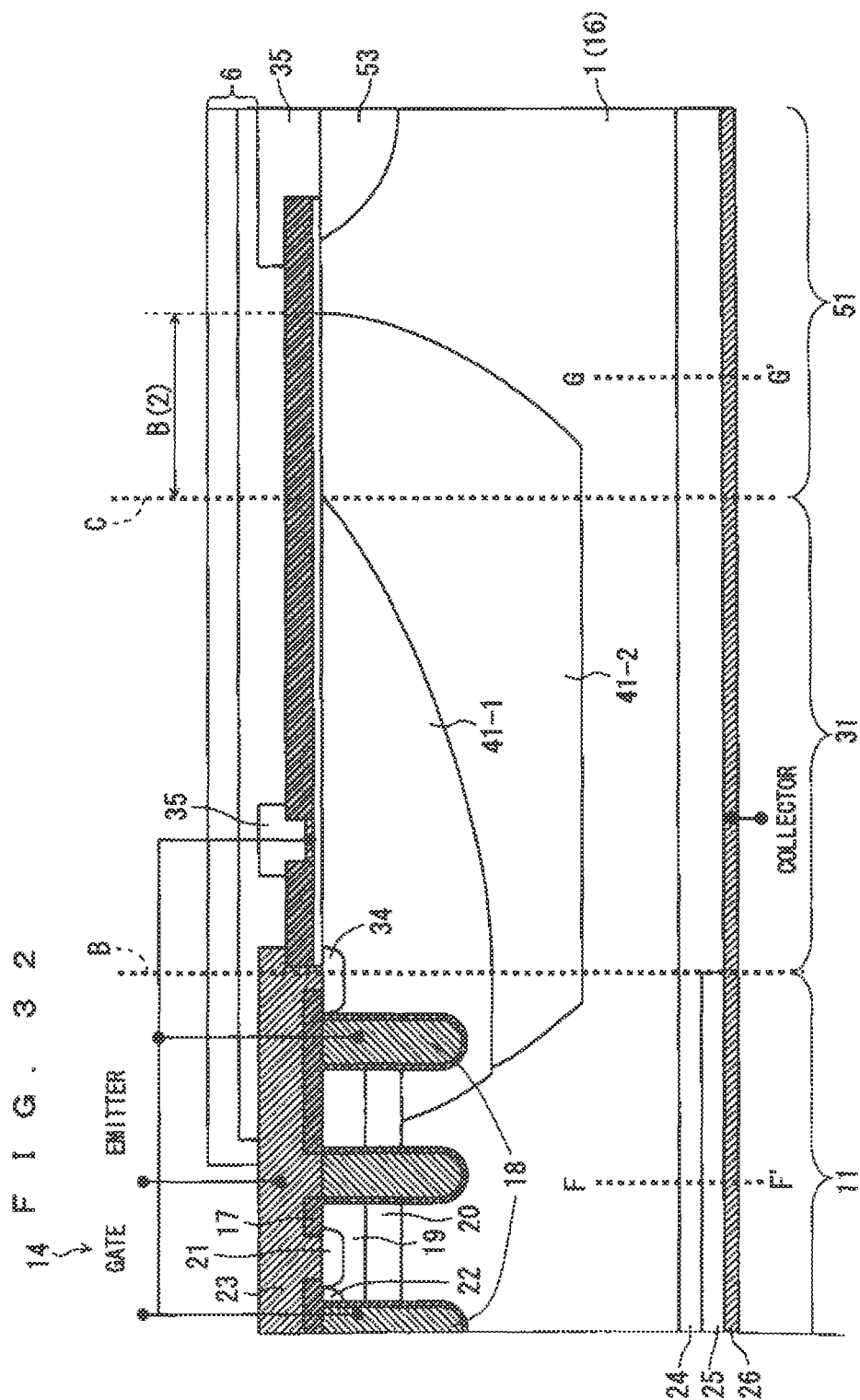
FIG. 32 is a cross-sectional view showing a configuration of a semiconductor device according to Variation 2 of Embodiment 4.

FIG. 32 is a cross-sectional view showing a configuration of a semiconductor device according to Variation 2 of Embodiment 4. Note that the present variation corresponds to Variation 2 of Embodiment 1.

Specifically, in the present variation, the configuration is such that the distance R from the underside of the semiconductor substrate 1 to the peak (first peak) of the impurity concentration of the underside N layer 24 satisfies the inequation described in Variation 2 of Embodiment 1, where ΔR is the distance between the peak and a position that corresponds to a standard deviation of the impurity concentration of the underside N layer 24 in the range from the underside of the semiconductor substrate 1 to the peak, $N_0$ is the impurity concentration of the underside N layer 24 at the underside of the semiconductor substrate 1, and $N_b$ is an impurity concentration at the peak in the underside N layer 24.

In the semiconductor device according to the present variation, since the position of the peak of the impurity concentration of the underside N layer 24 is deep from the underside of the semiconductor substrate 1, the impurity concentration of the underside N layer 24 on the collector electrode 26 side is reduced as in Variation 2 of Embodiment 1. This reduces the influence of the ohmic contact formed by the underside N layer 24 and the collector electrode 26 in the edge termination region 51. As a result, it is possible, as in Variation 2 of Embodiment 1, to improve the reverse voltage resistance of the IGBT 14 and to reduce leakage current in the reverse withstand voltage mode.

Variation 3 of Embodiment 4

Figure 33:
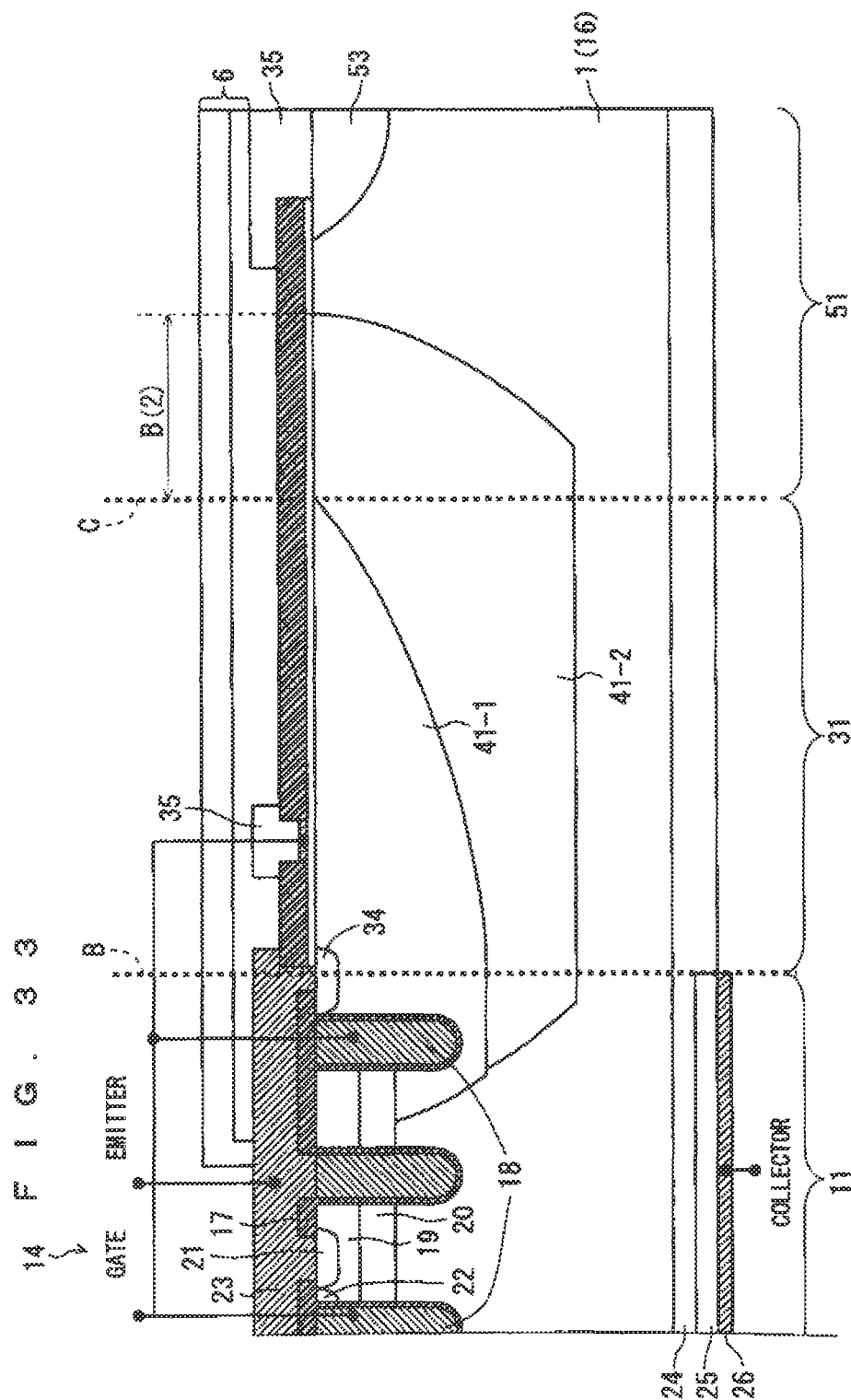
FIG. 33 is a cross-sectional view showing a configuration of a semiconductor device according to Variation 3 of Embodiment 4.

FIG. 33 is a cross-sectional view showing a configuration of a semiconductor device according to Variation 3 of Embodiment 4. Note that the present variation corresponds to Variation 3 of Embodiment 1.

Specifically, in the present variation, the collector electrode 26 is formed on the underside P layer 25 in the underside P layer forming region without being formed on the underside N layer 24. Accordingly, as in Variation 3 of Embodiment 1, no ohmic contact is formed by the underside N layer 24 and the collector electrode 26 in the edge termination region 51. It is thus possible to improve the reverse voltage resistance of the IGBT 14 and to reduce leakage current in the reverse withstand voltage mode.

Variation 4 of Embodiment 4

Figure 34:
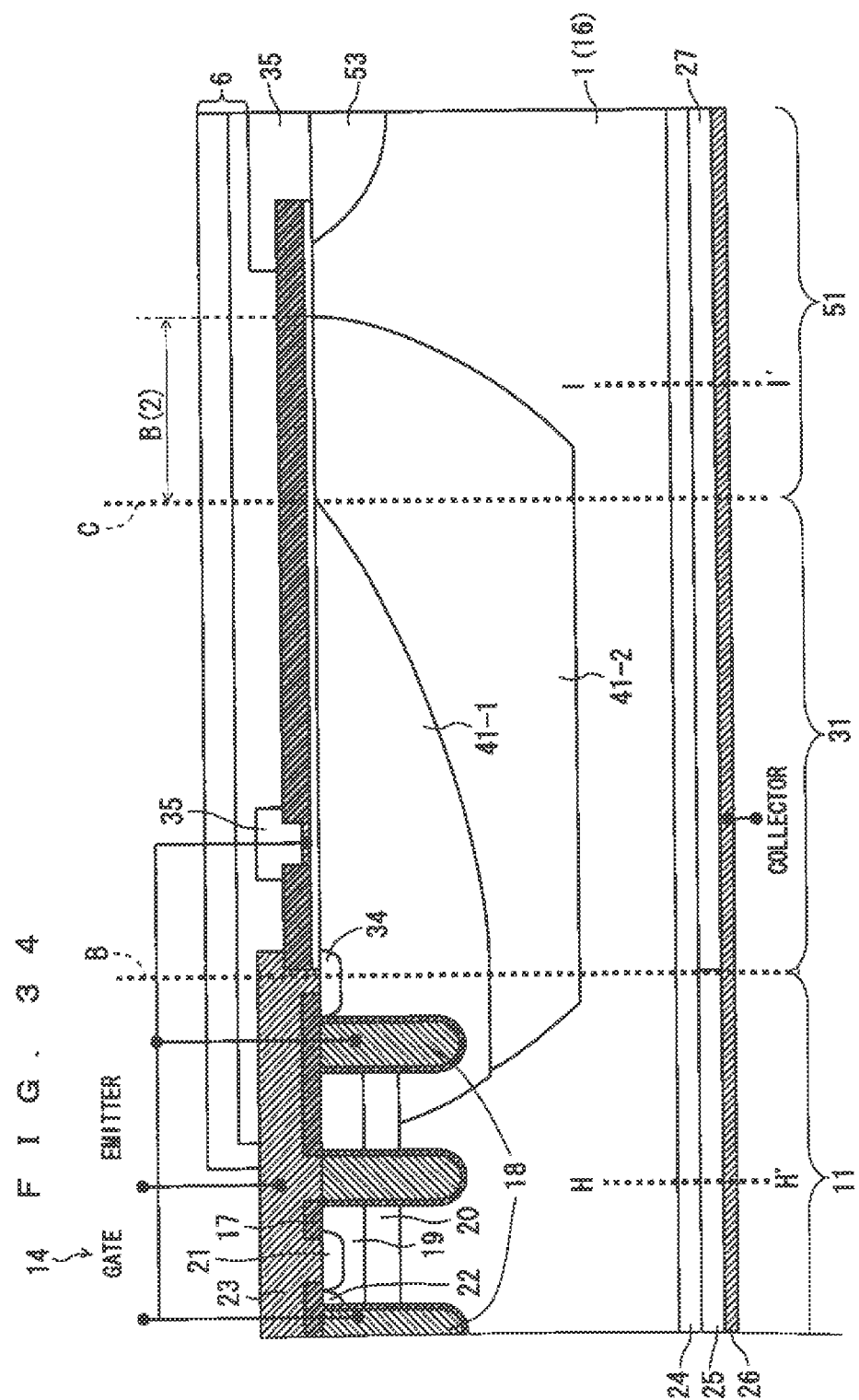
FIG. 34 is a cross-sectional view showing a configuration of a semiconductor device according to Variation 4 of Embodiment 4.

FIG. 34 is a cross-sectional view showing a configuration of a semiconductor device according to Variation 4 of Embodiment 4. Note that the present variation corresponds to Variation 4 of Embodiment 1.

Specifically, in the present variation, the low-concentration P layer 27 having a lower impurity concentration than the underside P layer 25 is formed on the underside N layer 24 in a region other than the underside P layer forming region. Note that a peak of the impurity concentration of the low-concentration P layer 27 is higher than the impurity concentration of the semiconductor substrate 1 and is lower than the peak of the impurity concentration of the underside N layer 25. The collector electrode 26 is formed on the low-concentration P layer 27 in the region other than the underside P layer forming region and is formed on the underside P layer 25 in the underside P layer forming region.

The semiconductor device according to the present variation can improve the reverse voltage resistance of the IGBT 14 and thereby suppress leakage current in the reverse withstand voltage mode as in Variation 4 of Embodiment 1. It can further suppress deterioration in the current interruption capability when the IGBT 14 performs a turn-off operation as in Variation 4 of Embodiment 1.

Embodiment 5

Figure 35:
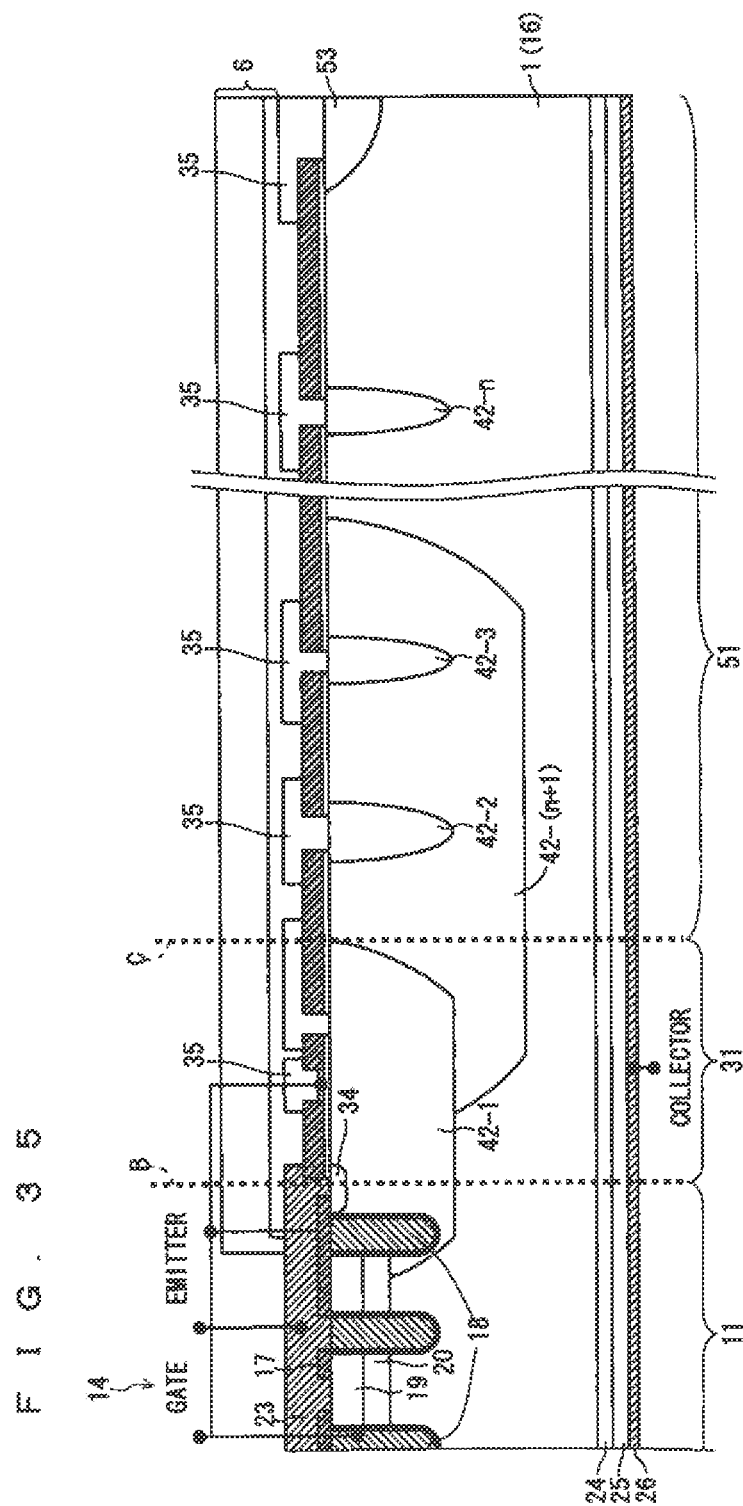
FIG. 35 is a cross-sectional view showing a configuration of a semiconductor device according to Embodiment 5.

FIG. 35 is a cross-sectional view showing a configuration of a semiconductor device according to Embodiment 5 of the present invention. Note that in the semiconductor device according to the present embodiment, constituent elements that are the same as or similar to those described in Embodiment 1 are denoted by the same reference numerals, and the following description focuses on differences from Embodiment 1.

As shown in FIG. 35, the semiconductor device according to the present embodiment includes, instead of the plurality of P layers 38, (n+1) P layers 42 (a first P layer 42-1, a second P layer 42-2, . . . , and an (n+1)th P layer 42-(n+1) of the second conductivity type).

The first to nth P layers 42-1 to 42-n, n being an integer greater than 1, among these P layers 42 are arranged in a region spanning from the edge portion of the active region 11 to the edge termination region 51 in the surface of the semiconductor substrate 1 in a direction from the active region 11 toward the edge termination region 51. Note that the first to nth P layers 42-1 to 42-n have the same surface concentration, which is a P-type impurity concentration at the surface of the semiconductor substrate 1, and have the same bottom-end distance, which is a distance from the surface of the semiconductor substrate 1 to bottom ends of the first to nth P layers 42-1 to 42-n.

The remaining single (n+1)th P layer 42-(n+1) is adjacent to at least a lower portion of the first P layer 42-1 among the first to nth P layers 42-1 to 42-n.

In the present embodiment, these P layers 42 are, as a whole, formed to extend across the edge portion of the active region 11, the primary PN junction region 31, and the edge termination region 51 and function as a P-type field stopper layer (hereinafter, referred to as a "PFS layer") that suppresses the occurrence of a high electric field around the gate electrode 18 located on the outermost side of the active region 11 (at the edge of the active region 11).

The first P layer 42-1 among the (n+1) P layers 42 corresponds to the aforementioned P layer 33-1 (primary junction P layer). The boundary B between the active region 11 and the primary PN junction region 31 passes through the edge of the contact hole that connects the emitter electrode 23 and the P+ layer 34 on the edge side of the semiconductor substrate 1, and the boundary C between the primary PN junction region 31 and the edge termination region 51 passes through the edge of the first P layer 42-1 on the edge side of the semiconductor substrate 1.

Here, P(1)>P(n+1) is satisfied, where P(1) and P(n+1) are respectively surface concentrations of the first P layer 42-1 and the (n+1)th P layer 42-(n+1). Also, D(1)<D(n+1) is satisfied, where D(1) and D(n+1) are respectively bottom-end distances of the first P layer 42-1 and the (n+1)th P layer 42-(n+1).

In the above-described configuration of the present embodiment, the outer (n+1)th P layer 42-(n+1) that has a voltage among the P layers 42 (PFS layer) has relatively low curvature in cross-section shape. Accordingly, intensive application of high electric fields to local portions can be suppressed.

The concentrations of impurities in the P layers 42 (PFS layer) are designed to satisfy P(1)>P(n+1) and increase stepwise as the P layers 42 are closer to the cell (active region 11). Thus, the presence of the (n+1)th P layer 42-(n+1) inhibits the depletion layer from extending in the lateral direction and reaching the first P layer 42-1. As a result, a difference in the electrostatic potential between the inside and outside of a high-curvature portion in cross-section shape of the first P layer 42-1 becomes substantially zero. Thus, it is possible to suppress the application of a high electric field to that portion of the (n+1)th P layer 42-(n+1).

As described above, the semiconductor device according to the present embodiment can suppress intensive application of high electric fields to local portions. In other words, high electric fields are distributed, and this increases the maximum voltage resistance. In addition, a smooth change in the electric field in the plurality of P layers 42 can reduce the edge terminal width Le when the withstand voltage is constant, as in Embodiment 1. Accordingly, the chip area can be reduced.

Note that the design tolerance range of the (n+1)th P layer 42-(n+1) is determined based on the edge terminal width Le and the voltage resistance that are required for the device. Here, as in Embodiment 1, the bottom-end distance D(n+1) of the (n+1)th P layer 42-(n+1) is set to a value in the range of 15 to 30 μm (FIGS. 5 and 6), and the surface concentration P(n+1) of the (n+1)th P layer 42-(n+1) is set to a value that is 10 to 1000 times the impurity concentration of the semiconductor substrate 1 (FIG. 7). The number, widths, and intervals of the first to nth P layers 42-1 to 42-n are determined based on a margin of the voltage resistance of the device and an optimized electric field distribution in each withstand voltage mode.

As described above, the semiconductor device according to the present embodiment is configured such that the concentrations of impurities in the P layers 42 increase as the P layers 42 are closer to the active region 11, and that the surface concentration P(n+1) of the (n+1)th P layer 42-(n+1) is 10 to 1000 times the impurity concentration of the semiconductor substrate 1, and that the bottom-end distance D(n+1) of the (n+1)th P layer 42-(n+1) is in the range of 15 to 30 μm. Accordingly, it is possible to reduce the chip area and to improve the withstand voltage characteristic capability and the interruption capability at turn-off without deteriorating the properties of the IGBT 14.

Variation 1 of Embodiment 5

Figure 36:
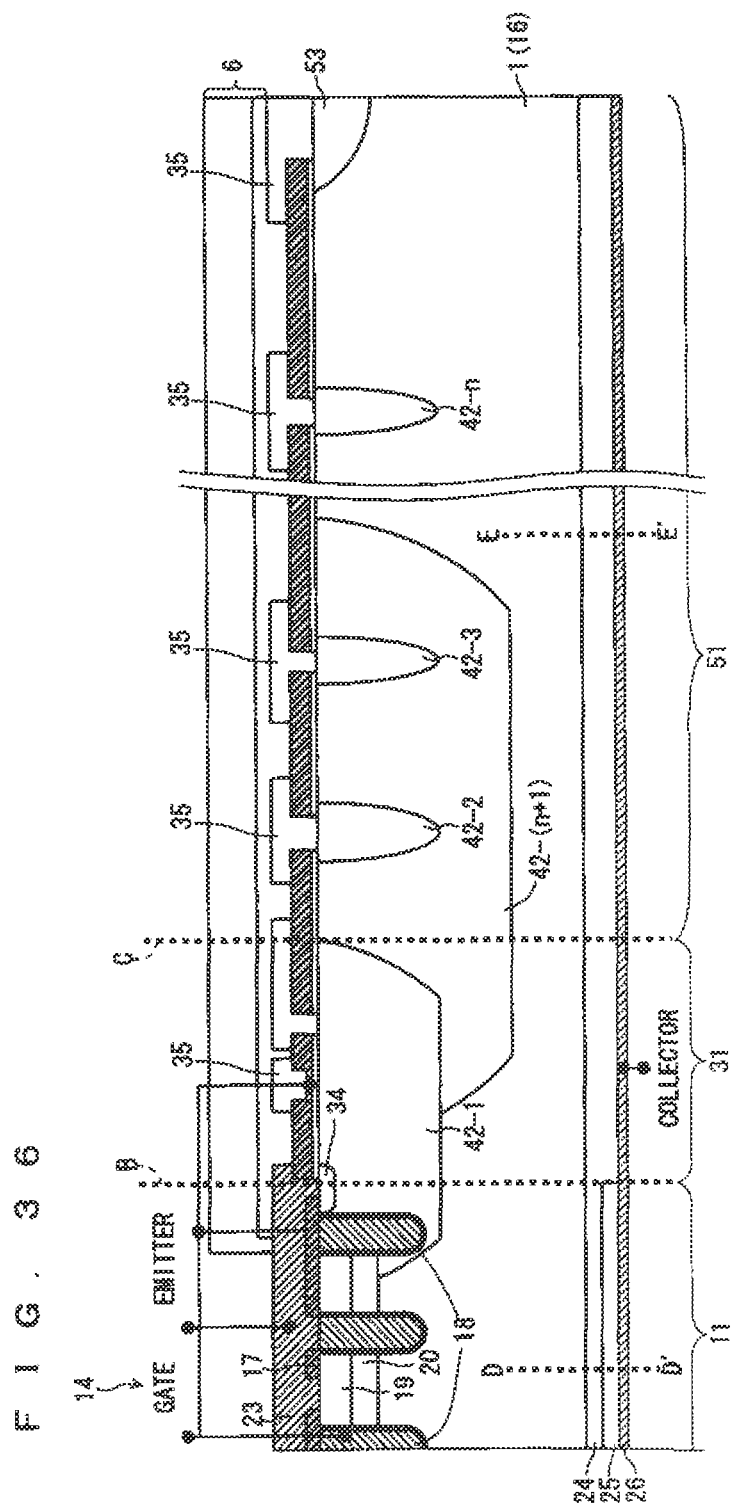
FIG. 36 is a cross-sectional view showing a configuration of a semiconductor device according to Variation 1 of Embodiment 5.

FIG. 36 is a cross-sectional view showing a configuration of a semiconductor device according to Variation 1 of Embodiment 5. Note that the present variation corresponds to Variation 1 of Embodiment 1.

Specifically, the underside P layer 25 is formed on the underside N layer 24 in a predetermined region that includes a region inside the active region 11, excluding a region of the edge termination region 51 on the edge side of the semiconductor substrate 1. The configuration is also such that the edge of the underside P layer 25 is located between the locations A3 and A4 shown in FIGS. 12 and 13. The collector electrode 26 is formed on the underside N layer 24 (directly short-circuited with the underside N layer 24) in a region other than the underside P layer forming region and is formed on the underside P layer 25 in the underside P layer forming region.

The semiconductor device according to the present variation can improve the interruption capability of the IGBT 14 at turn-off and suppress an increase in the ON-state voltage without having an adverse effect on the ON state of the IGBT 14, as in Variation 1 of Embodiment 1. Note that the predetermined region where the underside P layer 25 is formed (i.e., the underside P layer forming region) is not limited to the region shown in FIG. 36, and may be the regions shown in FIGS. 9 to 11. Even in this case, effects similar to those described above can be achieved.

Variation 2 of Embodiment 5

Figure 37:
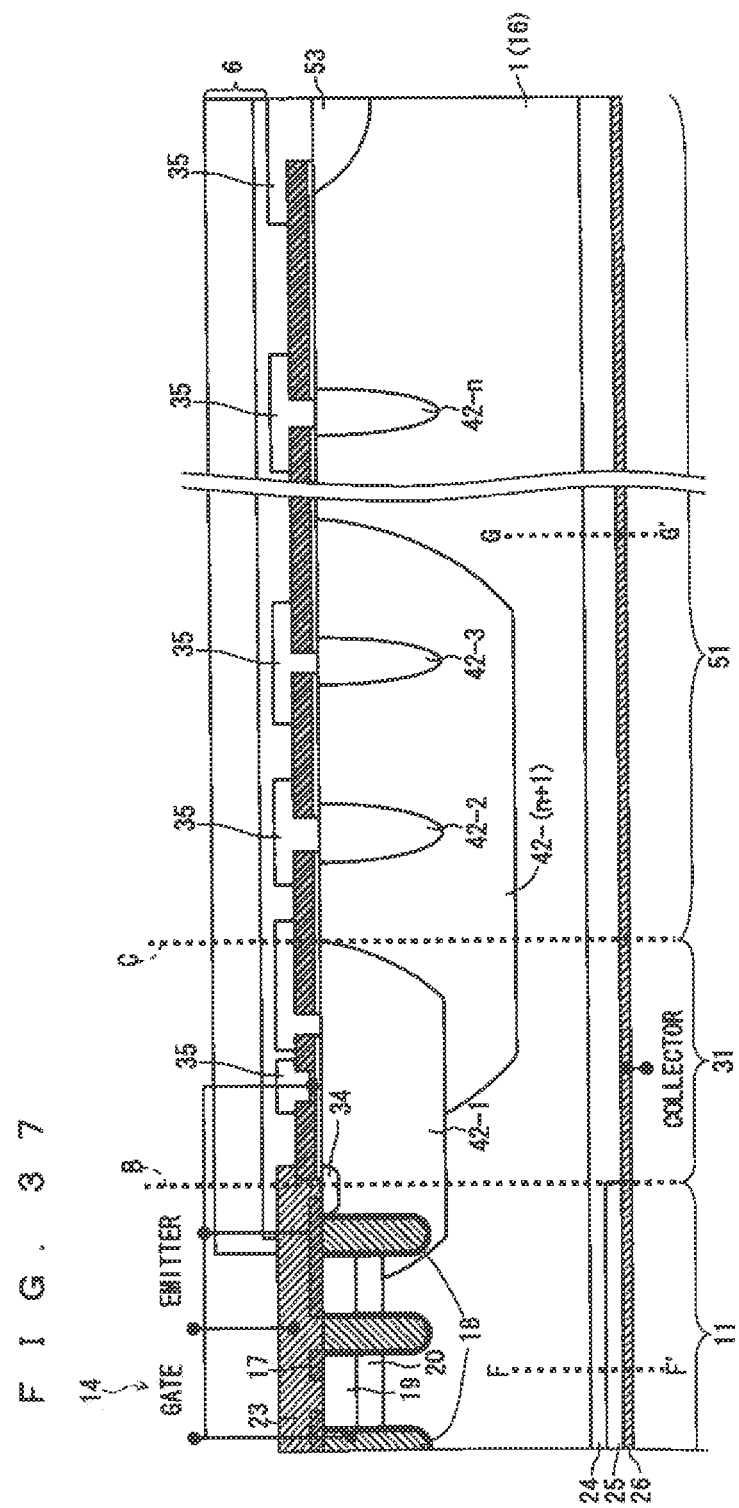
FIG. 37 is a cross-sectional view showing a configuration of a semiconductor device according to Variation 2 of Embodiment 5.

FIG. 37 is a cross-sectional view of a semiconductor device according to Variation 2 of Embodiment 5. Note that the present variation corresponds to Variation 2 of Embodiment 1.

Specifically, in the present variation, the configuration is such that the distance R from the underside of the semiconductor substrate 1 to the peak (first peak) of the impurity concentration of the underside N layer 24 satisfies the inequation described in Variation 2 of Embodiment 1, where $\Delta R$ is the distance between the peak and a position that corresponds to a standard deviation of the impurity concentration of the underside N layer 24 in the range from the underside of the semiconductor substrate 1 to the peak, $N_0$ is the impurity concentration of the underside N layer 24 at the underside of the semiconductor substrate 1, and $N_b$ is an impurity concentration at the peak in the underside N layer 24.

In the semiconductor device according to the present variation, since the position of the peak of the impurity concentration of the underside N layer 24 is deep from the underside of the semiconductor substrate 1, the impurity concentration of the underside N layer 24 on the collector electrode 26 side is reduced as in Variation 2 of Embodiment 1. This reduces the influence of the ohmic contact formed by the underside N layer 24 and the collector electrode 26 in the edge termination region 51. As a result, it is possible, as in Variation 2 of Embodiment 1, to improve the reverse voltage resistance of the IGBT 14 and to reduce leakage current in the reverse withstand voltage mode.

Variation 3 of Embodiment 5

Figure 38:
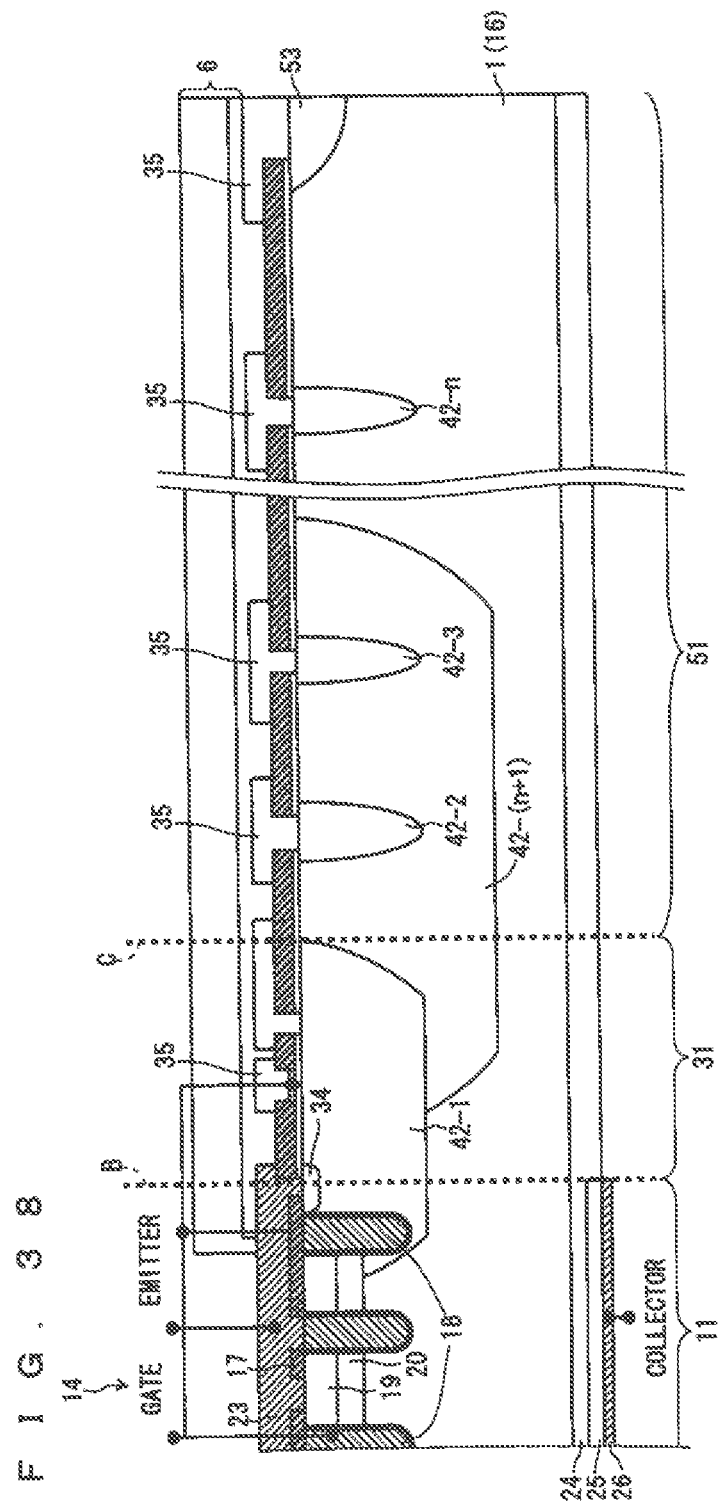
FIG. 38 is a cross-sectional view showing a configuration of a semiconductor device according to Variation 3 of Embodiment 5.

FIG. 38 is a cross-sectional view showing a configuration of a semiconductor device according to Variation 3 of Embodiment 5. Note that the present variation corresponds to Variation 3 of Embodiment 1.

Specifically, in the present variation, the collector electrode 26 is formed on the underside P layer 25 in the underside P layer forming region without being formed on the underside N layer 24. Accordingly, as in Variation 3 of Embodiment 1, no ohmic contact is formed by the underside N layer 24 and the collector electrode 26 in the edge termination region 51. It is thus possible to improve the reverse voltage resistance of the IGBT 14 and to reduce leakage current in the reverse withstand voltage mode.

Variation 4 of Embodiment 5

Figure 39:
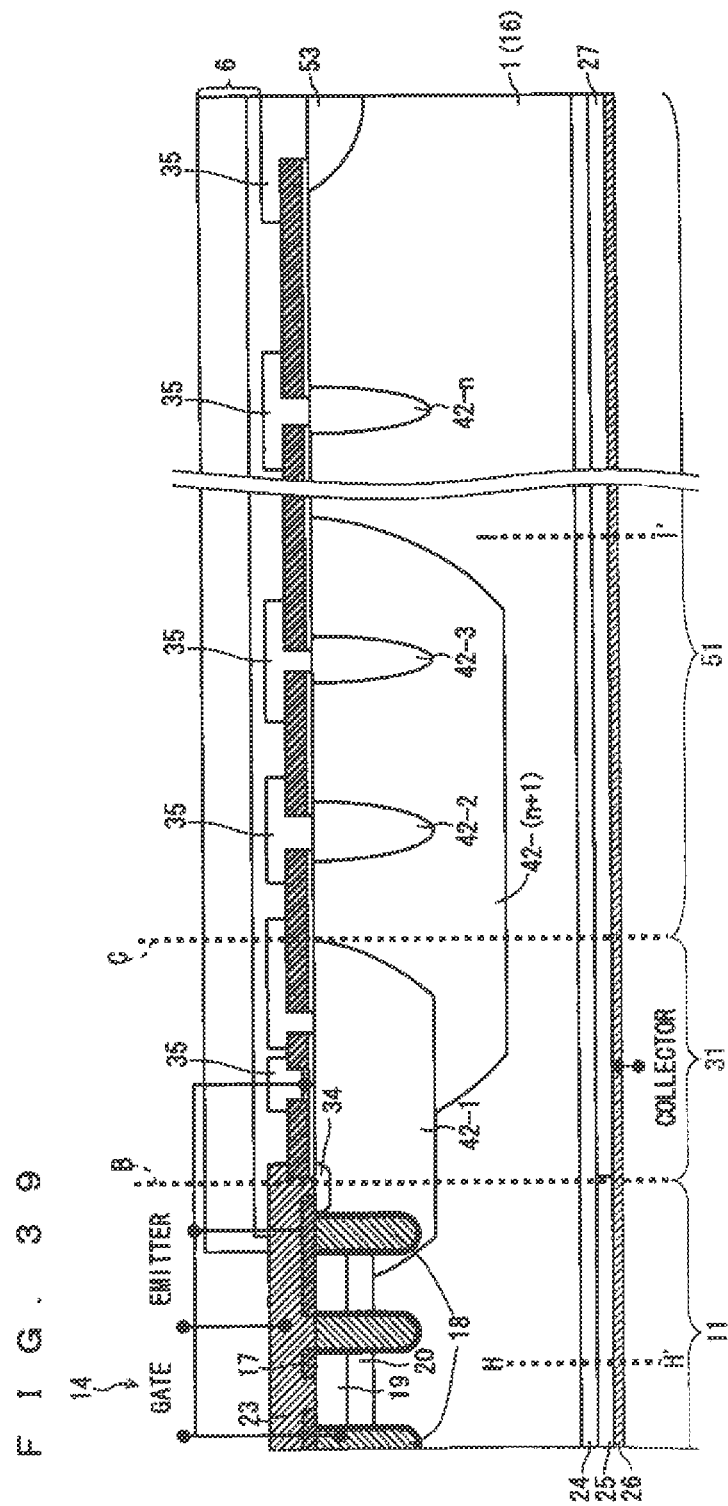
FIG. 39 is a cross-sectional view showing a configuration of a semiconductor device according to Variation 4 of Embodiment 5.

FIG. 39 is a cross-sectional view showing a configuration of a semiconductor device according to Variation 4 of Embodiment 5. Note that the present variation corresponds to Variation 4 of Embodiment 1.

Specifically, in the present variation, the low-concentration P layer 27 having a lower impurity concentration than the underside P layer 25 is formed on the underside N layer 24 in a region other than the underside P layer forming region. Note that a peak of the impurity concentration of the low-concentration P layer 27 is higher than the impurity concentration of the semiconductor substrate 1 and is lower than the peak of the impurity concentration of the underside N layer 25. The collector electrode 26 is formed on the low-concentration P layer 27 in the region other than the underside P layer forming region and is formed on the underside P layer 25 in the underside P layer forming region.

The semiconductor device according to the present variation can improve the reverse voltage resistance of the IGBT 14 and thereby suppress leakage current in the reverse withstand voltage mode as in Variation 4 of Embodiment 1. It can further suppress deterioration in the current interruption capability when the IGBT 14 performs a turn-off operation as in Variation 4 of Embodiment 1.

Evaluation of Semiconductor Apparatuses According to Embodiments 1 to 5

Figure 40:
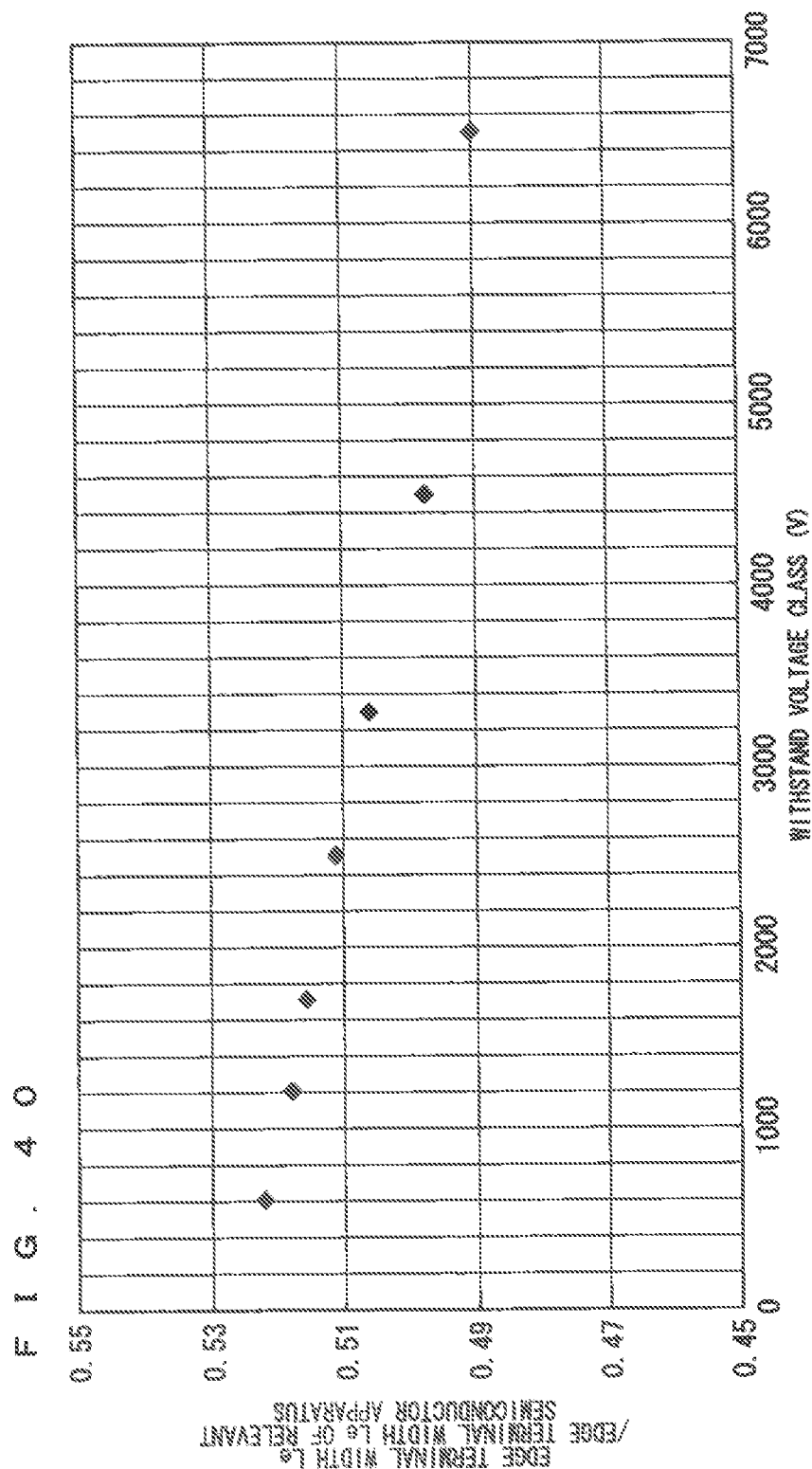
FIG. 40 is a diagram showing an effect of reducing the edge terminal width in the semiconductor device according to Embodiment 1.

Edge Terminal Width FIG. 40 is a diagram showing the effect of reducing the area of the edge termination region 51, i.e., the effect of reducing the edge terminal width Le, in the semiconductor device according to Embodiment 1 (FIG. 1). Here, for all withstand voltage classes (600, . . . , 6500V), the voltage resistance $BV_{CES}$ is assumed to be 1.3 times the withstand voltage class. A scale on the vertical axis in FIG. 40 indicates a normalized value for the edge terminal width Le of the semiconductor device according to Embodiment 1, using the edge terminal width Le of the relevant semiconductor device as a reference.

As can be seen from FIG. 40, for each withstand voltage class, the semiconductor device according to Embodiment 1 can reduce the edge terminal width Le to a value that is approximately 50% of that of the relevant semiconductor device. In other words, the semiconductor device according to Embodiment 1 can have the same voltage resistance with a smaller edge terminal width Le. A conceivable reason for this is that among the plurality of P layers 38 (PFS layers), outer P layers 38 have relatively low curvature in cross-section shape, and this suppresses intensive application of high electric fields to local portions. Note that, although there are slight differences in degree, the semiconductor devices according to Embodiments 2 to 5 in which the P layers are arranged in the longitudinal direction can also reduce the edge terminal widths Le to a value smaller than that of the relevant semiconductor device.

Leakage Current and Voltage Resistance in Withstand Voltage Mode

Figure 41:
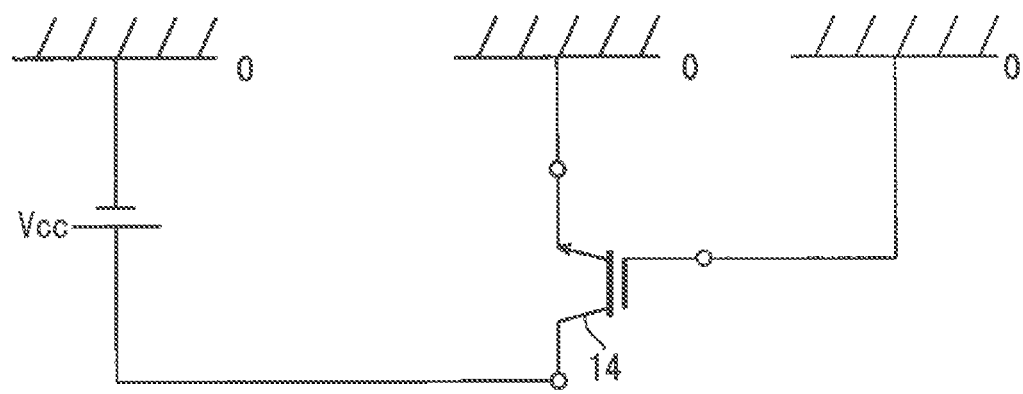
FIG. 41 is a diagram of an evaluation circuit used in experiments for evaluating withstand voltage characteristics.

FIG. 41 is a diagram of an evaluation circuit used in experiments for evaluating the withstand voltage characteristics of the relevant semiconductor device and the semiconductor device according to Embodiment 1 (FIG. 1). Here, an IGBT device having a withstand voltage of 4500V was used, and various evaluation conditions includes a gate-emitter voltage $V_{GE}$ of 0V, a junction temperature Tj of 398 K, a DC mode, and a variable voltage $V_{CC}$ (i.e., collector-emitter voltage $V_{CE}$). Also, as the semiconductor device according to Embodiment 1, a semiconductor device with an edge terminal width Le that is approximately 50% of that of the relevant semiconductor device was used.

Figure 42:
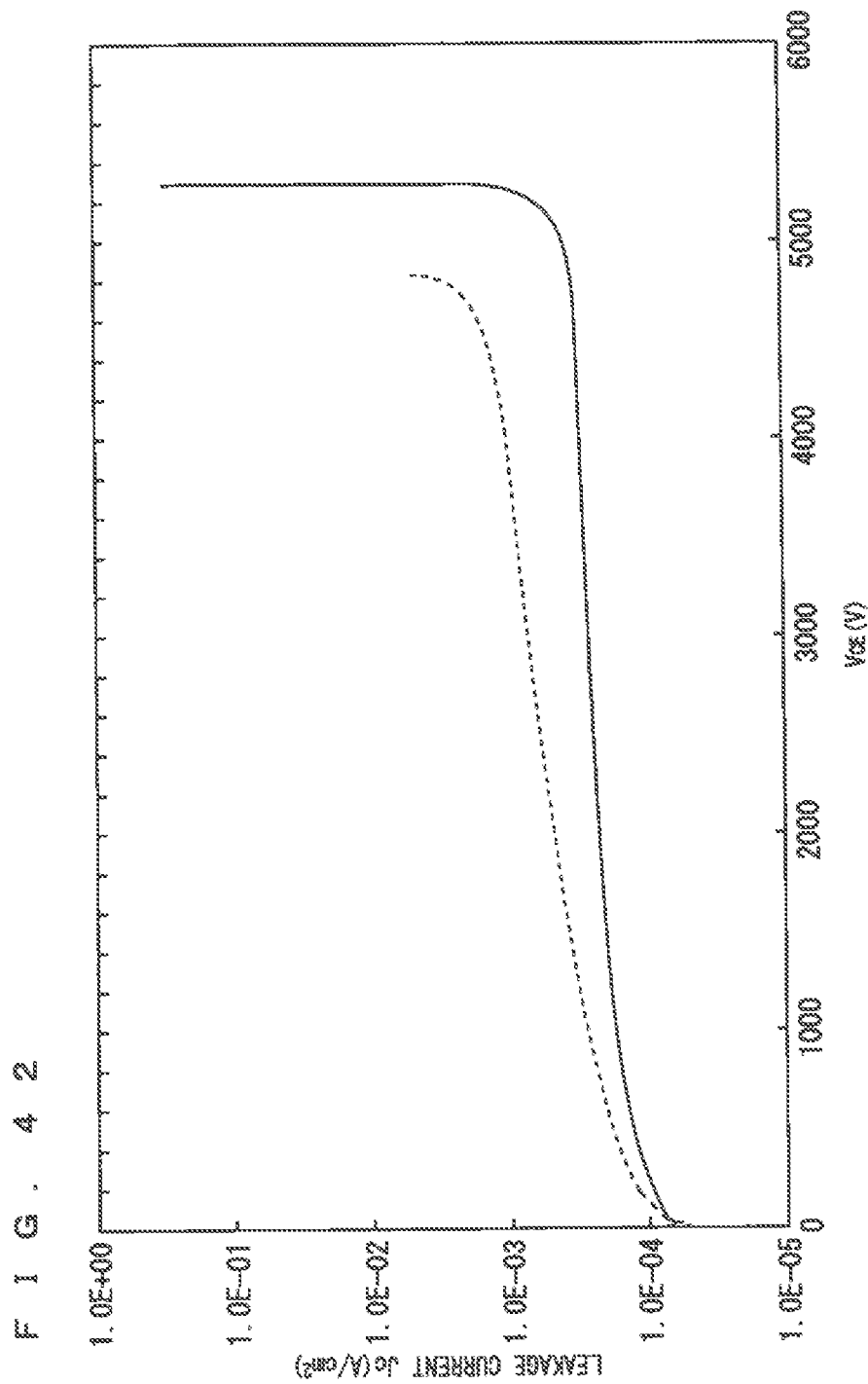
FIG. 42 is a diagram showing waveforms for evaluating the withstand voltage and leakage current characteristics of semiconductor devices.

FIG. 42 is a diagram showing waveforms for evaluating the withstand voltage and leakage current characteristics of the relevant semiconductor device and the semiconductor device according to Embodiment 1 under the above-described conditions. As shown in FIG. 42, the semiconductor device according to Embodiment 1 can reduce the leakage current $J_{CES}$ (indicated by the solid line in FIG. 42) for the voltage $V_{CC}$ of 4500V to a value that is approximately 90% of the leakage current $J_{CES}$ (indicated by the broken line in FIG. 42) of the relevant semiconductor device for the same voltage. In other words, a reduced surface electric field in the edge termination region 13 can reduce drift current that is caused by a high electric field. In addition, suppressed local impact ionization can reduce the possibility of device breakdown that is caused as a result of exceeding a critical electric field.

Figure 43:
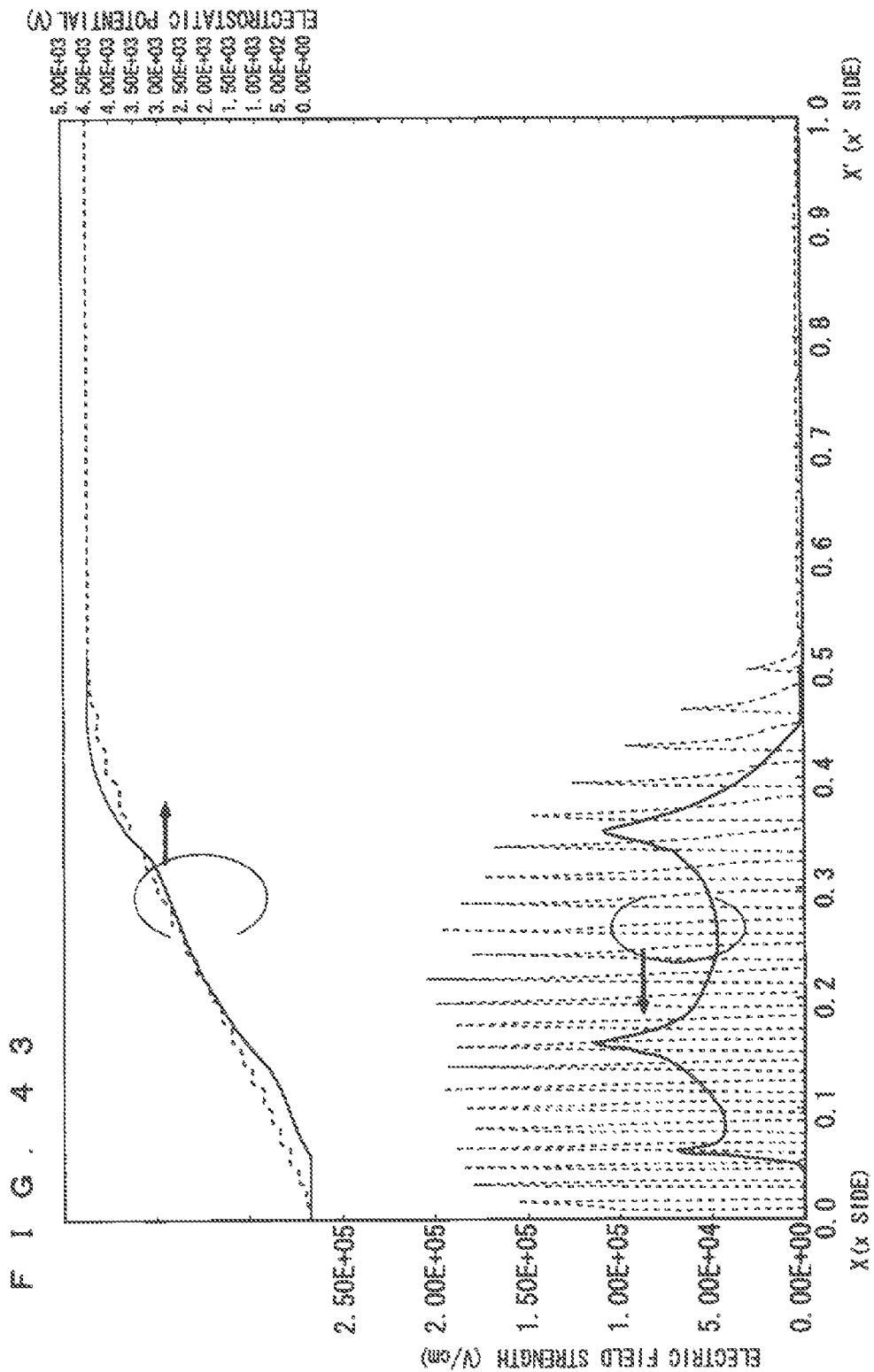
FIG. 43 is a diagram showing electric field strengths and electrostatic potentials at positions in the lateral direction of a semiconductor substrate.

FIG. 43 is a diagram showing electric field strengths (lower graphs) and electrostatic potentials (upper graphs) at a constant withstand voltage ($V_{CE}$=4500V) at horizontal positions along the surface of the semiconductor substrate 1 in the relevant semiconductor device and the semiconductor device according to Embodiment 1. Note that the graphs shown in FIG. 43 and FIGS. 44 to 46, which will be described later, are obtained through simulation.

A scale on the left vertical axis in FIG. 43 indicates the electric field strength at the surface of the semiconductor substrate 1, and a scale on the right vertical axis in FIG. 43 indicates the electrostatic potential at the surface of the semiconductor substrate 1. The horizontal axis in FIG. 43 corresponds to line x-x' in FIG. 57 and line X-X' in FIG. 1, 0 on the scale indicating the position of the edge of the gate electrode 18 on the edge side of the semiconductor substrate 1, and 1 on the scale indicating the position of the edge of the semiconductor substrate 1.

As shown in FIG. 43, the semiconductor device according to Embodiment 1 can have substantially the same electrostatic potential (indicated by the upper solid line in FIG. 43) as that of the relevant semiconductor device (indicated by the upper broken line in FIG. 43) and can also reduce its maximum electric field strength (a peak of the lower solid line in FIG. 43) to a value that is at least 40% lower than that of the relevant semiconductor device (a peak of the lower broken line in FIG. 43).

Figure 44:
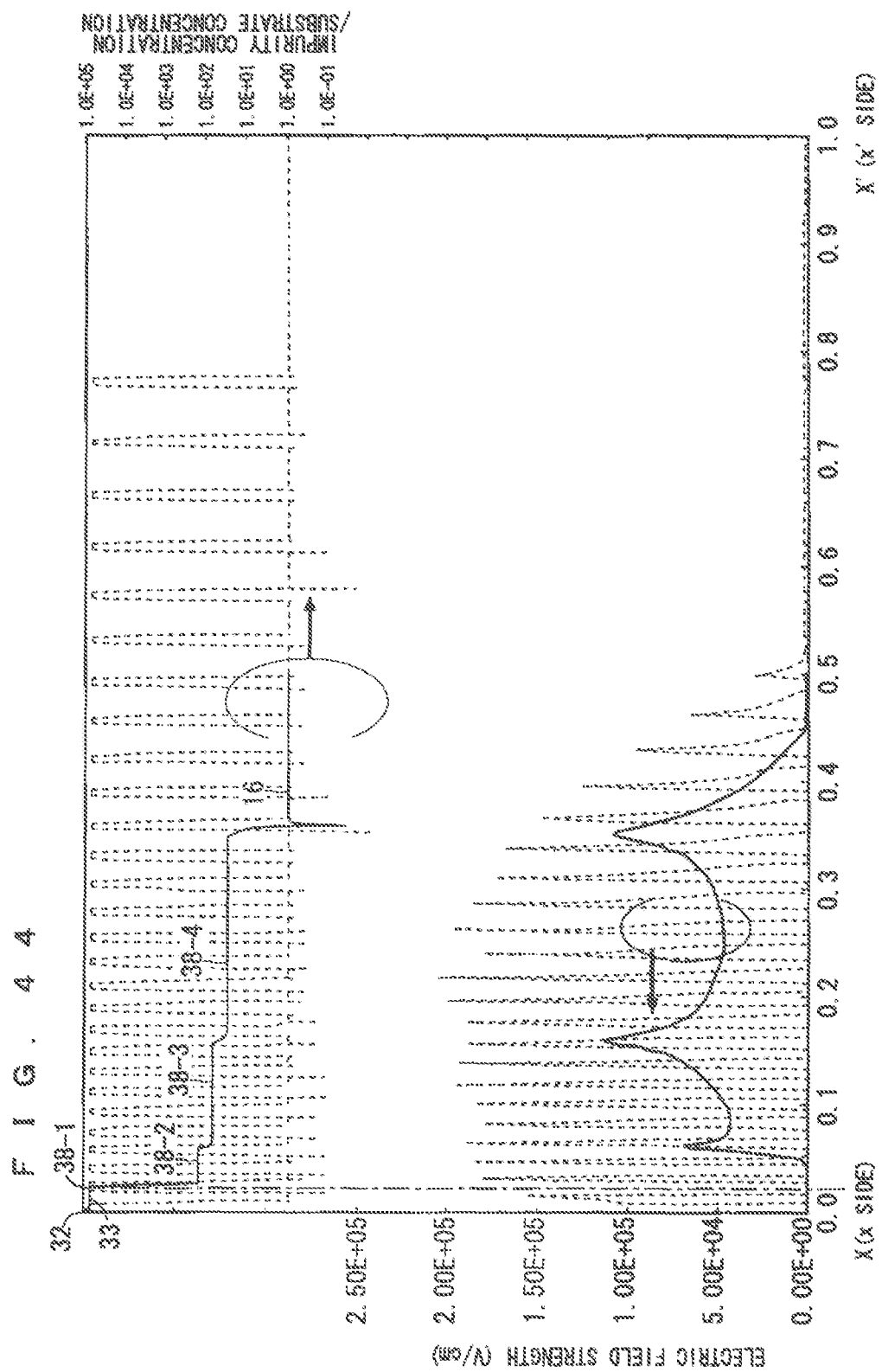
FIG. 44 is a diagram showing electric field strengths and impurity concentrations at positions in the lateral direction of the semiconductor substrate.

FIG. 44 is a diagram showing electric field strengths (lower graphs) and impurity concentrations (upper graphs) at a constant voltage ($V_{CE}$=4500V) at horizontal positions along the surface of the semiconductor substrate 1 in the relevant semiconductor device and the semiconductor device according to Embodiment 1. A scale on the left vertical axis in FIG. 44 indicates the electric field strength, and a scale on the right vertical axis in FIG. 44 indicates a normalized value for the impurity concentration, using the impurity concentration of the semiconductor substrate 1 as a reference. The horizontal axis in FIG. 44 is the same as that in FIG. 43.

As indicated by the broken line in FIG. 44, the relevant semiconductor device has a depletion layer that extends to the P layer 33 that is closest to the gate electrode 18. In contrast, as indicated by the solid line and the dashed dotted line in FIG. 44, the depletion layer of the semiconductor device according to Embodiment 1 does not extend to the first P layer 38-1. Accordingly, the semiconductor device according to Embodiment 1 can suppress intensive application of high electric fields to local portions.

Figure 45:
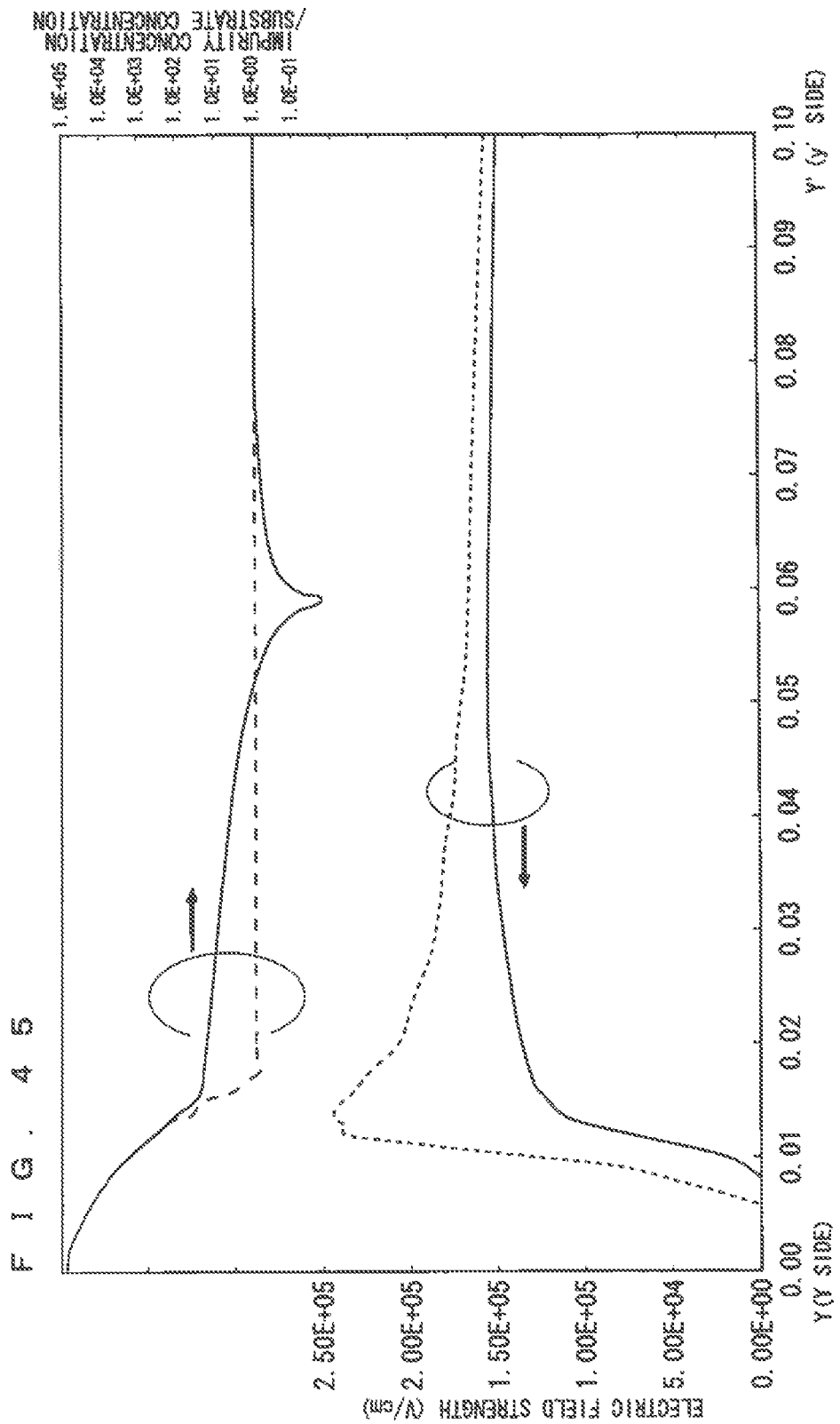
FIG. 45 is a diagram showing electric field strengths and impurity concentrations at positions in the longitudinal direction of the semiconductor substrate.

FIG. 45 is a diagram showing electric field strengths (lower graphs) and impurity concentrations (upper graphs) at a constant voltage ($V_{CE}$=4500V) at longitudinal positions in the semiconductor substrates 1 of the relevant semiconductor device and the semiconductor device according to Embodiment 1. A scale on the left vertical axis in FIG. 45 indicates the electric field strength, and a scale on the right vertical axis in FIG. 45 indicates a normalized value for the impurity concentration, using the impurity concentration of the semiconductor substrate 1 as a reference. The horizontal axis in FIG. 45 corresponds to line y-y' in FIG. 57 and line Y-Y' in FIG. 1, 0 on the scale indicating the position of the surface of the semiconductor substrate 1.

Figure 46:
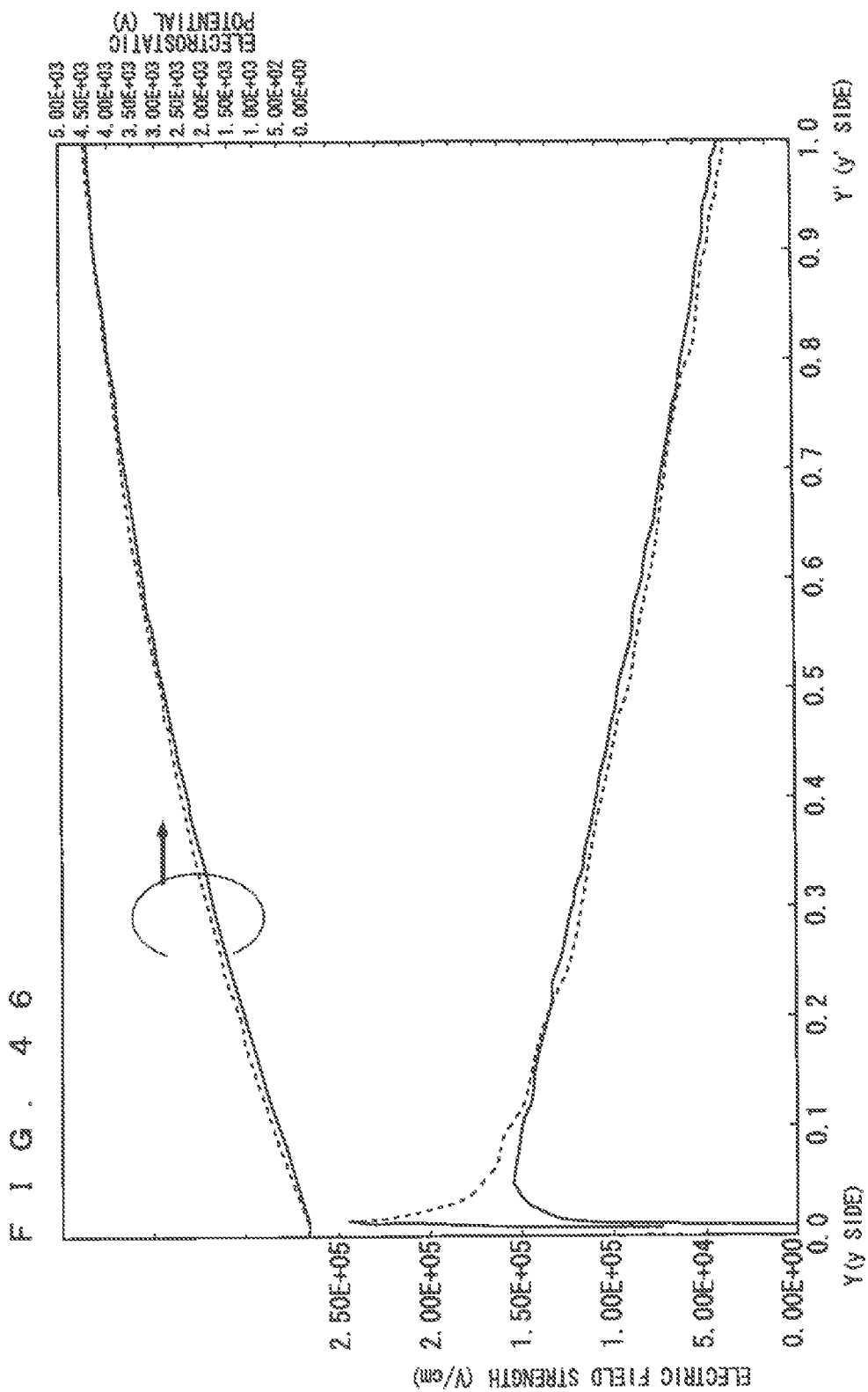
FIG. 46 is a diagram showing electric field strengths and electrostatic potentials at positions in the longitudinal direction of the semiconductor substrate.

FIG. 46 is a diagram showing electric field strengths (lower graphs) and electrostatic potentials (upper graphs) at a constant voltage ($V_{CE}$=4500V) at longitudinal positions of the semiconductor substrates 1 of the relevant semiconductor device and the semiconductor device according to Embodiment 1. A scale on the left vertical axis in FIG. 46 indicates the electric field strength, and a scale on the right vertical axis in FIG. 46 indicates the electrostatic potential. The horizontal axis in FIG. 46 is the same as that in FIG. 45. As shown in FIG. 46, the semiconductor device according to Embodiment 1 can have substantially the same electrostatic potential (indicated by the upper solid line in FIG. 46) as that of the relevant semiconductor device (indicated by the upper broken line in FIG. 46) and can also reduce its maximum electric field strength (a peak of the lower solid line in FIG. 46) to a value that is at least 40% lower than that of the relevant semiconductor device (a peak of the lower broken line in FIG. 46).

Turn-Off Behavior

FIG. 47 is a diagram of an evaluation circuit used in experiments for evaluating the turn-off characteristics of the relevant semiconductor device and the semiconductor device according to Embodiment 1 (FIG. 1). Here, an IGBT having a withstand voltage of 4500V was used, and various evaluation conditions were as follows: $V_{CC}$=2800V, leakage inductance Ls=2.47 µH, Tj=398 K, and $J_C$=56 A/cm². Also, a semiconductor device having an edge terminal width Le that is approximately 50% of that of the relevant semiconductor device was used as the semiconductor device according to Embodiment 1.

FIG. 48 is a diagram showing results of the evaluation of the turn-off characteristic of the relevant semiconductor device (indicated by the broken line in FIG. 48) and the turn-off characteristic of the semiconductor device according to Embodiment 1 (indicated by the solid line in FIG. 48) under the above-described conditions. As shown in FIG. 48, the turn-off loss of the semiconductor device according to Embodiment 1 and that of the relevant semiconductor device are substantially constant.

Also, as indicated by a portion enclosed by the dashed dotted line in FIG. 48, the semiconductor device according to Embodiment 1 can suppress the peak voltage at the time of a decrease in current to a greater extent than the relevant semiconductor device, and as indicated by a portion enclosed by the dashed double-dotted line in FIG. 48, can suppress oscillations in voltage and current after switch-off more than the relevant semiconductor device can. The reason for this is considered to be that, as a result of holes accumulating in the P layer 38 having a large bottom-end distance D in the edge termination region 51 and hole current being supplied at the time of a decrease in current so that the rate of change in current is reduced, it becomes possible to suppress the peak voltage and oscillations that are caused by the leakage inductance Ls.

Turn-Off Capability

The turn-off characteristics of the relevant semiconductor device (FIG. 57), the semiconductor device according to Embodiment 1 (FIG. 1), the semiconductor device according to Variation 1 of Embodiment 1 (FIG. 9), the semiconductor device according to Embodiment 5 (FIG. 35), and the semiconductor device according to Variation 1 of Embodiment 5 (FIG. 36) were evaluated using the above-described evaluation circuit diagram shown in FIG. 47. Here, an IGBT device having a withstand voltage of 4500V was used, and various evaluation conditions were as follows: $V_{CC}$=3400V, Ls=2.47 µH, and Tj=423 K. The current density $J_C$ was incremented by 0.5 A/cm², starting from 56 A/cm², and evaluation was conducted until breakdown of the semiconductor devices. Note that a maximum current density $J_C$ (break) at which each semiconductor device can be turned off without breakdown was used as an index indicating the interruption capability at turn-off.

FIG. 49 is a diagram showing the interruption capability $J_C$(break) of the relevant semiconductor device and the semiconductor devices according to Embodiment 1 and so on at turn-off under the above-described conditions. Here, the interruption capabilities of the semiconductor devices according to Embodiment 1, Variation 1 of Embodiment 1, Embodiment 5, and Variation 1 of Embodiment 5 at turn-off are normalized, using the interruption capability of the relevant semiconductor device at turn-off as a reference.

The structure of the semiconductor device according to Embodiment 1 (FIG. 1) can have an improved interruption capability at turn-off compared with the relevant semiconductor device because impact ionization is suppressed by the effect of moderating the surface electric field. The structure of the semiconductor device according to Variation 1 of Embodiment 1 (FIG. 9) can have an even more improved interruption capability at turn-off because impact ionization is suppressed by not only the effect of moderating the surface electric field but also the effect of suppressing carrier accumulation in the edge termination region 51 at turn-off and suppressing the application of a high electric field that is caused by high-concentration carriers in the primary PN junction region 31.

FIG. 50 is a diagram showing the dependence of the interruption capabilities of the relevant semiconductor device (FIG. 57) and the semiconductor device according to Embodiment 1 (FIG. 1) at turn-off on the concentration of impurities in the underside P layer 25. A scale on the horizontal axis in FIG. 50 indicates a normalized impurity concentration of the underside P layer 25, the broken line indicates a graph for the relevant semiconductor device, and the solid line indicates a graph for the semiconductor device according to Embodiment 1.

As shown in FIG. 50, the concentration of impurities in the underside P layer 25 is one of device parameters used to control the ON-state voltage of the IGBT 14, and the interruption capability of the IGBT 14 at turn-off also depends on the concentration of impurities in the underside P layer 25. The semiconductor device according to Embodiment 1 can maintain a higher interruption capability at turn-off than the relevant semiconductor device even if there are some changes in the concentration of impurities in the underside P layer 25. Note that, although not shown in FIG. 50, the semiconductor devices according to Embodiments 2 to 5 can also similarly maintain a higher interruption capability at turn-off than the relevant semiconductor device.

Figure 51:
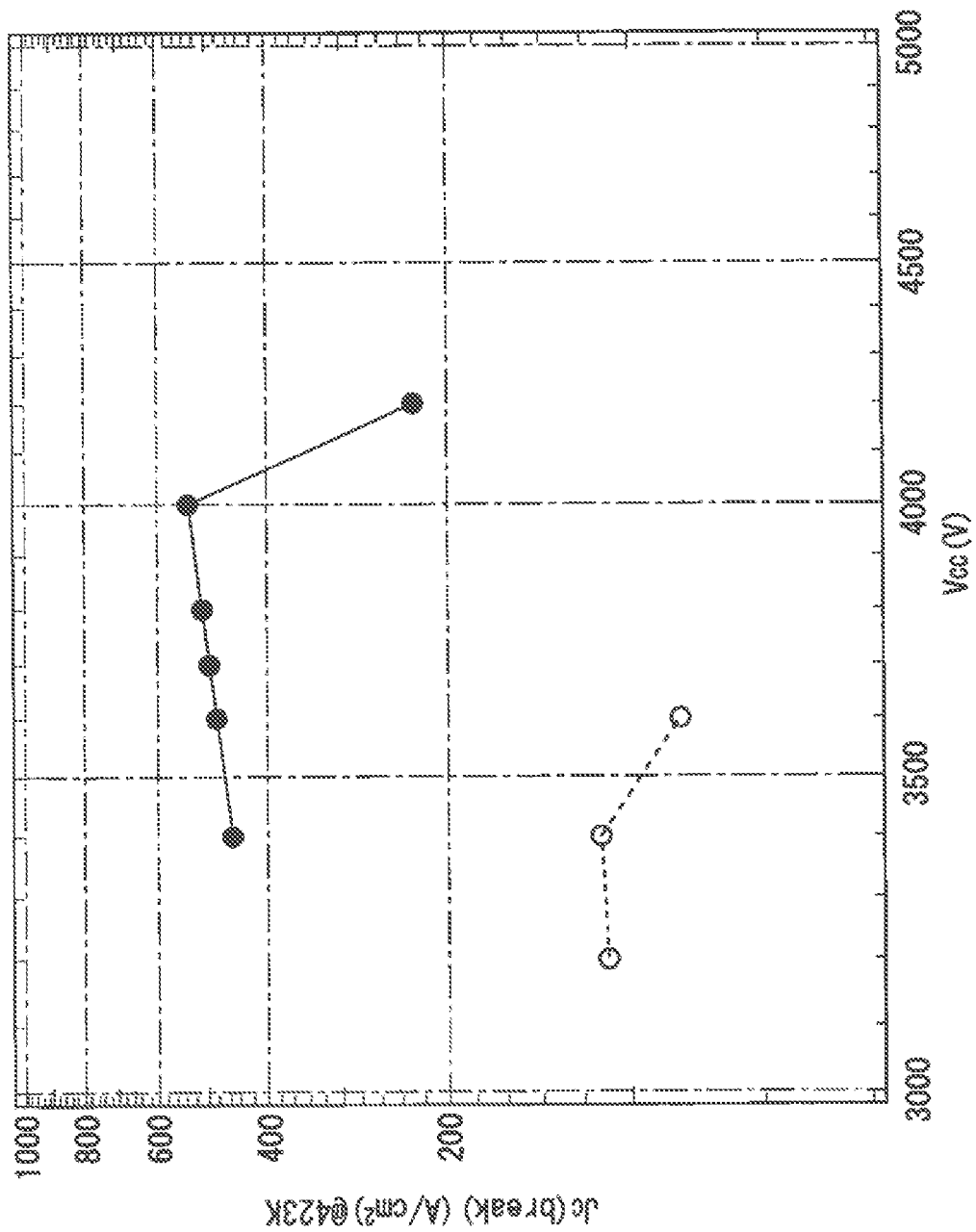
FIG. 51 is a diagram showing safe operating areas at turn-off.

FIG. 51 is a diagram showing safe operating areas of the relevant semiconductor device and the semiconductor device according to Embodiment 1 (FIG. 1) at turn-off. The broken line indicates a graph for the relevant semiconductor device, and the solid line indicates a graph for the semiconductor device according to Embodiment 1.

As shown in FIG. 51, the semiconductor device according to Embodiment 1 can have a larger safe operating area at turn-off of the IGBT 14 than the relevant semiconductor device. Note that, although not shown in FIG. 51, the semiconductor devices according to Embodiments 2 to 5 can also similarly have a larger safe operating area at turn-off of the IGBT 14 than the relevant semiconductor device.

Accordingly, the semiconductor devices according to Embodiments 1 to 5 can improve the interruption capability of the IGBT 14 at turn-off and increase the safe operating area, thus increasing the voltage resistance of the IGBT 14.

Leakage Current in Reverse Withstand Voltage Mode

Figure 52:
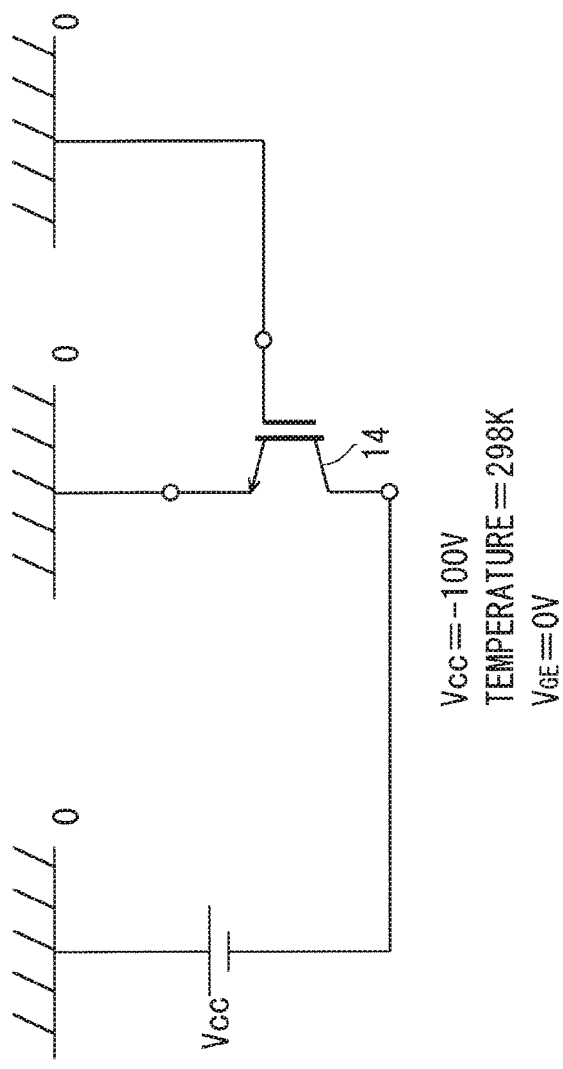
FIG. 52 is a diagram of an evaluation circuit used in experiments for evaluating reverse withstand voltage characteristics.

FIG. 52 is a diagram of an evaluation circuit used in experiments for evaluating the reverse withstand voltage characteristics of Variations 1 to 4 of Embodiment 1 (FIGS. 9, 10, 11, and 15). Here, an IGBT device having a withstand voltage of 4500V was used, and various evaluation conditions were as follows: $V_{CC}$=−100V, $V_{GE}$=0V, Tj=298 K, and mode=AC mode.

Figure 53:
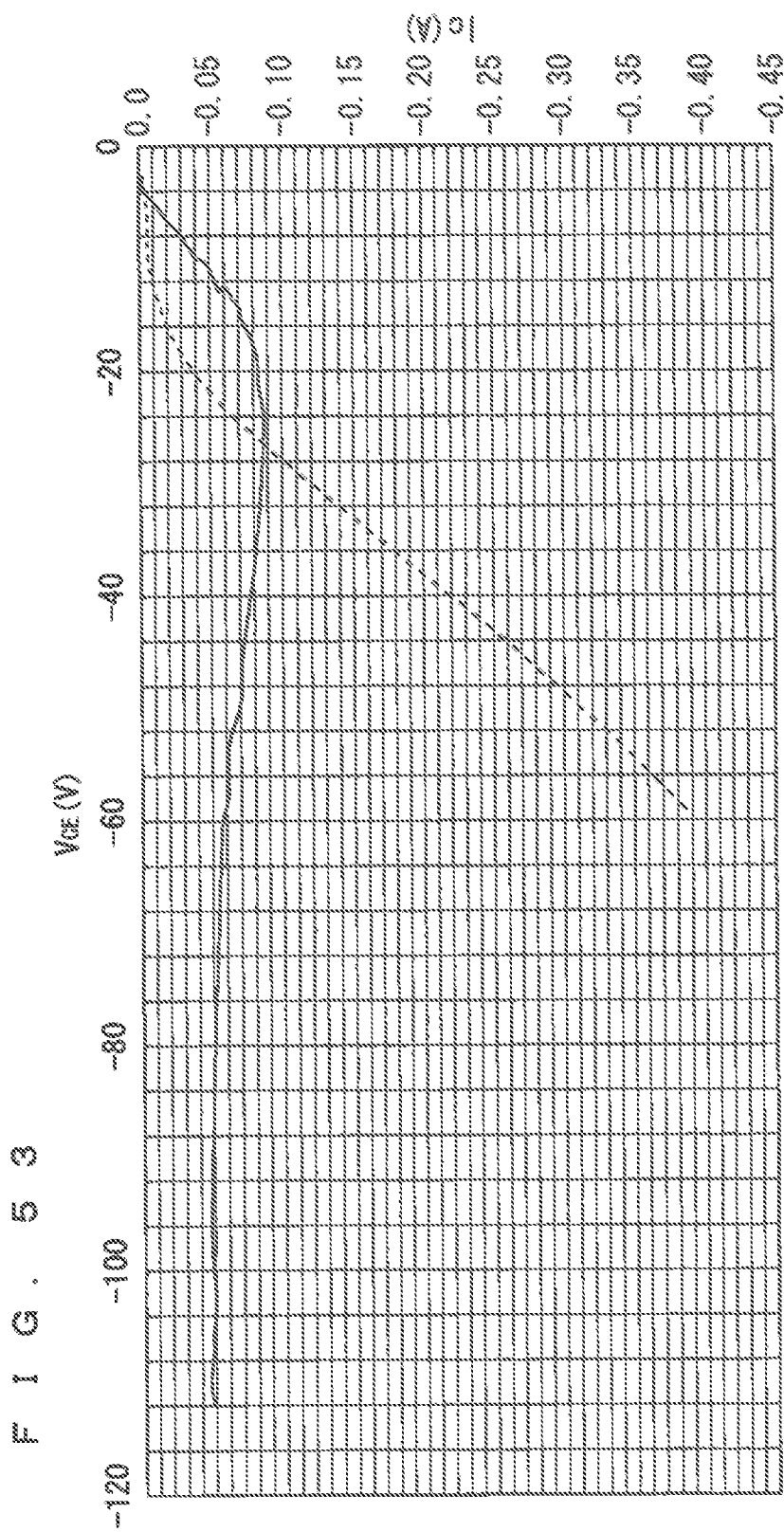
FIG. 53 is a diagram showing waveforms for evaluating reverse withstand voltage and leakage current characteristics.

FIG. 53 is a diagram showing waveforms for evaluating the reverse withstand voltage and leakage current characteristics of the semiconductor devices according to Variations 1 to 4 of Embodiment 1 under the above-described conditions. As shown in FIG. 53, when the voltage $V_{CE}$ is −60V, the reverse withstand voltage and leakage current of the semiconductor devices according to Variations 2 to 4 (indicated by the solid line) can be reduced to a value that is 10% or less of the reverse withstand leakage of the semiconductor device according to Variation 1 (indicated by the broken line). A conceivable reason for this is that, in the semiconductor device according to Variation 4 (FIG. 15), no ohmic contact is formed by the underside N layer 24 and the collector electrode 26, and a withstand voltage (reverse withstand voltage) will be held at the junction between the underside N layer 24 and the low-concentration P layer 27 when the IGBT 14 is in the reverse withstand voltage mode. Another conceivable reason is that since the effect of a forward bias diode formed between the P+ layer 21 on the surface side of the semiconductor substrate 1 and the underside N layer 24 is suppressed when the IGBT 14 is in the reverse withstand voltage mode, it is possible to increase the reverse voltage resistance of the IGBT 14 and suppress leakage current in the reverse withstand voltage mode.

OTHER VARIATIONS

Figures 54A, 54B:
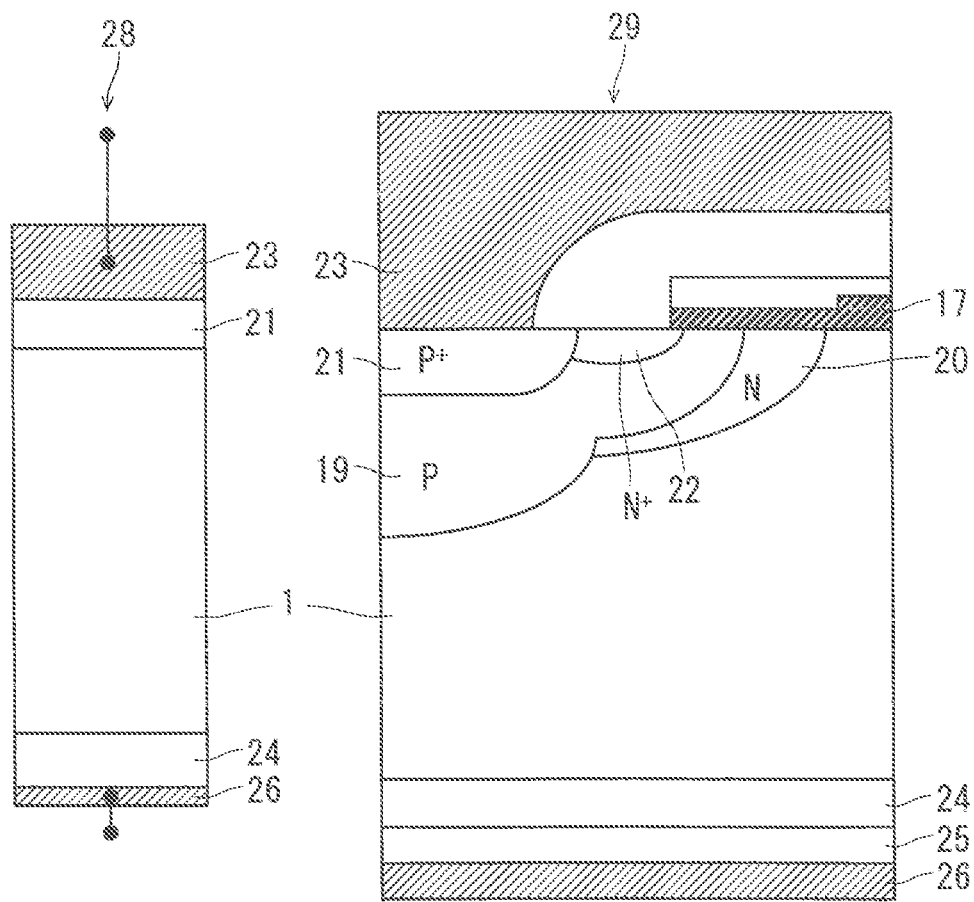
FIG. 54A and FIG. 54B are cross-sectional views showing a configuration of a semiconductor device including a diode or an IGBT.

The above describes a case in which the semiconductor element formed in the active region 11 includes the IGBT 14. It is, however, noted that the semiconductor element is not limited to including the IGBT 14, and the semiconductor element may include a diode 28 as shown in FIG. 54A or an IGBT 29 having a flat gate structure as an emitter structure of the active region 11 as shown in FIG. 54B. These configurations are also expected to achieve effects similar to those described above.

Note that embodiments of the invention may be freely combined and appropriate corrections, modifications, or deletion may be made to the embodiments without departing from the scope of the invention.

DESCRIPTION OF REFERENCE NUMERALS

1 Semiconductor substrate
11 Active region
14, 29 IGBT
18 Gate electrode
24 Underside N layer
25 Underside P layer
26 Collector electrode
27 Low-concentration P layer
28 Diode
38, 39, 40, 41, 42 P layer
51 Edge termination region

The invention claimed is:

1. A semiconductor device comprising:
a semiconductor substrate of a first conductivity type in which an active region and an edge termination region that is spaced from and encloses said active region are defined;
a semiconductor element formed in said active region;
first and second impurity layers of a second conductivity type that are positioned to partly overlap one another in a region spanning from an edge portion of said active region to said edge termination region in said semiconductor substrate; and
a third impurity layer of said second conductivity type that is adjacent to a lower portion of said second impurity layer on said edge termination region side of said third impurity layer and a lower portion of said first impurity layer on said active region side of said third impurity layer,
wherein $P(1)>P(2)>P(3)$, $D(1)<D(2)<D(3)$, and $B(1)<B(3)<B(2)$ are satisfied, where $P(1)$ and $P(2)$ are respectively surface concentrations that are concentrations of impurities of said second conductive type in said first and second impurity layers at a surface of said semiconductor substrate, $P(3)$ is an impurity concentration of said third impurity layer, $D(1)$, $D(2)$, and $D(3)$ are respectively bottom-end distances that are distances from the surface of said semiconductor substrate to bottom ends of said first to third impurity layers, and $B(1)$, $B(2)$, and $B(3)$ are respectively distances from an edge of said edge termination region on said active region side, to edges of said first to third impurity layers on an edge side of said semiconductor substrate, and
said surface concentration $P(2)$ of said second impurity layer is 10 to 1000 times a concentration of impurities of said first conductivity type in said semiconductor substrate, and said bottom-end distance $D(3)$ of said third impurity layer is in a range of 15 to 30 µm.

2. The semiconductor device according to claim 1, further comprising:
a first underside impurity layer of said first conductivity type formed on an underside of said semiconductor substrate;
a second underside impurity layer of said second conductivity type formed on said first underside impurity layer in a predetermined region that includes a region of said active region, excluding a region of said edge termination region on the edge side of said semiconductor substrate; and
an electrode formed on said first underside impurity layer in a region other than said predetermined region and formed on said second underside impurity layer in said predetermined region.

3. The semiconductor device according to claim 1, further comprising:
a first underside impurity layer of said first conductivity type formed on an underside of said semiconductor substrate;
a second underside impurity layer of said second conductivity type formed on said first underside impurity layer in a predetermined region that includes a region of said active region, excluding a region of said edge termination region on the edge side of said semiconductor substrate; and
an electrode formed on said second underside impurity layer in said predetermined region without being formed on said first underside impurity layer.

4. The semiconductor device according to claim 1, further comprising:
a first underside impurity layer of said first conductivity type formed on an underside of said semiconductor substrate;
a second underside impurity layer of said second conductivity type formed on said first underside impurity layer in a predetermined region that includes a region of said active region, excluding a region of said edge termination region on the edge side of said semiconductor substrate;
a third underside impurity layer of said second conductivity type formed on said first underside impurity layer in a region other than said predetermined region and having a lower impurity concentration than said second underside impurity layer; and
an electrode formed on said third underside impurity layer in a region other than said predetermined region and formed on said second underside impurity layer in said predetermined region.

5. The semiconductor device according to claim 2, wherein
said semiconductor element includes a gate electrode formed in a trench of said semiconductor substrate, and
an edge of said second underside impurity layer is positioned between a location of an edge of said gate electrode on said edge termination region side and a location that is away from an edge of said edge termination region on said active region side to be closer to the edge of said semiconductor substrate by one fourth of a distance across said edge termination region.

6. The semiconductor device according to claim 4, wherein
a second peak of an impurity concentration of said third underside impurity layer is higher than the impurity concentration of said semiconductor substrate and is lower than a third peak of an impurity concentration of said first underside impurity layer.

7. The semiconductor device according to claim 2, wherein
a distance R from the underside of said semiconductor substrate to a first peak of an impurity concentration of said first underside impurity layer satisfies:

$$R > \sqrt{2} \cdot \Delta R \cdot \sqrt{\ln \frac{N_b}{N_0}}$$

where $\Delta R$ is a distance between said first peak and a position that corresponds to a standard deviation of the impurity concentration of said first underside impurity layer in a region from the rear surface of said semiconductor substrate to said first peak, $N_0$ is an impurity concentration of said first underside impurity layer at the underside of said semiconductor substrate, and $N_b$ is an impurity concentration at said first peak in said first underside impurity layer.

* * * * *